(12) United States Patent
Huang et al.

(10) Patent No.: US 12,507,439 B2
(45) Date of Patent: Dec. 23, 2025

(54) METHOD FOR FORMING SEMICONDUCTOR STRUCTURE

(71) Applicant: Taiwan Semiconductor Manufacturing Company, Ltd., Hsinchu (TW)

(72) Inventors: Jyun-Hong Huang, Hsinchu (TW); Hsin-Che Chiang, Taipei (TW); Wei-Chih Kao, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 430 days.

(21) Appl. No.: 18/162,350

(22) Filed: Jan. 31, 2023

(65) Prior Publication Data

US 2024/0258394 A1 Aug. 1, 2024

(51) Int. Cl.
| | |
|---|---|
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 30/6735* (2025.01); *H10D 62/121* (2025.01); *H10D 64/017* (2025.01); *H10D 64/021* (2025.01); *H10D 84/0128* (2025.01); *H10D 84/0147* (2025.01); *H10D 84/0151* (2025.01); *H10D 84/038* (2025.01)

(58) Field of Classification Search
CPC .. H10D 30/024; H10D 30/62; H10D 84/0158; H10D 84/83; H10D 84/834; H10D 84/0151; H10D 84/0188; H10D 64/017
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2019/0131298 A1* | 5/2019 | Chen | H10D 30/791 |
| 2022/0310594 A1* | 9/2022 | Jeong | H10D 84/038 |

* cited by examiner

*Primary Examiner* — Tuan A Hoang
(74) *Attorney, Agent, or Firm* — Birch, Stewart, Kolasch & Birch, LLP

(57) ABSTRACT

A method for forming a semiconductor structure is provided. The method for forming the semiconductor structure includes forming an active region extending in a first horizontal direction, forming an isolation structure surrounding the active region, forming a gate dielectric layer over the active region and the isolation structure, forming a gate electrode layer nested within the gate dielectric layer, and removing the gate electrode layer and a first portion of the gate dielectric layer over the isolation structure to form a trench. A second portion of the gate dielectric layer over the active region is left to form first protection features. The method further includes depositing a dielectric layer in the trench.

20 Claims, 45 Drawing Sheets

METHOD FOR FORMING SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1 and 2F-1 are cross-sectional views of the semiconductor structure taken along line X1-X1 of FIGS. 2A, 2B, 2C, 2D, 2E and 2F, respectively, in accordance with some embodiments of the disclosure.

FIGS. 2A-2, 2B-2, 2C-2, 2D-2, 2E-2 and 2F-2 are cross-sectional views of the semiconductor structure taken along line X2-X2 of FIGS. 2A, 2B, 2C, 2D, 2E and 2F, respectively, in accordance with some embodiments of the disclosure.

FIGS. 2A-3, 2B-3 and 2F-3 are cross-sectional views of the semiconductor structure taken along line Y1-Y1 of FIGS. 2A, 2B and 2F, respectively, in accordance with some embodiments of the disclosure.

FIGS. 2C-3, 2D-3, 2E-3 and 2F-4 are cross-sectional views of the semiconductor structure taken along line Y2-Y2 of FIGS. 2C, 2D, 2E and 2F, respectively, in accordance with some embodiments of the disclosure.

FIG. 2F-5 is an enlarged view of FIG. 2F-1 to illustrate more detail of a fin cutting structure and neighboring components, in accordance with some embodiments of the disclosure.

FIG. 3 is a perspective view of a semiconductor structure, in accordance with some embodiments of the disclosure.

FIGS. 4A-1, 4B-1, 4C-1 and 4D-1 are cross-sectional views of the semiconductor structure taken along line X1-X1 of FIGS. 4A, 4B, 4C and 4D, respectively, in accordance with some embodiments of the disclosure.

FIGS. 4A-2, 4B-2, 4C-2 and 4D-2 are cross-sectional views of the semiconductor structure taken along line X2-X2 of FIGS. 4A, 4B, 4C and 4D, respectively, in accordance with some embodiments of the disclosure.

FIGS. 4A-3, 4B-3 and 4D-3 are cross-sectional views of the semiconductor structure taken along line Y1-Y1 of FIGS. 4A, 4B and 4D, respectively, in accordance with some embodiments of the disclosure.

FIG. 5 is a modification of the semiconductor structure of FIG. 2F-1, in accordance with some embodiments of the disclosure.

DETAILED DESCRIPTION

Figure 1:
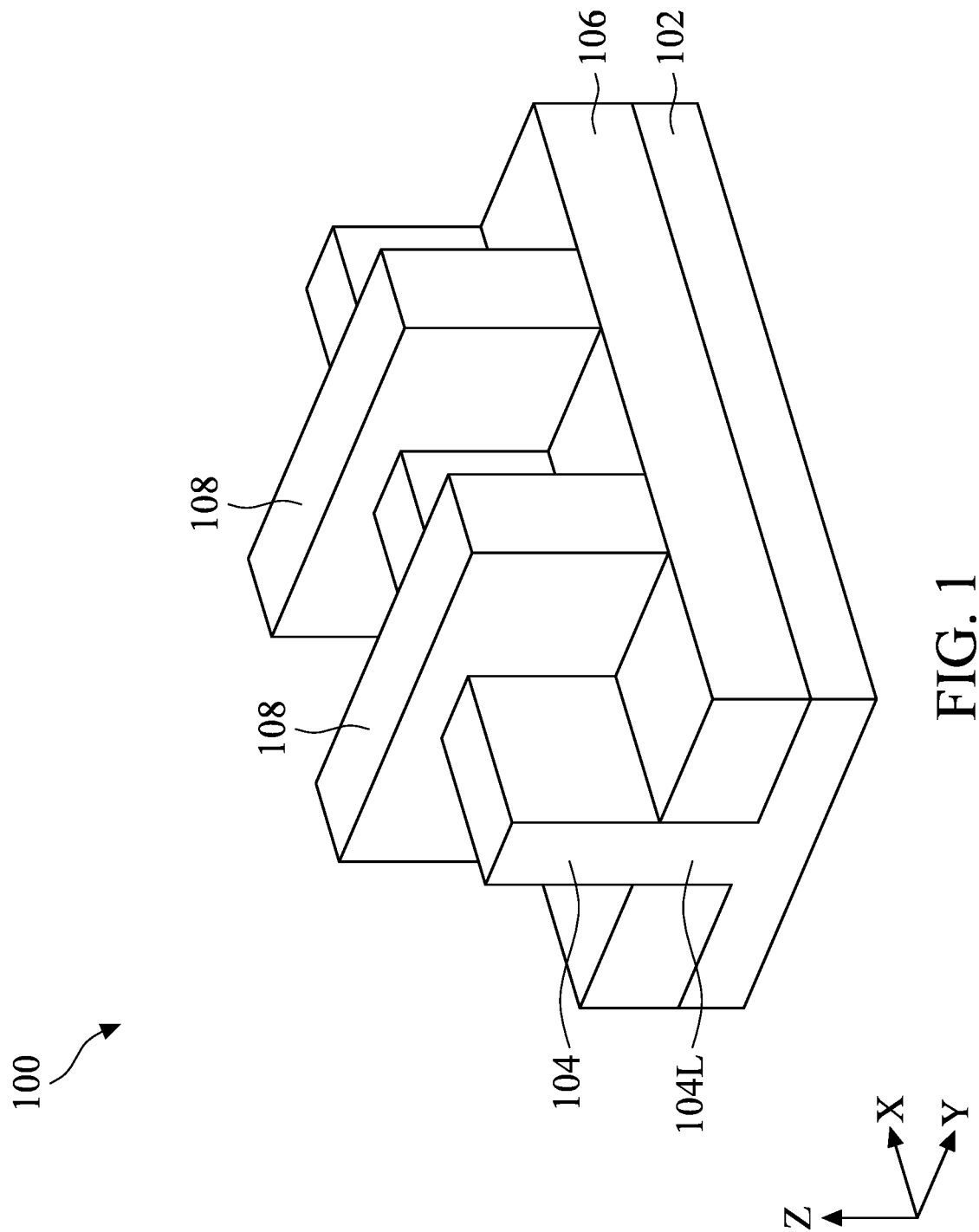
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Embodiments of a semiconductor structure and a method for forming the same are provided. The aspect of the present disclosure is directed to a semiconductor structure including fin cutting structures. The semiconductor structure includes an active region surrounded by an isolation structure, and a gate stack across the active region and the isolation structure. The gate stack is replaced with a fin cutting structure. A portion of the fin cutting structure extending into the active region is narrower than a portion of the fin cutting structure extending into the isolation structure. As a result, the risk of the damaging the source/drain features in the etching process for forming the fin cutting structure may reduce. Therefore, the performance of the resulting semiconductor devices may be improved, e.g., lower sheet resistance (Rs). In addition, the critical dimension (CD) and/or overlay window of the photolithography process for forming the fin cutting structure may be relaxed, thereby reducing the difficulty of manufacturing the semiconductor devices.

FIG. 1 is a perspective view of a semiconductor structure 100, in accordance with some embodiments of the disclosure. The semiconductor structure 100 includes a substrate 102 and fin structure 104 over the substrate 102, as shown in FIG. 1, in accordance with some embodiments. The fin structure 104 is the active region of the semiconductor structure 100, in accordance with some embodiments. For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

The fin structure 104 extends in the X direction, in accordance with some embodiments. That is, the fin structure 104 has a longitudinal axis parallel to the X direction, in accordance with some embodiments. The X direction may also be referred to as the channel-extending direction. The current of the resulting semiconductor devices (i.e., FinFETs) flows in the X direction through the channel. The fin structure 104 is defined as several channel regions and source/drain regions, where the channel regions and the source/drain regions are alternately arranged, in accordance with some embodiments. In this disclosure, a source/drain refers to a source and/or a drain. The number of channel regions and source/drain regions may be dependent on the demands on the design of the circuit and/or performance considerations of the semiconductor device.

An isolation structure 106 is formed over the substrate 102 and surrounds the lower portion 104L of the fin structure 104, in accordance with some embodiments. Gate structures 112 are formed with longitudinal axes parallel to the Y direction and extending across and/or surrounding the channel regions of the fin structure 104 and the isolation structure 106, in accordance with some embodiments. The source/drain regions of the fin structure 104 are exposed from the gate structures 112, in accordance with some embodiments. The Y direction may also be referred to as a gate-extending direction.

FIGS. 2A, 2B, 2C, 2D, 2E and 2F are plan views illustrating the formation of a semiconductor structure 100 at various intermediate stages, in accordance with some embodiments of the disclosure.

Figure 2A:
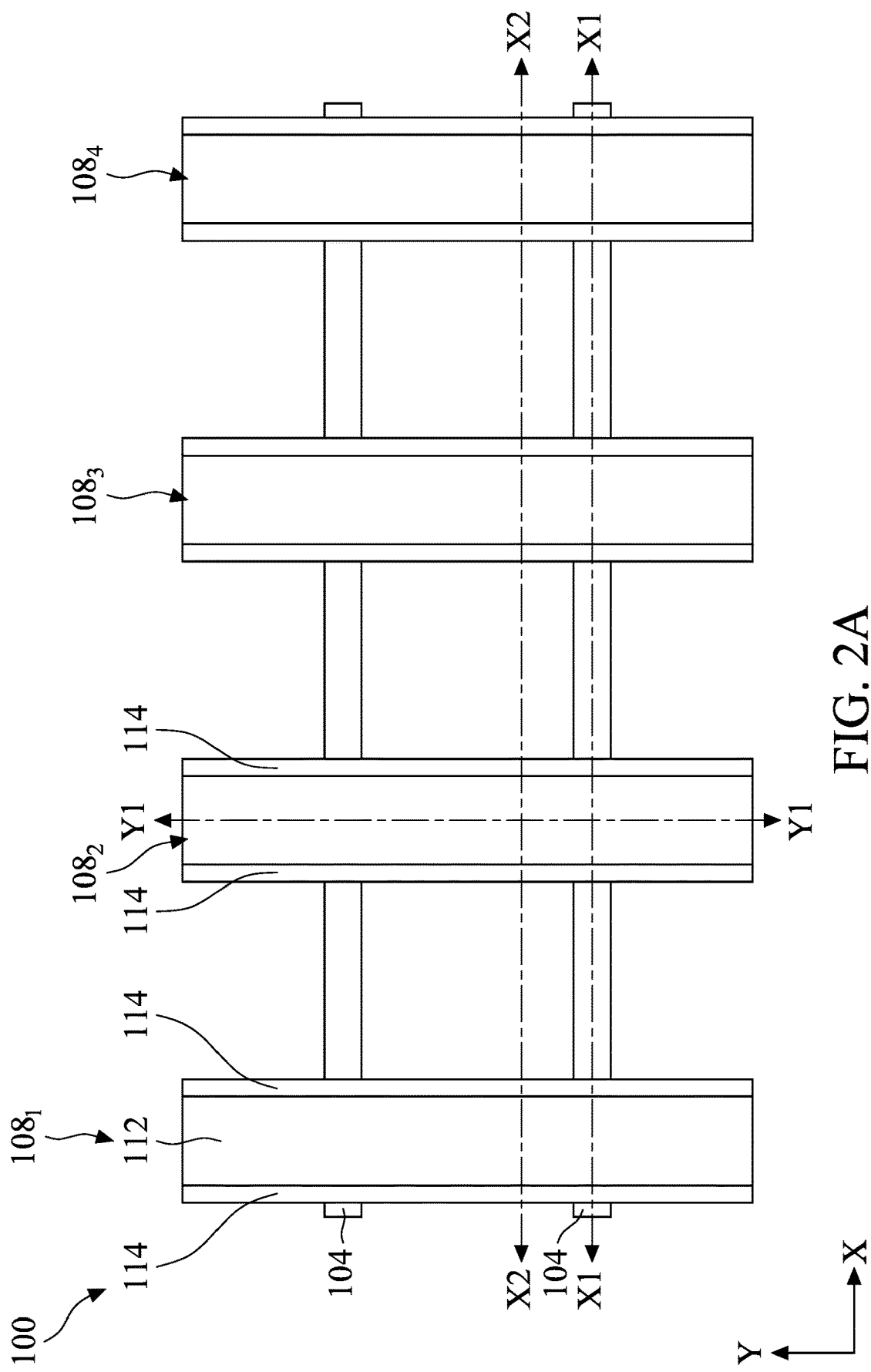
FIGS. 2A, 2B, 2C, 2D, 2E and 2F are plan views illustrating the formation of a semiconductor structure at various intermediate stages, in accordance with some embodiments of the disclosure.
Figures 1, 2A:
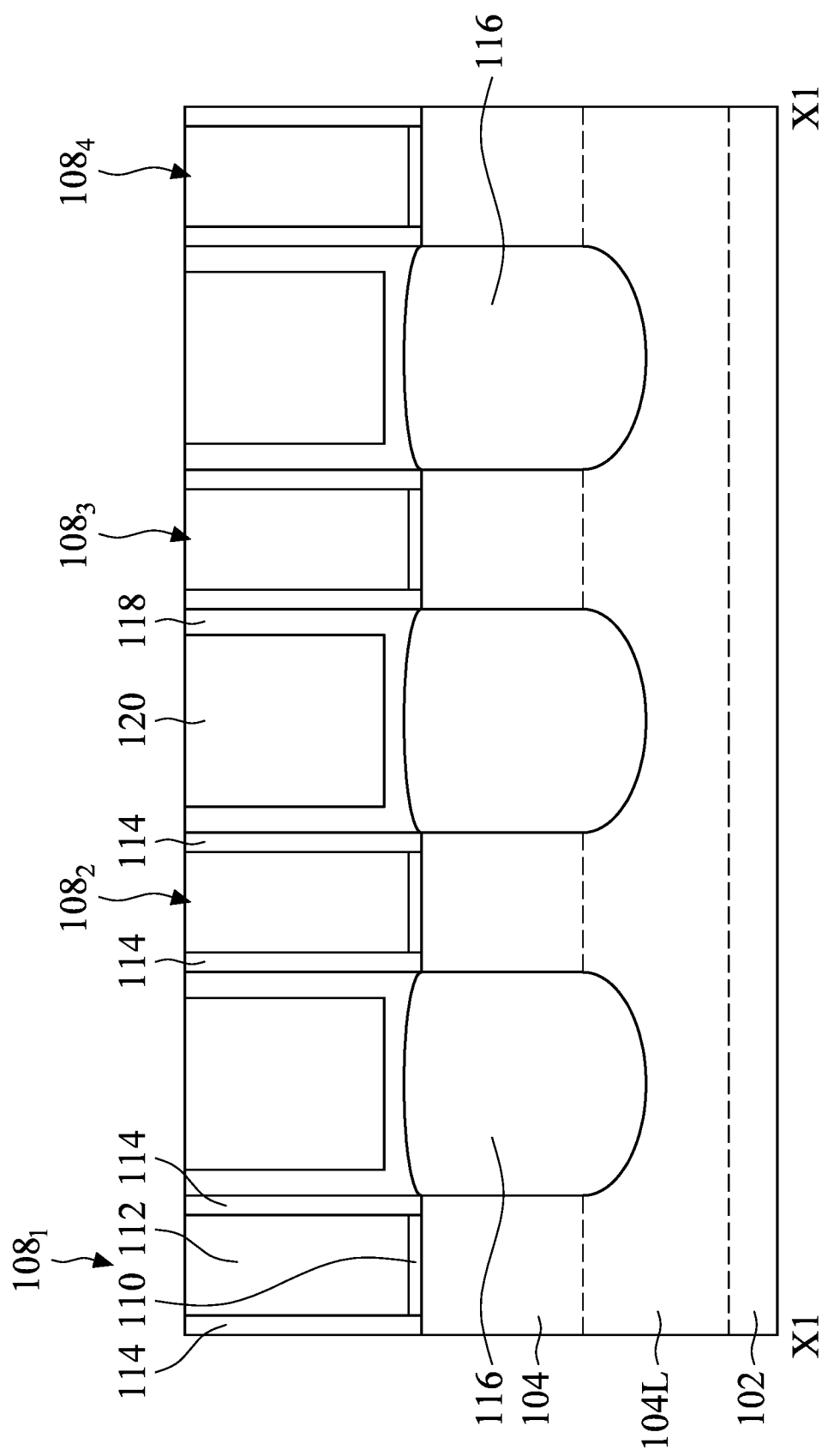
Figures 2, 2A:
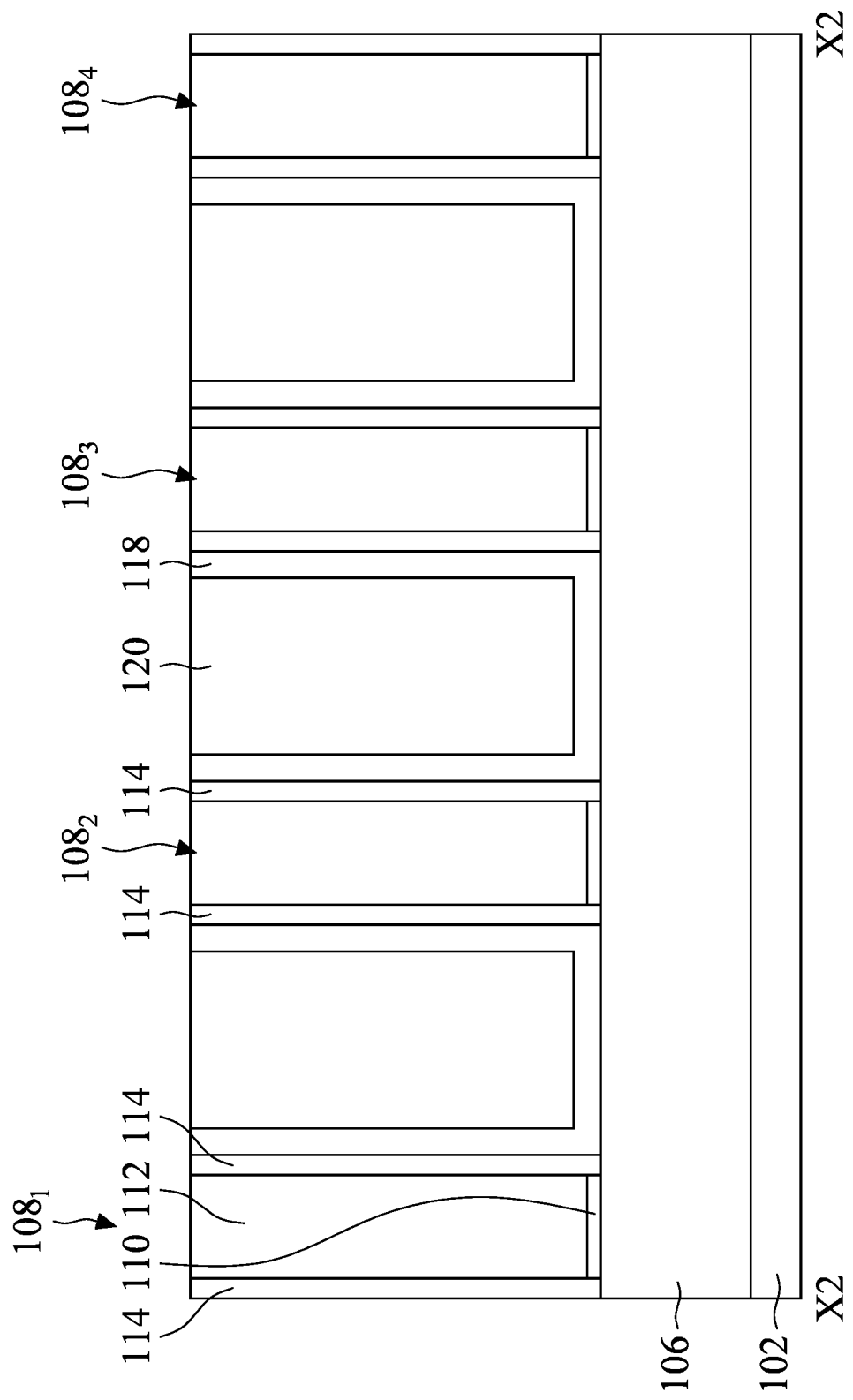
Figures 2, 2A, 3:
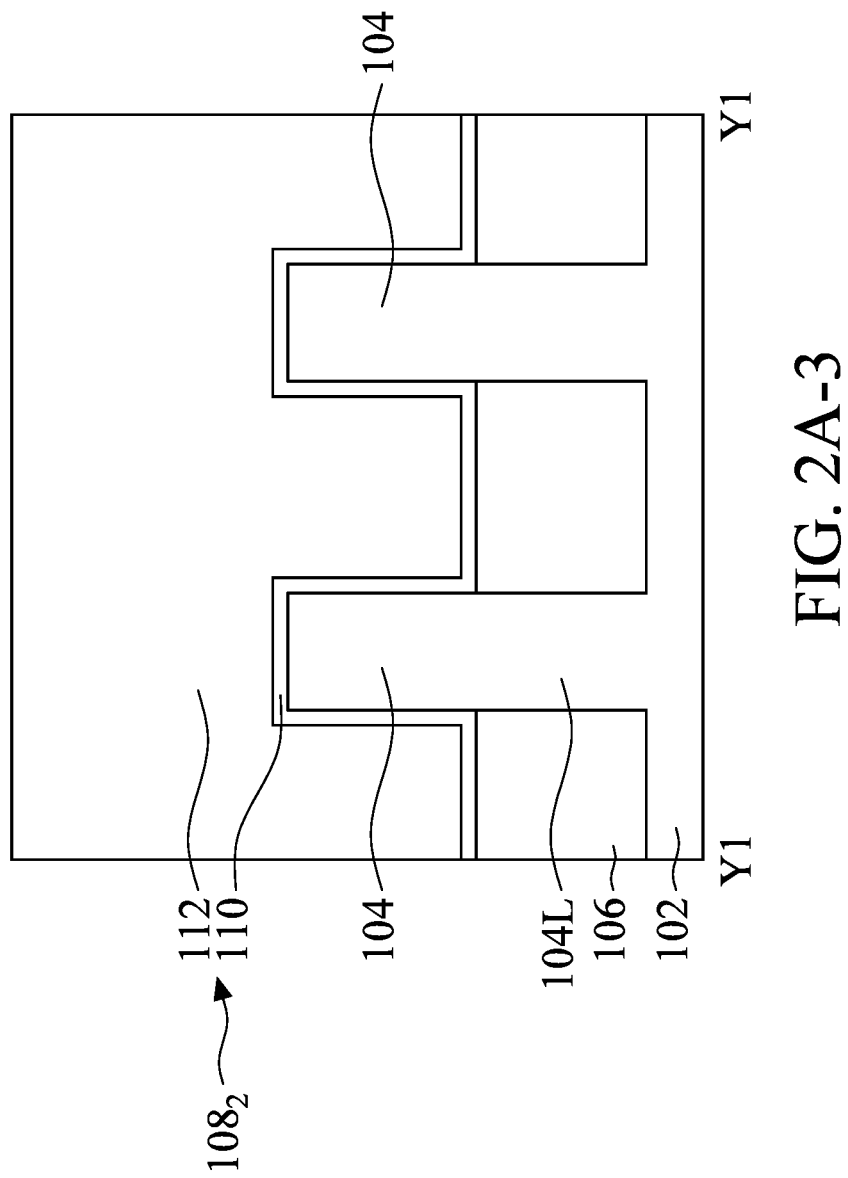

FIGS. 2A through 2A-3 illustrate a semiconductor structure 100 after the formation of active regions 104, an isolation structure 106, dummy gate structures 108, gate spacer layers 114, source/drain features 116, a contact etching stop layer (CESL) 118, and an interlayer dielectric layer (ILD) 120, in accordance with some embodiments. FIGS. 2A-1, 2A-2 and 2A-3 are cross-sectional views of the semiconductor structure 100 taken along line X1-X1, line X2-X2 and line Y1-Y1 of FIG. 2A, respectively. It should be noted that the plan views in the present disclosure only illustrate some components of the semiconductor structure 100 for illustrative purposes, some other components of the semiconductor structure 100 may be shown in the cross-sectional views.

The semiconductor structure 100 includes a substrate 102, active regions 104 and an isolation structure 106 over the substrate 102, and dummy gate structures 108 (including $108_{1-4}$) over the active regions 104 and the isolation structure 106, as shown in FIGS. 2A through 2A-3, in accordance with some embodiments. In some embodiments, the active regions 104 extend in the X direction. The active regions 104 have longitudinal axes parallel to the X direction, in accordance with some embodiments. That is, the dimensions (lengths) of the active regions 104 in the X direction are greater than the dimensions (widths) of the active regions 104 in the Y direction. In some embodiments, the active regions are the fin structure 104 as shown in FIG. 1.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the active regions 104 includes patterning the substrate 102 thereby forming trenches, in accordance with some embodiments. The portions of the substrate 102 that protrude from between the trenches serve as the active regions 104, in accordance with some embodiments. The patterning process may include photolithography and etching processes.

The isolation structure 106 is formed over the substrate 102 to partially fill the trenches, as shown in FIGS. 2A-2 and 2A-3, in accordance with some embodiments. The isolation structure 106 surrounds lower portions 104L of the active regions 104, in accordance with some embodiments. The top surface and the bottom surface of the isolation structure 106 are illustrated as dash lines in FIG. 2A-1. The isolation structure 106 may be also referred to as shallow trench isolation (STI) feature. In some embodiments, the isolation structure 106 is made of dielectric material such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof.

In some embodiments, the formation of the isolation structure 106 includes depositing a dielectric material for the isolation structure 106 to overfill the trenches. In some embodiments, the dielectric material is deposited using chemical vapor deposition (CVD) (such as such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof. The dielectric material formed over the tops of the active regions 104 is planarized, for example, using CMP, an etching back process, or a combination thereof, in accordance with some embodiments. The dielectric material is further recessed using an etching process to expose the sidewalls of the active regions 104, in accordance with some embodiments. A remainder of the dielectric material serves as the isolation structure 106, in accordance with some embodiments.

The dummy gate structures $108_{1-4}$ extend across the active regions 104 and the isolation structure 106, as shown in FIGS. 2A through 2A-3, in accordance with some embodiments. The dummy gate structures $108_{1-4}$ surround the channel regions of the active regions 104, in accordance with some embodiments. The dummy gate structures $108_{1-4}$ are configured as sacrificial structures and will be replaced with final gate stacks, in accordance with some embodiments. In some embodiments, the dummy gate structures $108_{1-4}$ extend in the Y direction. The dummy gate structures $108_{1-4}$ have longitudinal axes parallel to the Y direction, in accordance with some embodiments. That is, the dimensions (lengths) of the dummy gate structures $108_{1-4}$ in the Y direction are greater than the dimensions (widths) of the dummy gate structures $108_{1-4}$ in the X direction.

Each of the dummy gate structures $108_{1-4}$ includes a dummy gate dielectric layer 110 and a dummy gate electrode layer 112 formed over the dummy gate dielectric layer 110, as shown in FIGS. 2A through 2A-3, in accordance with some embodiments. In some embodiments, the dummy gate dielectric layer 110 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy gate electrode layer 112 is made of semiconductor material such as polysilicon, poly-silicon germanium. In some embodiments, the dummy gate electrode layer 112 is made of a conductive material such as metallic nitrides, metallic silicides, metals, and/or a combination thereof. In some embodiments, the material for the dummy gate electrode layer 112 is formed using CVD, another suitable technique, and/or a combination thereof.

In some embodiments, the formation of the dummy gate structures $108_{1-4}$ includes globally and conformally depositing a dielectric material for the dummy gate dielectric layer 110 over the semiconductor structure 100, depositing a material for the dummy gate electrode layer 112 over the dielectric material, planarizing the material for the dummy gate electrode layer 112, and patterning the dielectric material and the material for the dummy gate electrode layer 112 into the dummy gate structures $108_{1-4}$. The patterning process includes forming a patterned hard mask layer (not shown) over the material for the dummy gate electrode layer 112 to overlap the channel regions of the active regions 104, in accordance with some embodiments. The material for the dummy gate electrode layer 112 and the dielectric material, uncovered by the patterned hard mask layer, is etched away until the source/drain regions of the active regions 104 are exposed, in accordance with some embodiments.

Gate spacer layers 114 are formed along the opposite sidewalls of the dummy gate structures $108_{1-4}$, as shown in FIGS. 2A through 2A-2, in accordance with some embodiments. The gate spacer layers 114 extend in the Y direction and across the active regions 104 and the isolation structure 106, in accordance with some embodiments. The gate spacer layers 114 are used to offset the subsequently formed source/drain features and separate the source/drain features from the gate structure, in accordance with some embodiments. In some embodiments, the gate spacer layers 114 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layers 114 are made of low-k dielectric materials. For example, the dielectric constant (k) value of the gate spacer layers 120 may be lower than a k-value of silicon oxide (SiO), such as lower than 4.2, equal to or lower than about 3.9, such as in a range from about 3.5 to about 3.9.

In some embodiments, the formation of the gate spacer layers 114 includes globally and conformally depositing a dielectric material for the gate spacer layers 114 over the semiconductor structure 100, followed by an anisotropic etching process. In some embodiments, the etching process is performed without an additional photolithography process. The portions of the dielectric material that remain on the sidewalls of the dummy gate structures $108_{1-4}$ serve as the gate spacer layers 114, in accordance with some embodiments.

Source/drain features 116 are formed in and/or over the source/drain regions of the active regions 104, as shown in FIG. 2A-1, in accordance with some embodiments. The formation of the source/drain features 116 includes recessing the source/drain regions of the active regions 104 using the dummy gate structures $108_{1-4}$ and the gate spacer layers 114 as masks to form source/drain recesses on opposite sides of the dummy gate structures $108_{1-4}$, in accordance with some embodiments. The source/drain recesses extend into the lower portions 104L of the active regions 104, in accordance with some embodiments.

Afterward, the source/drain features 116 are grown on the exposed surfaces of the active regions 104 in the source/drain recesses using an epitaxial growth process, in accordance with some embodiments. The epitaxial growth process may be molecular beam epitaxy (MBE), metal organic chemical vapor deposition (MOCVD), vapor phase epitaxy (VPE), or another suitable technique. In some embodiments, the source/drain features 116 are made of any suitable material for an n-type semiconductor device and a p-type semiconductor device, such as Ge, Si, GaAs, AlGaAs, SiGe, GaAsP, SiP, SiC, SiCP, or a combination thereof.

In some embodiments, the source/drain features 116 are in-situ doped during the epitaxial growth process. For example, the n-type source/drain features for n-type semiconductor devices are doped with the n-type dopant during the epitaxial growth process. For example, the n-type dopant may be phosphorous (P) or arsenic (As). For example, the n-type source/drain features may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 116 are in a range from about $2 \times 10^{19}$ $cm^{-3}$ to about $3 \times 10^{21}$ $cm^{-3}$.

For example, the p-type source/drain features for p-type semiconductor devices are doped with the p-type dopant during the epitaxial growth process. For example, the p-type dopant may be boron (B) or $BF_2$. For example, the p-type source/drain features may be the epitaxially grown silicon germanium (SiGe), silicon germanium carbon (SiGeC), germanium (Ge), silicon (Si) or a combination thereof doped with boron (B). In some embodiments, the concentrations of the dopant (e.g., B) in the source/drain features 116 are in a range from about $1 \times 10^{19}$ $cm^{-3}$ to about $6 \times 10^{20}$ $cm^{-3}$.

A contact etching stop layer 118 is formed over the semiconductor structure 100 to cover the source/drain features 116, as shown in FIGS. 2A-1 and 2A-2, in accordance with some embodiments. In some embodiments, the contact etching stop layer 118 further extends along, and covers, the top surface of the isolation structure 106 and the sidewalls of the gate spacer layers 114. In some embodiments, the contact etching stop layer 118 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the contact etching stop layer 118 is globally and conformally deposited using CVD (such as LPCVD, PECVD, HDP-CVD, or HARP), ALD, another suitable method, or a combination thereof.

An interlayer dielectric layer 120 is formed over the contact etching stop layer 118, as shown in FIGS. 2A-1 and 2A-2, in accordance with some embodiments. In some embodiments, the interlayer dielectric layer 120 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 120 and the contact etching stop layer 118 are made of different materials and have a great difference in etching selectivity. In some embodiments, the dielectric material for the interlayer dielectric layer 120 is deposited using such as CVD (such as HDP-CVD, PECVD, HARP or FCVD), another suitable technique, and/or a combination thereof. The dielectric materials for the contact etching stop layer 118 and the interlayer dielectric layer 120 above the top surfaces of the dummy gate structures $108_{1-4}$ are removed using such as CMP, in accordance with some embodiments.

Figure 2B:
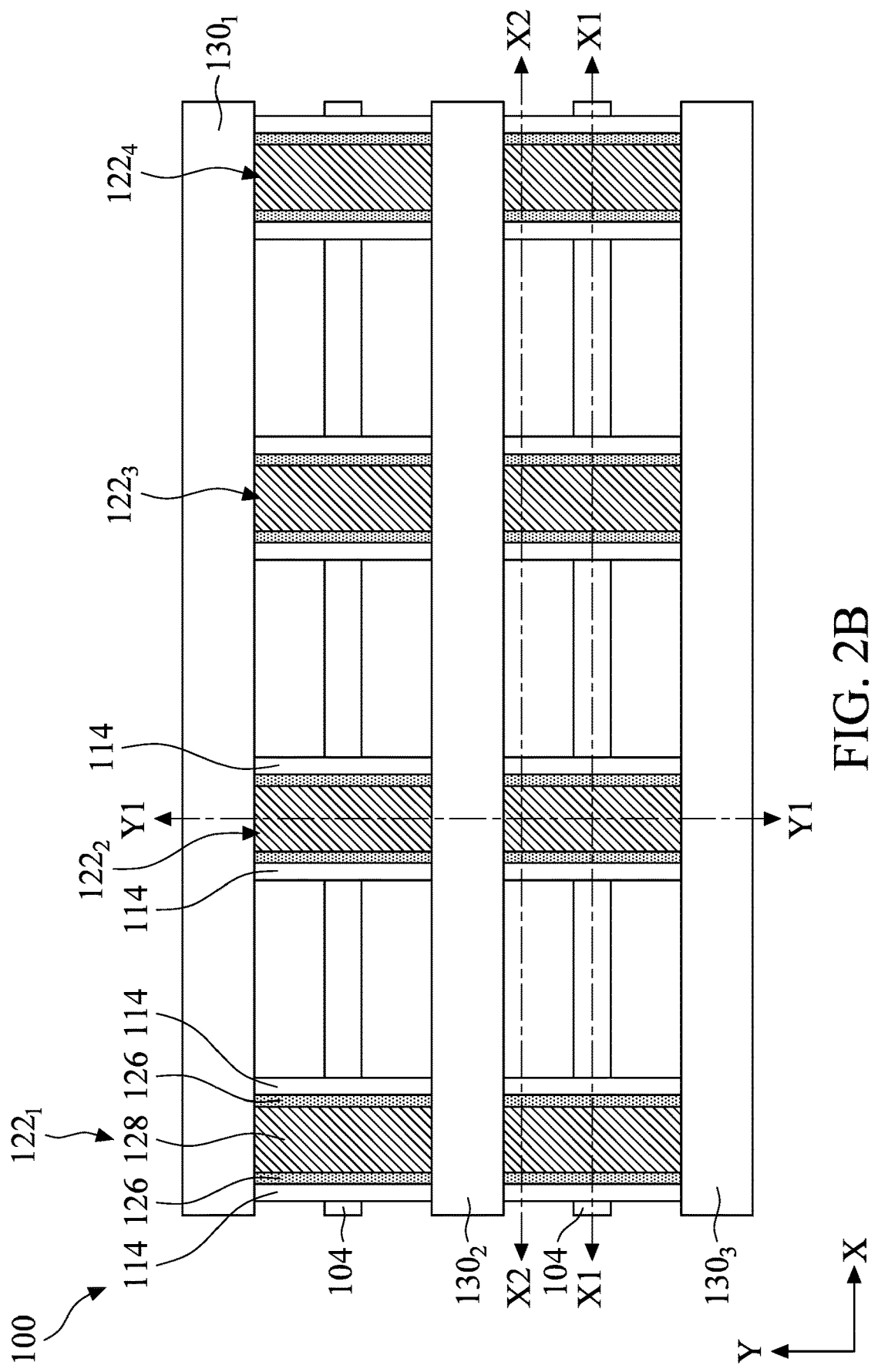
Figures 1, 2B:
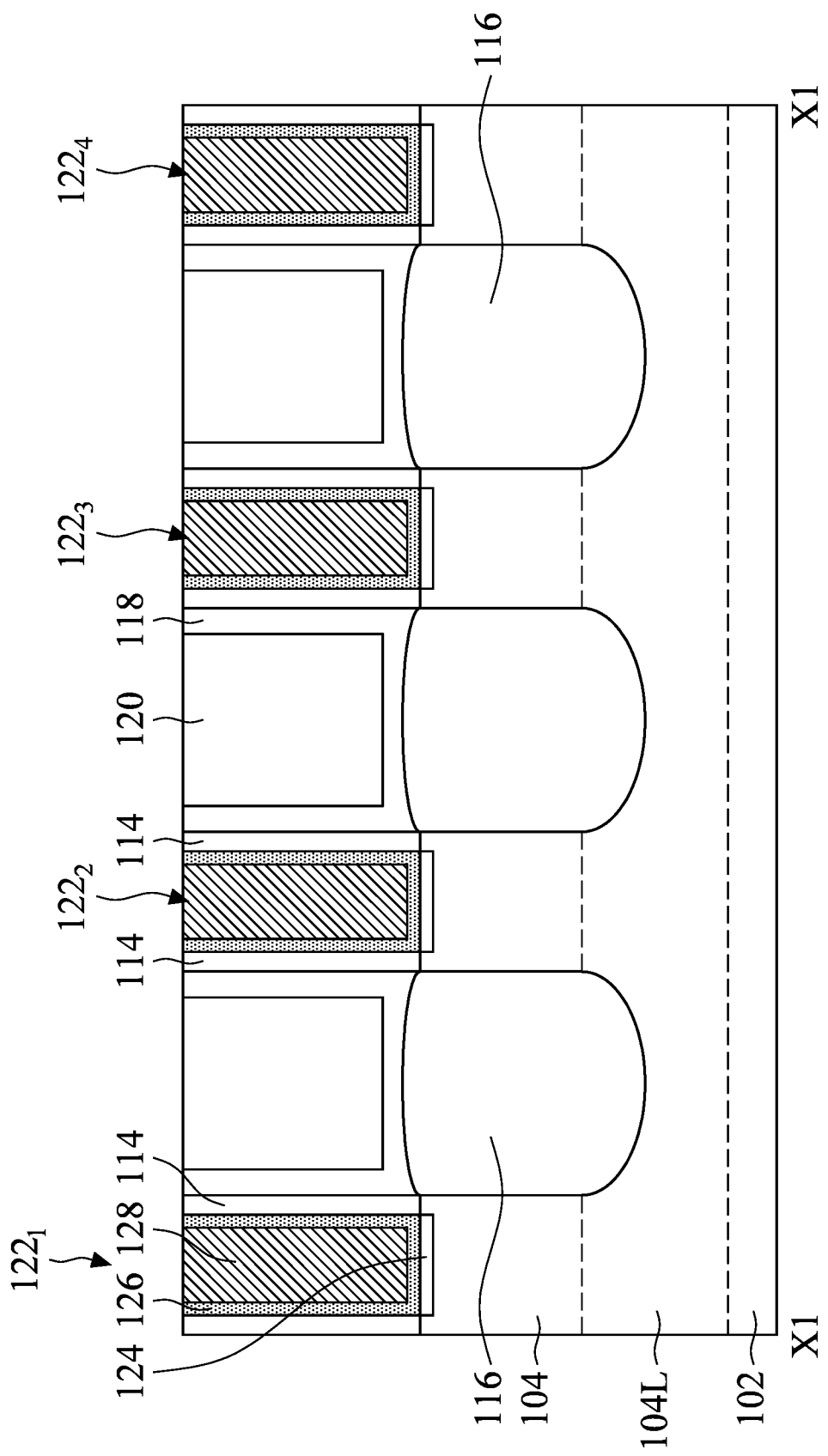
Figures 2, 2B:
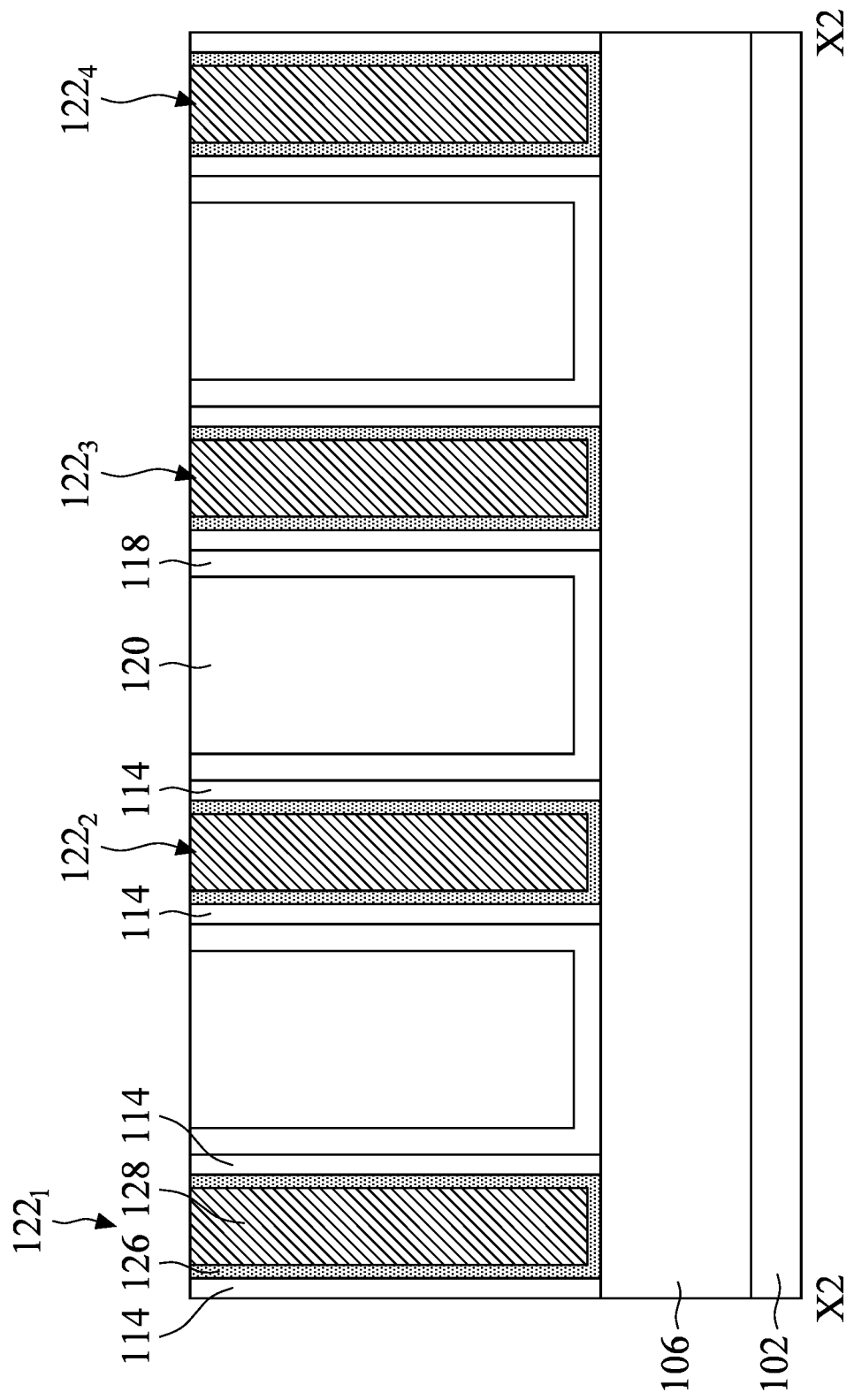
Figures 2, 2B, 3:
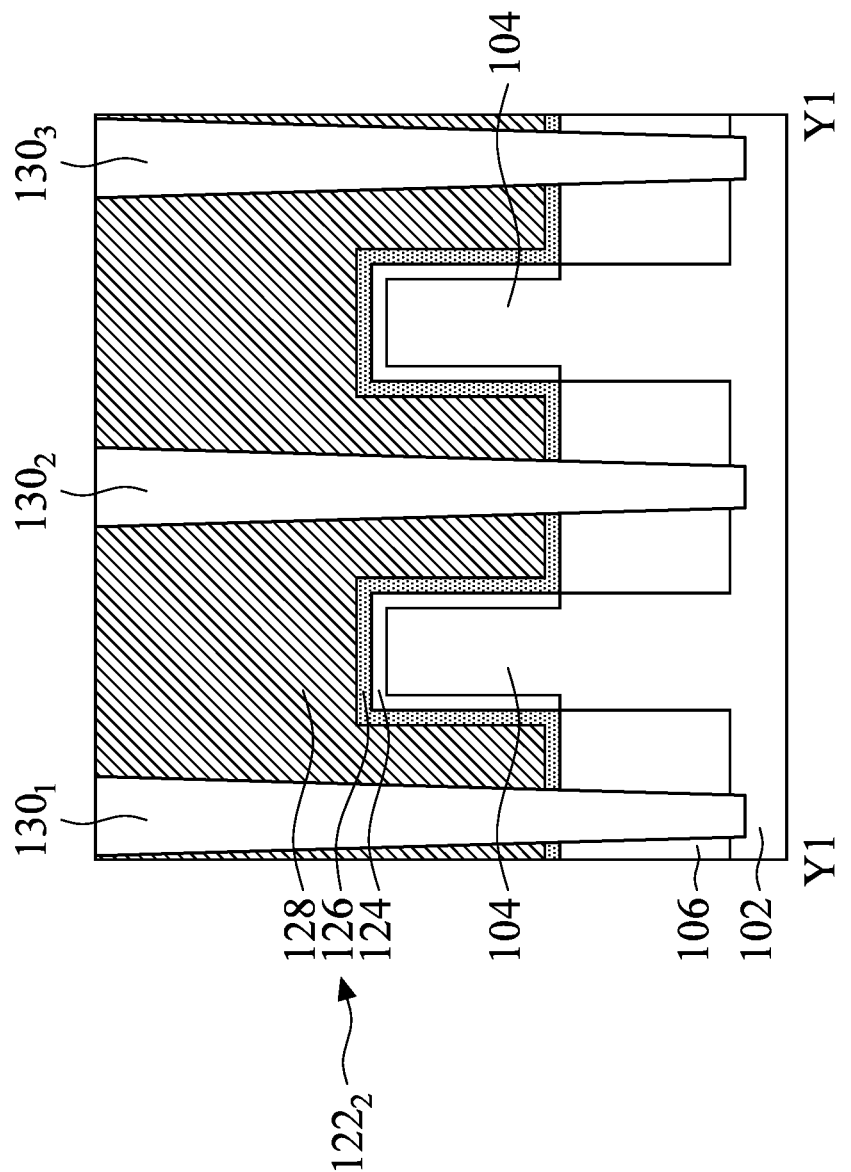

FIGS. 2B through 2B-3 illustrate a semiconductor structure 100 after the formation of final gate stacks 122 and gate cutting structures 130, in accordance with some embodiments. FIGS. 2B-1, 2B-2 and 2B-3 are cross-sectional views of the semiconductor structure 100 taken along line X1-X1, line X2-X2 and line Y1-Y1 of FIG. 2B, respectively.

The dummy gate structures $108_{1-4}$ are removed using one or more etching processes to form gate trenches (not shown), in accordance with some embodiments. The gate trenches expose the channel regions of the active regions 104, in accordance with some embodiments. The gate trenches also expose the inner sidewalls of the gate spacer layers 114 facing the channel regions, in accordance with some embodiments. In some embodiments, the etching process includes one or more etching processes. For example, when the dummy gate electrode layer 112 is made of polysilicon, a wet etchant such as a tetramethylammonium hydroxide (TMAH) solution may be used to selectively remove the dummy gate electrode layer 112. For example, the dummy gate dielectric layer 110 may be thereafter removed using a plasma dry etching, a dry chemical etching, and/or a wet etching.

Final gate stacks $122_{1-4}$ are formed in the gate trenches, as shown in FIGS. 2B through 2B-3, in accordance with some embodiments. The final gate stacks $122_{1-4}$ extend across the active regions 104 and the isolation structure 106, in accordance with some embodiments. The final gate stacks $122_{1-4}$ surround the channel regions of the active regions 104, in accordance with some embodiments. In some embodiments, the final gate stacks $122_{1-4}$ extend in the Y direction. The final gate stacks $122_{1-4}$ have longitudinal axes parallel to the Y direction, in accordance with some embodiments. That is, the dimensions (lengths) of the final gate stacks $122_{1-4}$ in the Y direction are greater than the dimensions (widths) of the final gate stacks $122_{1-4}$ in the X direction.

In some embodiments, each of the final gate stacks $122_{1-4}$ includes an interfacial layer 124, a gate dielectric layer 126 and a metal gate electrode layer 128, as shown in FIGS. 2B through 2B-3, in accordance with some embodiments. The interfacial layer 124 is formed on the exposed surfaces of the active regions 104, in accordance with some embodiments. In some embodiments, the interfacial layer 124 is made of a chemically formed silicon oxide. In some embodiments, the interfacial layer 124 is nitrogen-doped silicon oxide. In some embodiments, the interfacial layer 124 is formed using one or more cleaning processes such as including ozone ($O_3$), ammonia hydroxide-hydrogen peroxide-water mixture, and/or hydrochloric acid-hydrogen peroxide-water mixture. Semiconductor material from the active regions 104 is oxidized to form the interfacial layer 124, in accordance with some embodiments.

The gate dielectric layer 126 is formed over the interfacial layer 124 to partially fill the gate trenches, in accordance with some embodiments. The gate dielectric layer 126 is further formed along the upper surface of the isolation structure 106, in accordance with some embodiments. The gate dielectric layer 126 is also conformally formed along the sidewalls of the gate spacer layers 114 facing the channel region, in accordance with some embodiments. The gate dielectric layer 126 may be high-k dielectric layer, in accordance with some embodiments. In some embodiments, the high-k dielectric layer is made of dielectric material with high dielectric constant (k value), for example, greater than 3.9 for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique. In some embodiments, the gate dielectric layer 126 has a thickness (the dimension in the X direction) in a range from about 0.5 nm to about 3 nm.

The metal gate electrode layer 128 is formed over the gate dielectric layer 126 to overfill remainders of the gate trenches, in accordance with some embodiments. The metal gate electrode layer 128 is nested within the gate dielectric layer 126, in accordance with some embodiments. In some embodiments, the metal gate electrode layer 128 is made of more than one conductive material, such as a metal, metal alloy, conductive metal oxide and/or metal nitride, another suitable conductive material, and/or a combination thereof. For example, the metal gate electrode layer 128 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 128 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 128 may be formed using ALD, PVD, CVD, e-beam evaporation, or another suitable technique. The metal gate electrode layer 128 may be formed separately for n-channel FinFETs and p-channel FinFETs, which may use different work function materials.

A planarization process such as CMP may be performed on the semiconductor structure 100 to remove the materials of the gate dielectric layer 126 and the metal gate electrode layer 128 formed above the top surface of the interlayer dielectric layer 120, in accordance with some embodiments. After the planarization process, the top surfaces of the metal gate electrode layer 128, the gate spacer layers 114, the contact etching stop layer 118 and the interlayer dielectric layer 120 are substantially coplanar, in accordance with some embodiments.

Portions of the final gate stacks 122 surrounding the channel regions of the active regions 104 combine with the neighboring source/drain features 116 to form functional transistors (e.g., p-channel FinFETs or n-channel FinFETs), in accordance with some embodiments. The final gate stacks 122 engage the channel so that current can flow between the source/drain features 116 during operation.

Gate cutting structures 130 (including $130_{1-3}$) are formed in and/or through the final gate stacks $122_{1-4}$, the gate spacer layers 114, the interlayer dielectric layer 120 and the contact etching stop layer 118, as shown in FIGS. 2B and 2B-3, in accordance with some embodiments. In some embodiments, the gate cutting structures $130_{1-3}$ extend in the X direction. The gate cutting structures $130_{1-3}$ have longitudinal axes parallel to the X direction, in accordance with some embodiments. That is, the dimensions (lengths) of the gate cutting structures 130 in the X direction are greater than the dimensions (widths) of the gate cutting structures 130 in the Y direction. The gate cutting structures $130_{1-3}$ extend into the substrate 102 and have bottom surfaces lower than the bottom surface of the isolation structure 106, in accordance with some embodiments.

In some embodiments, the gate cutting structures $130_{1-3}$ are formed corresponding to the isolation structure 106, in accordance with some embodiments. In some embodiments, the gate cutting structures $130_{1-3}$ and the active regions 104 are alternately arranged. The gate cutting structures 130 may be also referred to as cut metal gate (CMG) pattern. The final gate stacks $122_{1-4}$ are cut into several segments by the gate cutting structures $130_{1-3}$, in accordance with some embodiments. The segments of the final gate stacks $122_{1-4}$ are physically and electrically insulated from one another by the gate cutting structures 130, in accordance with some embodiments.

In some embodiments, the gate cutting structures 130 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the gate cutting structures 130 include dielectric material with a k-value greater than 9, such as LaO, AlO, AlON, ZrO, HfO, ZnO, ZrN, ZrAlO, TiO, TaO, YO, and/or TaCN.

The formation of the gate cutting structures 130 includes patterning the final gate stacks $122_{1-4}$, the gate spacer layers 114, the interlayer dielectric layer 120, the contact etching stop layer 118, the isolation structure 106 and the substrate 102 to form cutting trenches (where the gate cutting structures 130 are to be formed) using photolithography and etching processes. The formation of the gate cutting structures 130 further includes depositing a dielectric material for the gate cutting structures 130 to overfill the cutting trenches, in accordance with some embodiments. In some embodiments, the deposition process is ALD, CVD (such as LPCVD, PECVD, HDP-CVD, or HARP), another suitable technique, or a combination thereof. Afterward, a planarization process is then performed on the dielectric material for the gate cutting structures 130 until the gate electrode layer 128 and the interlayer dielectric layer 120 are exposed, in accordance with some embodiments. The planarization may be CMP, an etching back process, or a combination thereof.

Figure 2C:
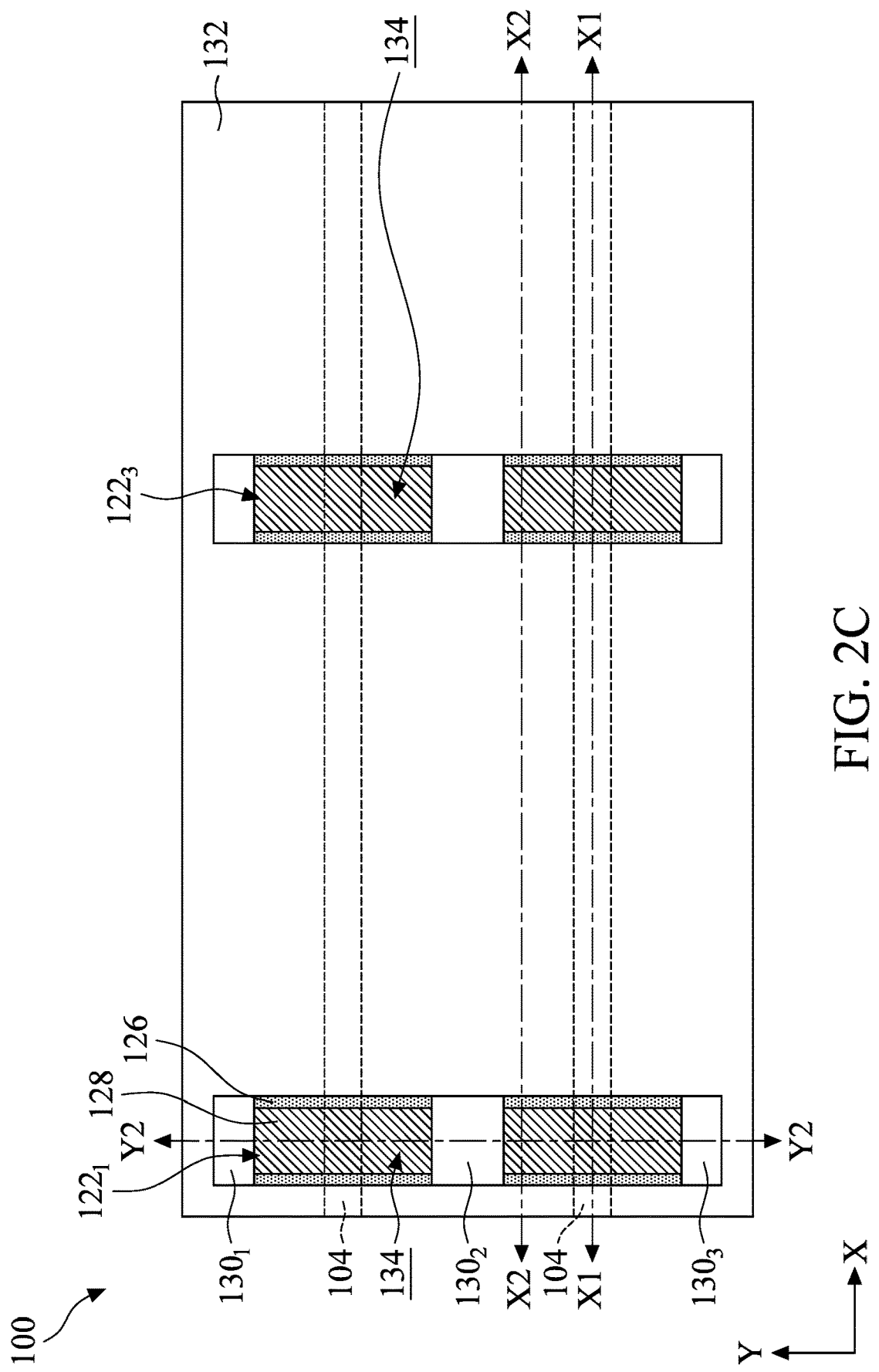
Figures 1, 2C:
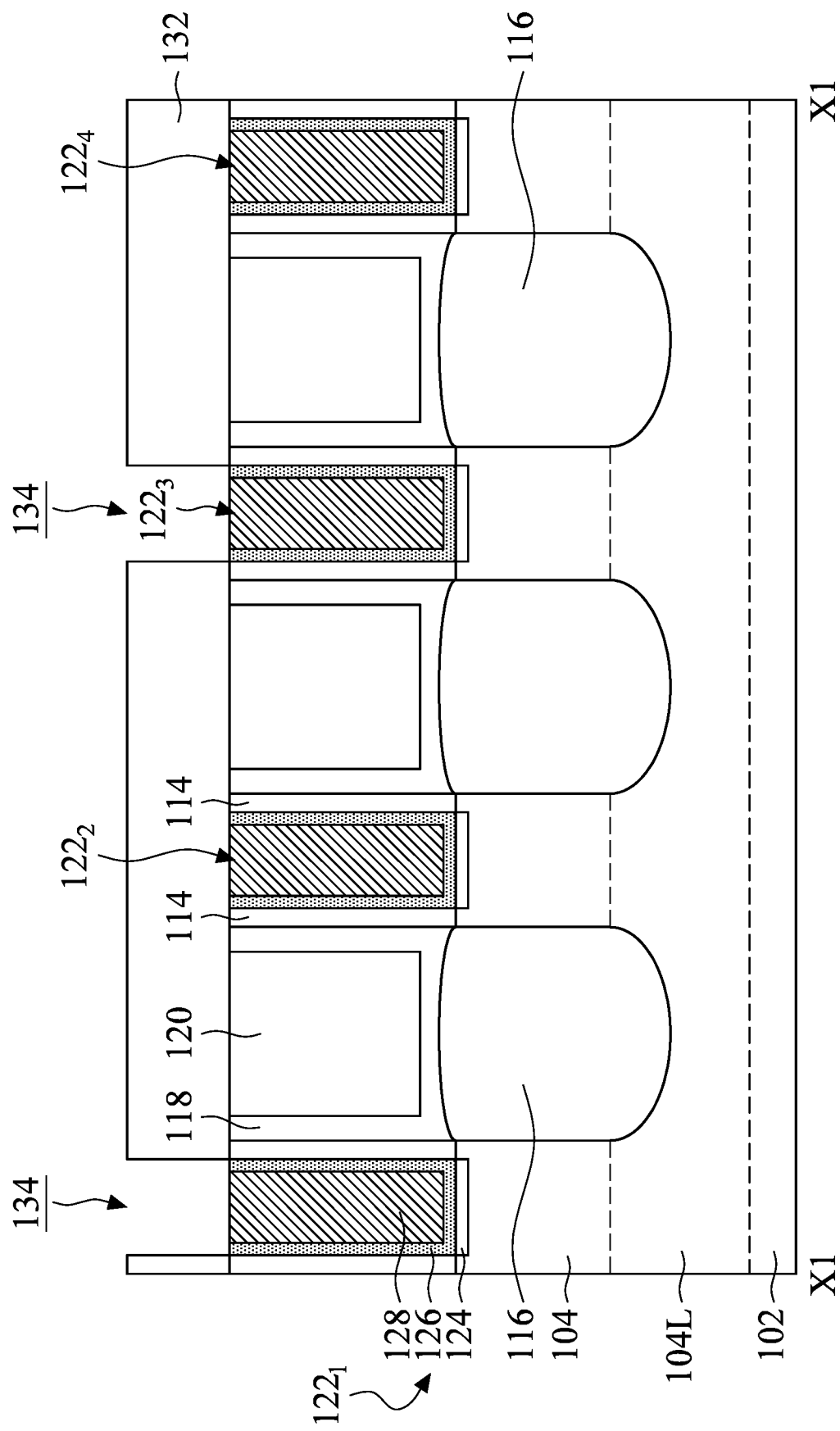
Figures 2, 2C:
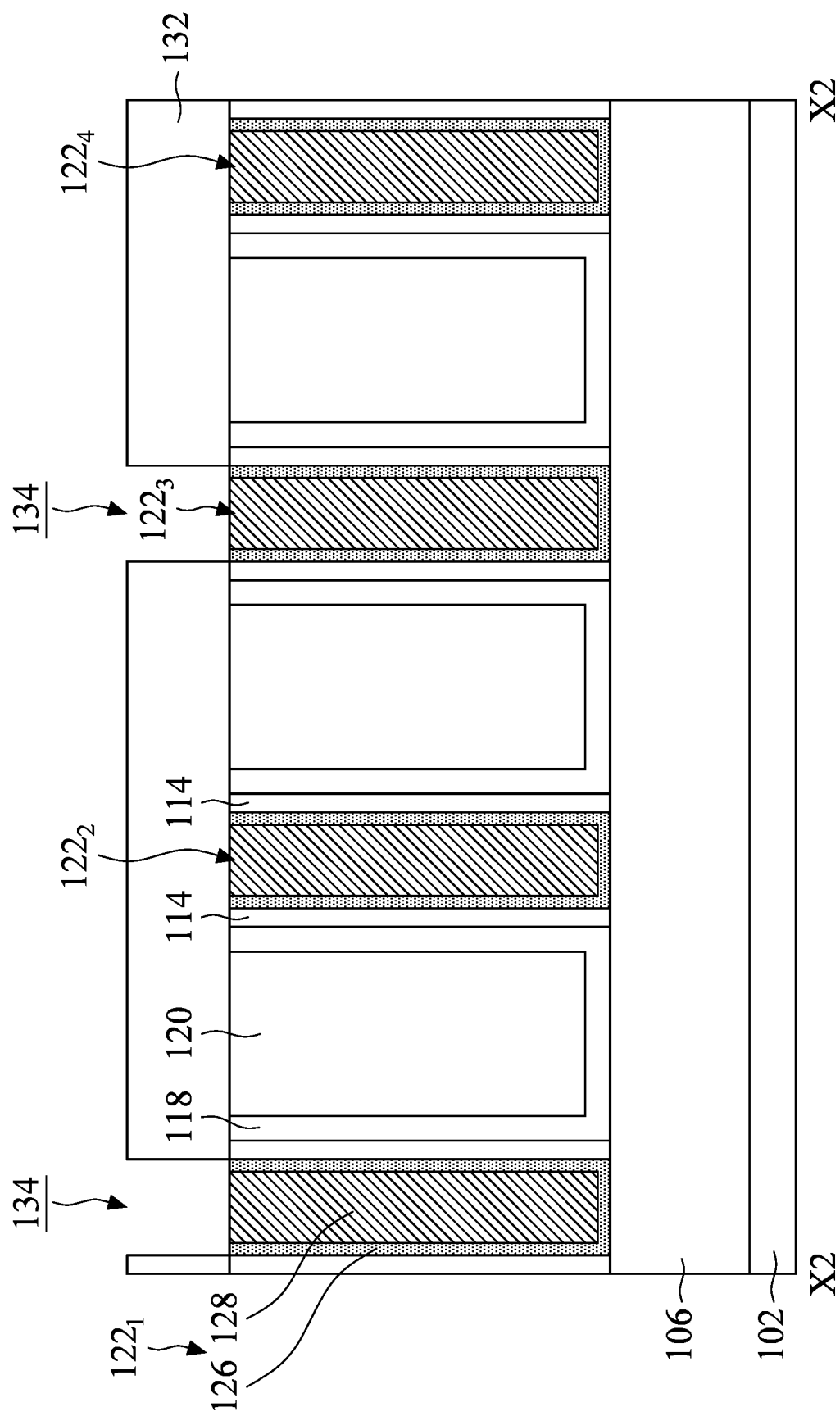
Figures 2, 2C, 3:
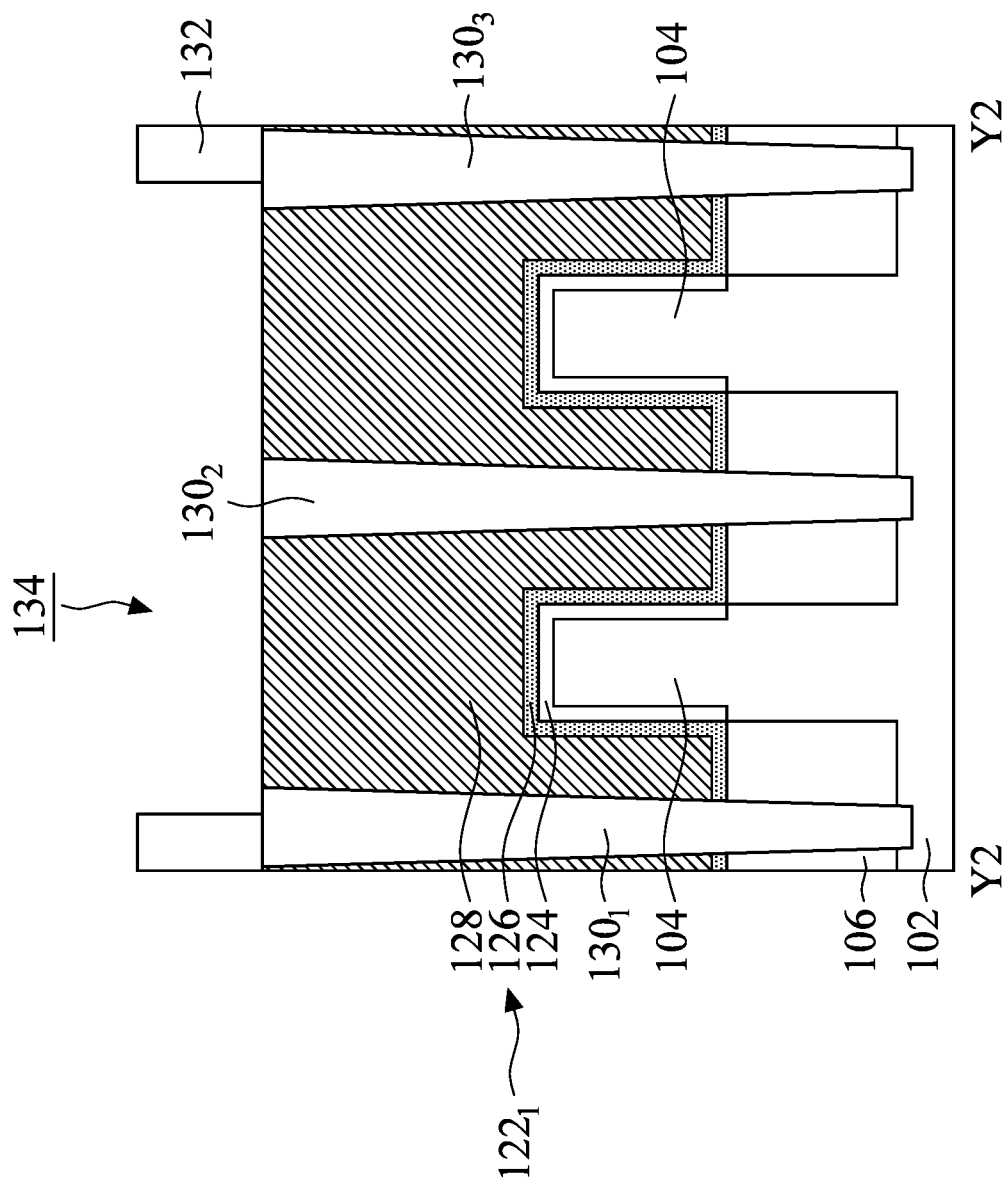

FIGS. 2C through 2C-3 illustrate a semiconductor structure 100 after the formation of a patterned mask layer 132, in accordance with some embodiments. FIGS. 2C-1, 2C-2 and 2C-3 are cross-sectional views of the semiconductor structure 100 taken along line X1-X1, line X2-X2 and line Y2-Y2 of FIG. 2C, respectively.

A patterned mask layer 132 is formed over the semiconductor structure 100, as shown FIGS. 2C through 2C-2, in accordance with some embodiments. The patterned mask layer 132 is a patterned photoresist layer, a patterned hard mask layer, and/or a combination thereof, in accordance with some embodiments. In some embodiments, a photoresist is formed on the final gate stacks $122_{1-4}$, the gate spacer layers 114, the contact etching stop layer 118, the interlayer dielectric layer 120 and the gate cutting structures $130_{1-3}$, such as by using spin-on coating, and then patterned with openings 134 by exposing the photoresist to light using an appropriate photomask. Exposed or unexposed portions of the photoresist may be removed depending on whether a positive or negative resist is used.

In alternative embodiments, a hard mask layer may be formed on semiconductor structure 100. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be etched using a patterned photoresist layer, which may be formed by the photolithography described above, thereby having the openings 134.

The openings 134 correspond to the final gate stacks $122_1$ and $122_3$, in accordance with some embodiments. In some embodiments, the gate dielectric layer 126 and the metal gate electrode layer 128 of the gate cutting structures $130_{1-3}$ are exposed from the openings 134. In some embodiments, the openings 134 also expose the gate cutting structures $130_1$-$130_3$. In some embodiments, the openings 134 extend in the Y direction. That is, the openings 134 have longitudinal axes parallel to the Y direction. That is, the dimensions (lengths) of the openings 134 in the Y direction are greater than the dimensions (widths) of the openings 134 in the X direction.

Figure 2D:
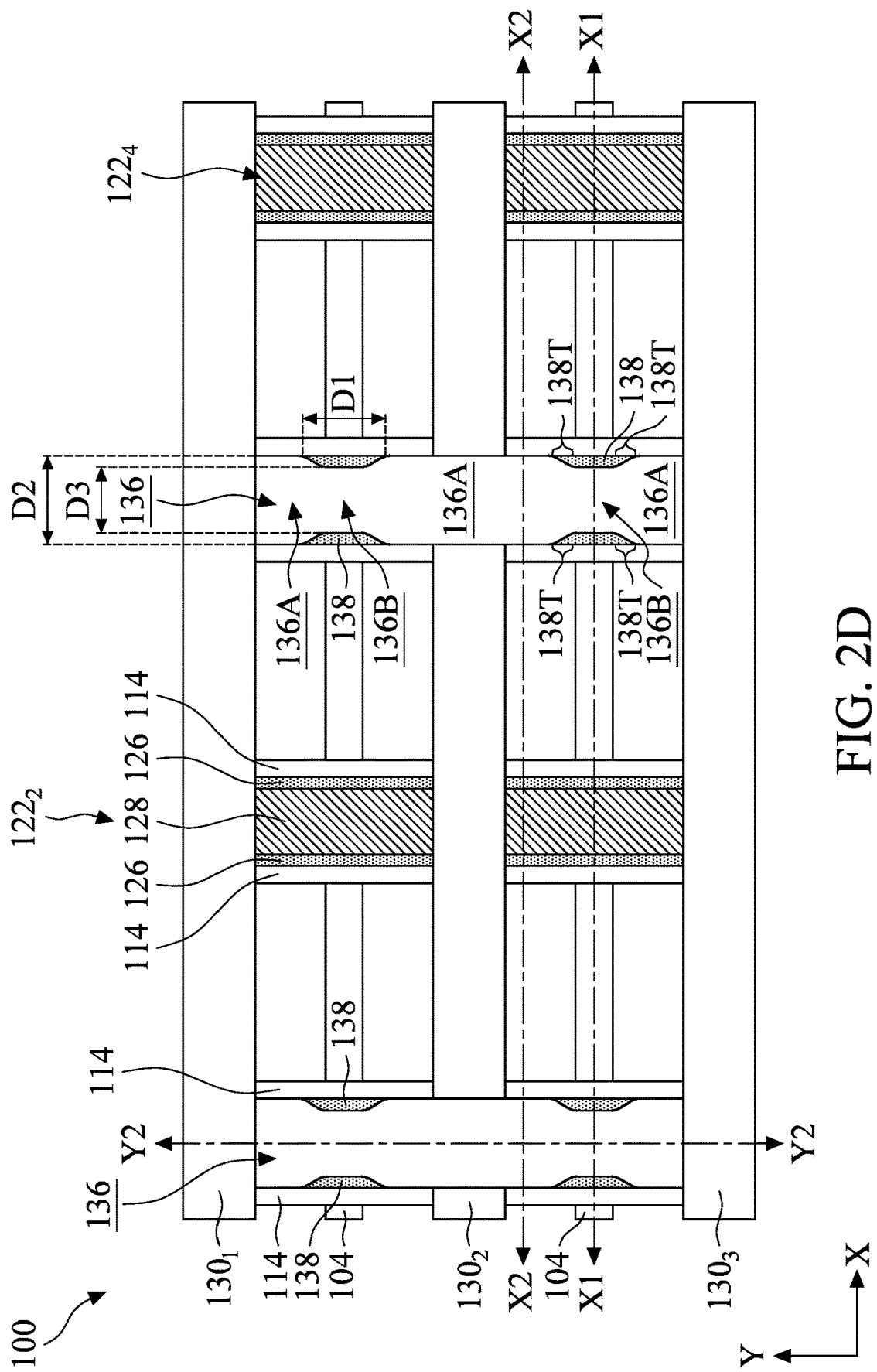
Figures 1, 2D:
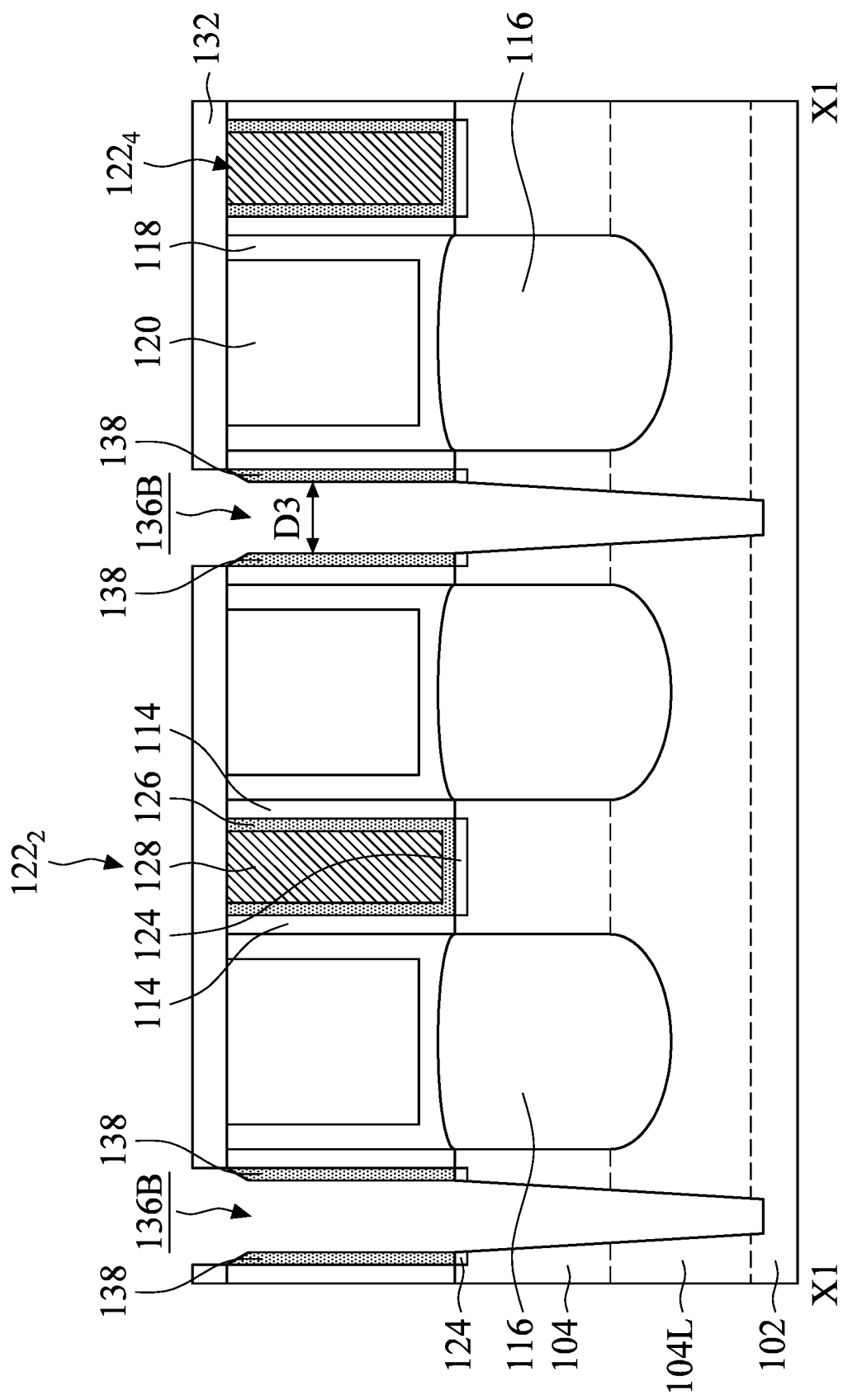
Figures 2, 2D:
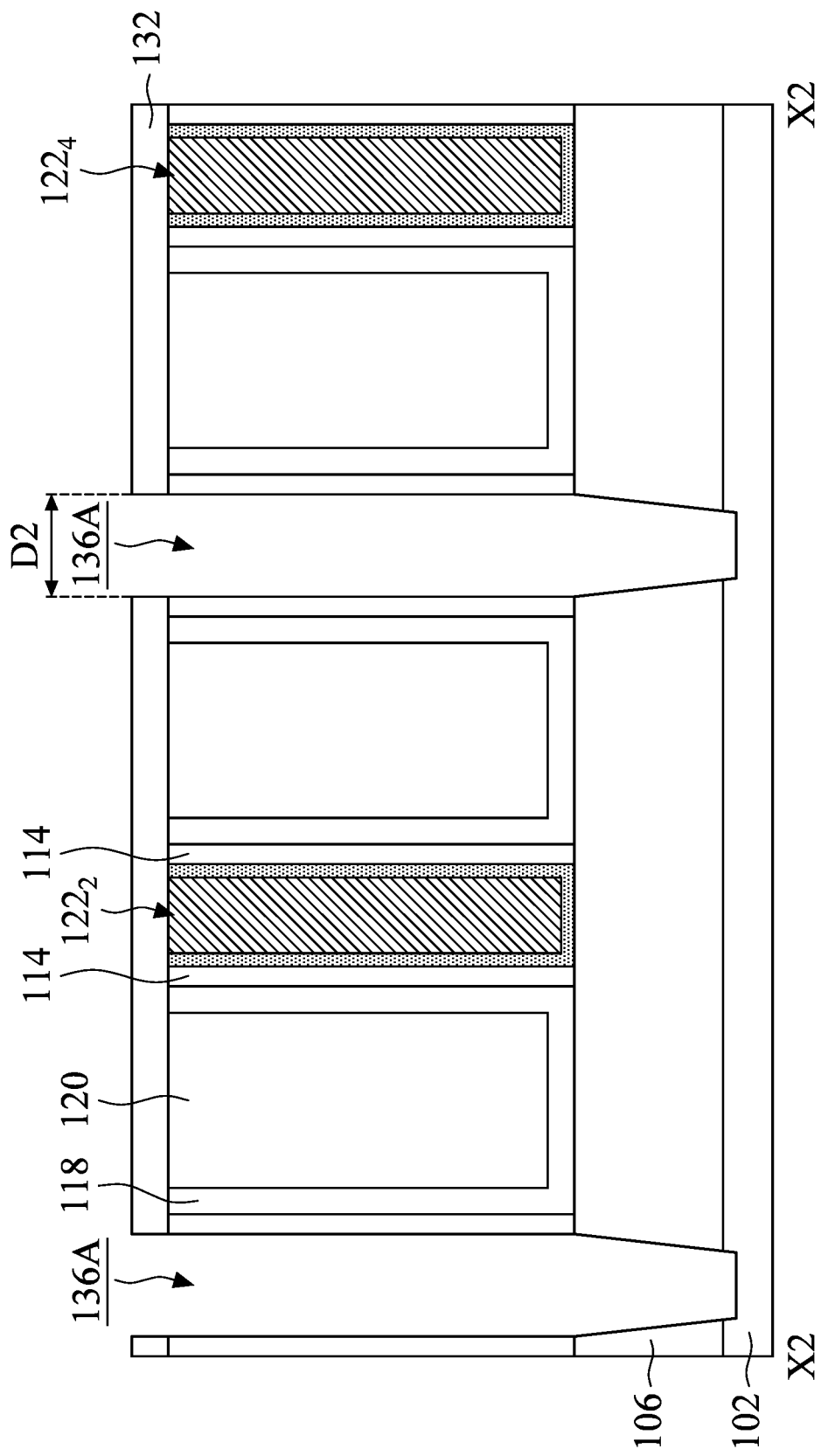
Figures 2, 2D, 3:
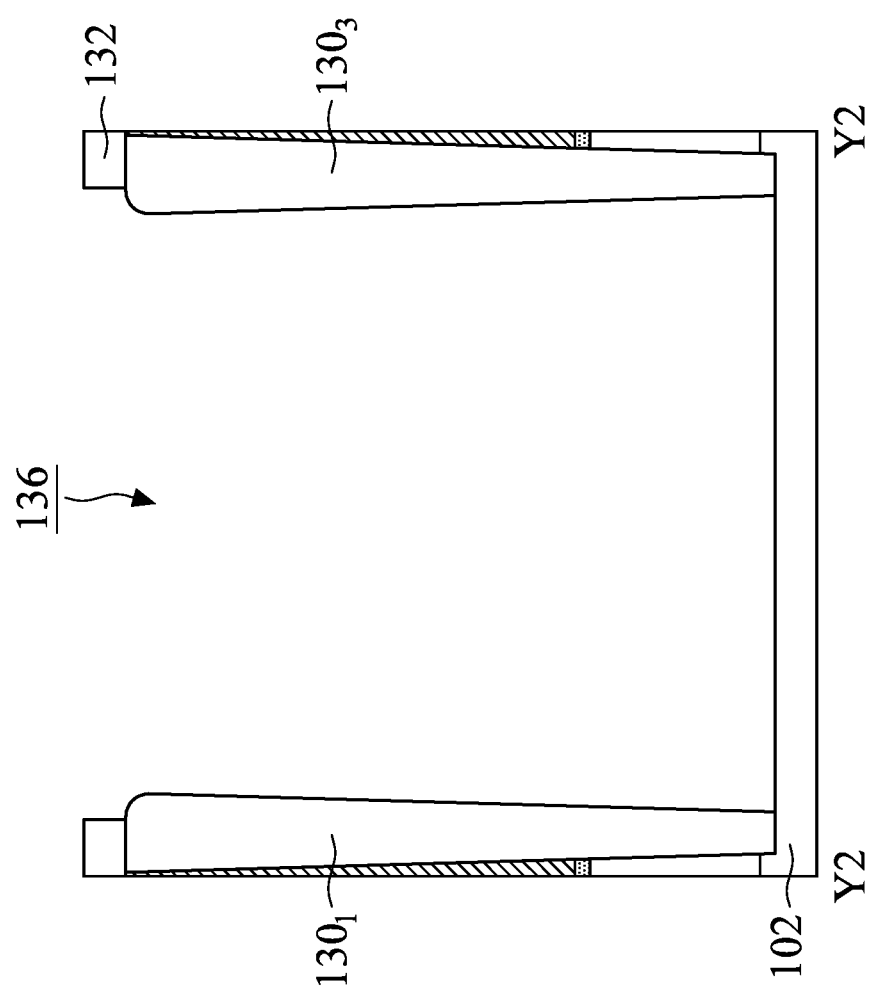

FIGS. 2D through 2D-3 illustrate a semiconductor structure 100 after an etching process, in accordance with some embodiments. FIGS. 2D-1, 2D-2 and 2D-3 are cross-sectional views of the semiconductor structure 100 taken along line X1-X1, line X2-X2 and line Y2-Y2 of FIG. 2D, respectively.

A cutting process is performed on the final gate stack $122_1$ and $122_3$, the active regions 104 and the isolation structure 106, as shown in FIGS. 2D through 2D-2, in accordance with some embodiments. The cutting process includes etching portions of the gate cutting structures $130_{1-3}$, the final gate stack $122_1$ and $122_3$, the active regions 104 and the isolation structure 106 that are directly below the openings 134, thereby forming cutting trenches 136, in accordance with some embodiments. The cutting trenches 136 extend into the substrate 102 and have bottom surfaces lower than the bottom surface of the isolation structure 106, in accordance with some embodiments. The etching processes may include dry etching such as reactive ion etch (RIE), neutral beam etch (NBE), inductive coupled plasma (ICP) etch, capacitively coupled plasma (CCP) etch, another suitable method, or a combination thereof.

The etching process is performed in a non-self-aligned manner, and thus the patterns of the cutting trenches 136 are not the same as the patterns of the openings 134, in accordance with some embodiments. The active regions 104 and the isolation structure 106 provide surfaces with different characteristics for depositing the gate dielectric layer 126, and thus the portion of the gate dielectric layer 126 formed on the active regions 104 may have different lattice characteristics (e.g., defect density, lattice constant, etc.) than the portion of the gate dielectric layer 126 formed on the isolation structure 106, and thus the two portions may have different etching selectivity from each other, in accordance with some embodiments. The difference in the etching selectivity between the two portions may be enlarged by adjusting the parameters (e.g., flow rates of etching precursors, RF power, bias voltage, pressure, temperature, etc.) of the etching process. As a result, the etching rate (or the etching amount) of the portion of the gate dielectric layer 126 directly above the active regions 104 is much lower than the etching rate (or the etching amount) of the portion of the gate dielectric layer 126 directly above the isolation structure 106, in accordance with some embodiments.

When the etching process is completed, the portion of the gate dielectric layer 126 directly above the isolation structure 106 is mostly removed while the portion of the gate dielectric layer 126 directly above the active regions 104 is left remained and referred to as protection features 138, as shown in FIGS. 2D and 2D-1, in accordance with some embodiments. In some embodiments, the protection features 138 are configured to protect the source/drain features 116 from being damaged in the etching process for forming the cutting trenches 136, in accordance with some embodiments. The cutting trenches 136 can be formed with great depths (e.g., extending into the substrate 102) without damaging the source/drain features 116. Therefore, the performance of the resulting semiconductor devices may be improved, e.g., lower sheet resistance (Rs). In addition, the critical dimension (CD) and/or overlay window of the photolithography process for forming the cutting trenches 136 may be relaxed, thereby reducing the difficulty of manufacturing the semiconductor devices.

The protection features 138 remain on, and partially cover, the sidewalls of the gate spacer layers 114, in accordance with some embodiments. In some embodiments, the protection features 138 have a maximum dimension D1 in the Y direction. In some embodiments, the dimension D1 is in a range from about 0.5 nm to about 5 nm. The protection features 138 have tailing portions 138T which extend over the isolation structure 106 by a distance, in accordance with some embodiments. In the Y direction, the protection features 138 are greater than active regions 104, and smaller than the gate spacer layers 114, in accordance with some embodiments.

In addition, in the etching process, the portions of the gate cutting structures $130_1$ and $130_3$ exposed from the openings 134 are slightly etched while the portions of the gate cutting structure $130_2$ exposed from the openings 134 are substantially removed, in accordance with some embodiments.

In some embodiments, the cutting trenches 136 extend in the Y direction. That is, the cutting trenches 136 has longitudinal axes parallel to the Y direction, in accordance with some embodiments. That is, the dimensions (lengths) of the cutting trenches 136 in the Y direction are greater than the dimensions (widths) of the cutting trenches 136 in the X direction. The cutting trenches 136 include wider portions 136A extending into the isolation structure 106 and narrower portions 136B extending into the active regions 104, as shown in FIGS. 2D through 2D-2, in accordance with some embodiments. The sidewalls of the gate spacer layers 114 are exposed from the wider portions 136A of the cutting trenches 136, in accordance with some embodiments. In some embodiments, the wider portions 136A and the narrower portions 136B are arranged alternately in the Y direction. In some embodiments, the wider portions 136A have a maximum dimension D2 in the X direction. In some embodiments, the dimension D2 is in a range from about 10 nm to about 50 nm. In some embodiments, the narrower portions 136B is narrower than the wider portions 136A and have a dimension D3 in the X direction. In some embodiments, the dimension D3 is in a range from about 8 nm to about 48 nm. In some embodiments, the ratio (D3/D2) of the dimension D2 to the dimension D3 is in a range from about 0.6 to about 0.9. In some embodiments, if the ratio (D3/D2) is too great, the source/drain features 116 may be not sufficiently protected.

The wider portions 136A include transition parts which are located between the tailing portions 138T of the opposite protection features 138, in accordance with some embodiments. The transition parts are connected to the narrower portions 136B, and are tapered (e.g., progressively narrowed) toward the narrower portions 136B, in accordance with some embodiments. It should be noted that the tapering may be continuous, based on such mathematical functions as linear, sinuous, parabolic, or elliptical functions.

Figure 2E:
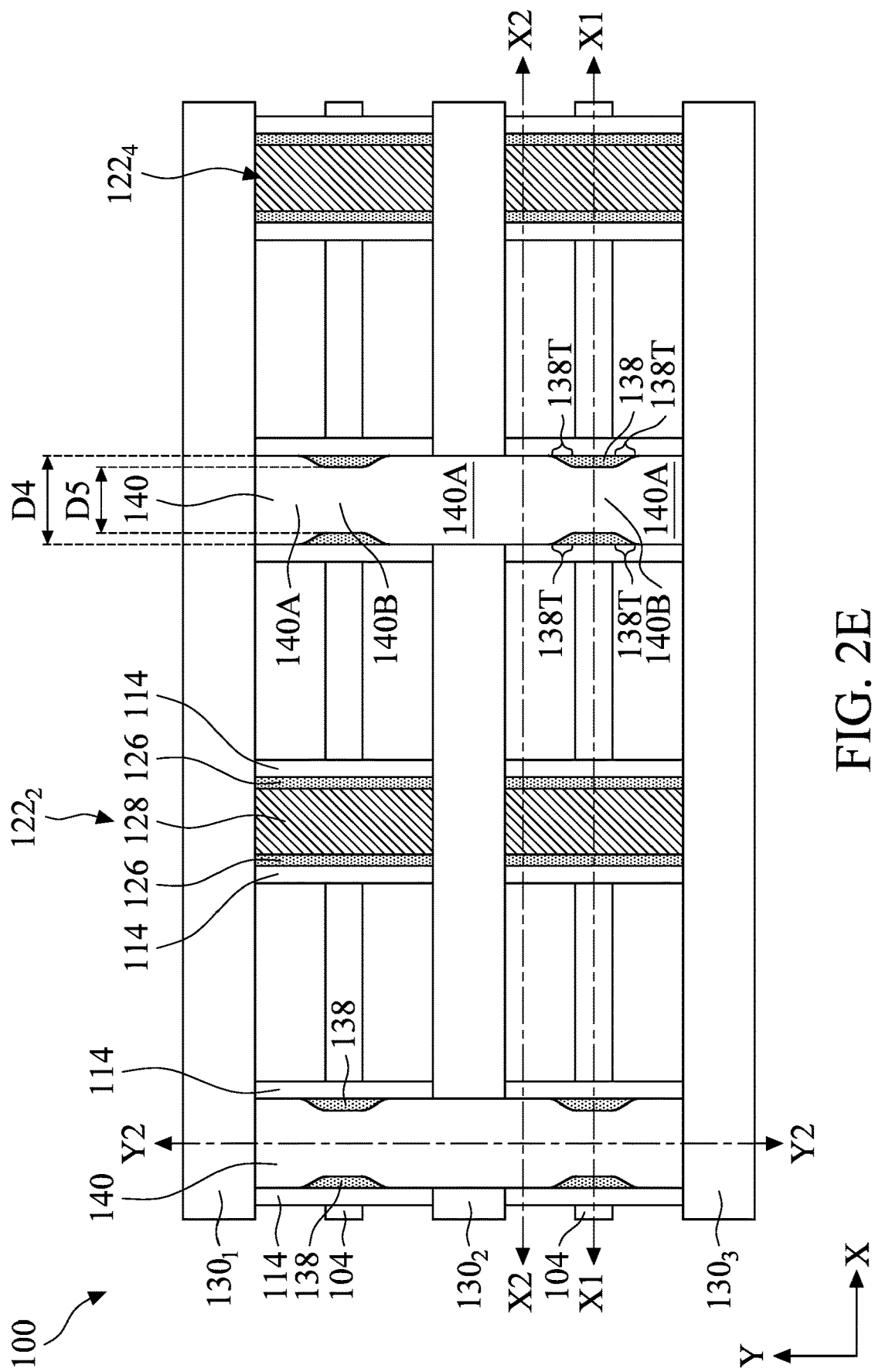
Figures 1, 2E:
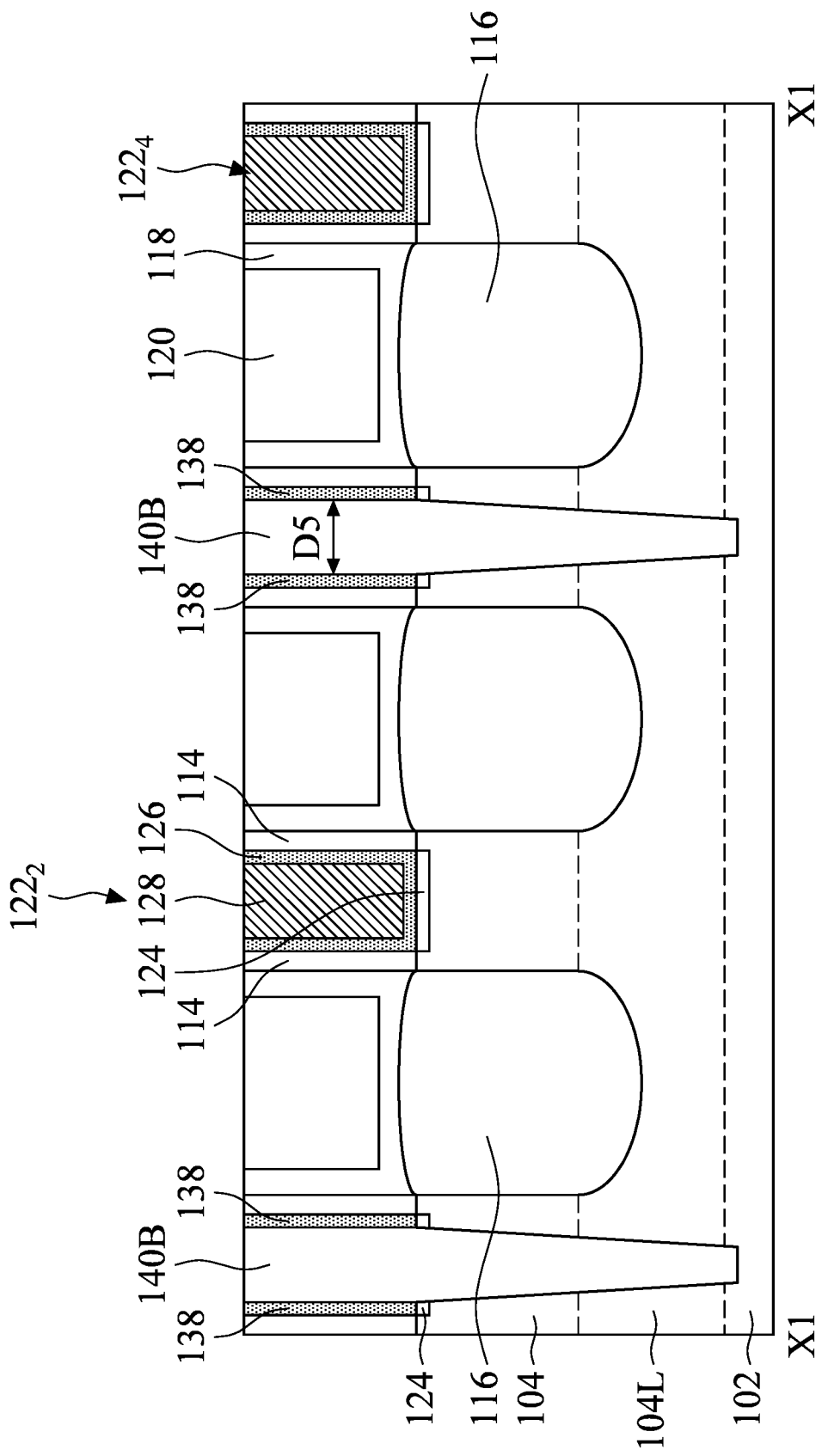
Figures 2, 2E:
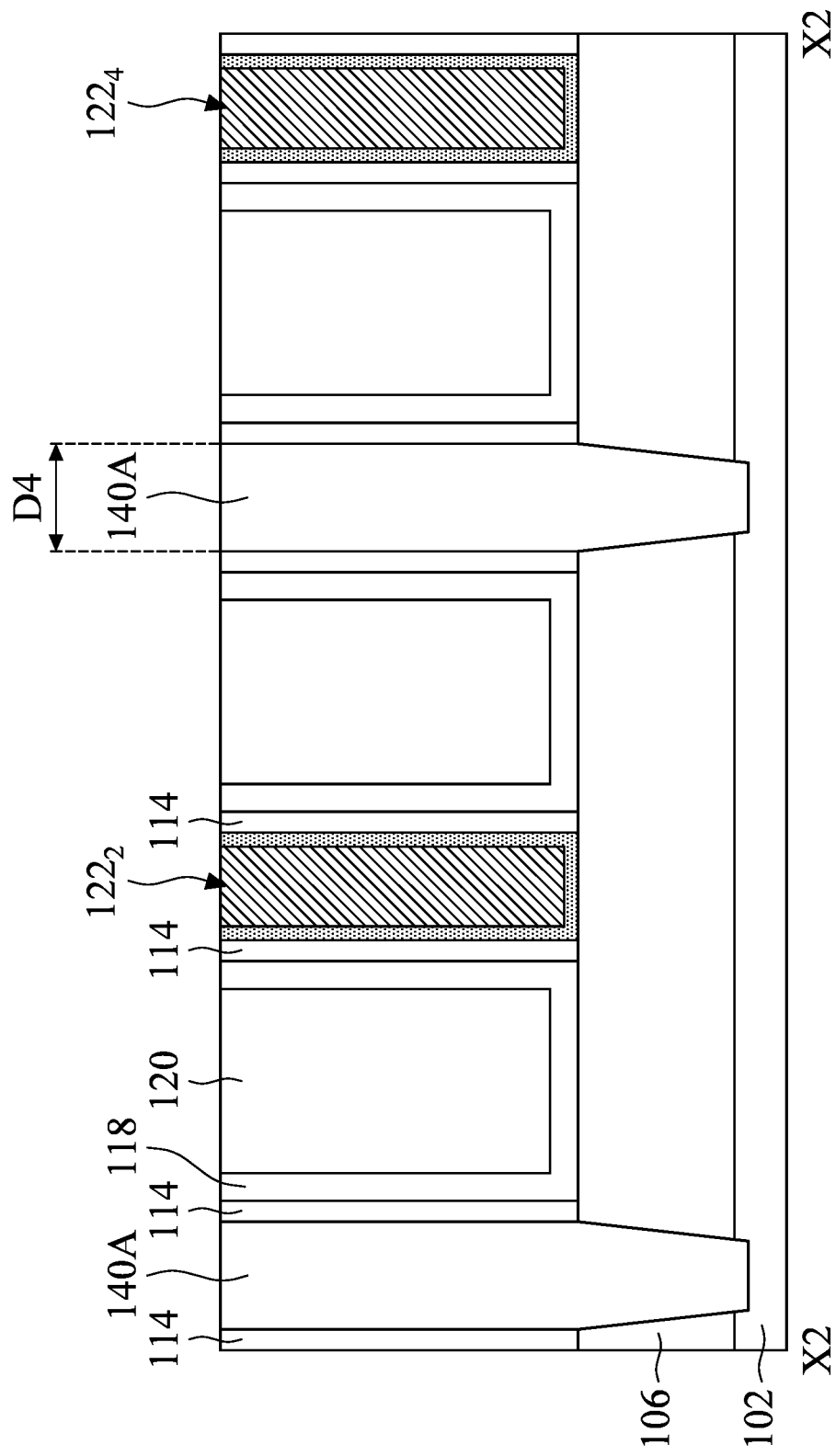
Figures 2, 2E, 3:
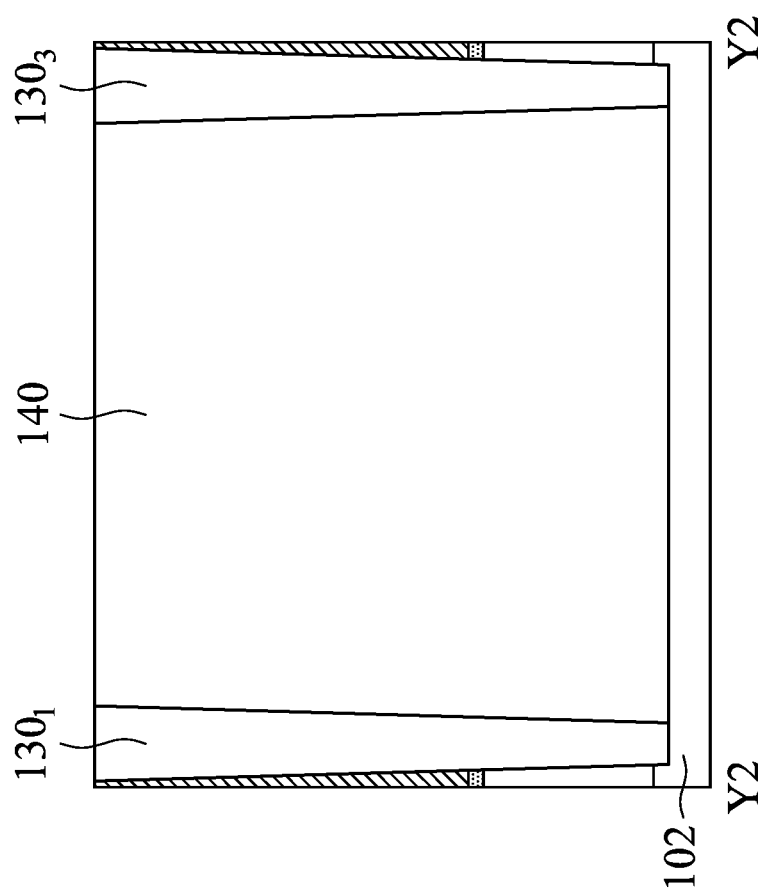

FIGS. 2E through 2E-3 illustrate a semiconductor structure 100 after the formation of fin cutting structures 140, in accordance with some embodiments. FIGS. 2E-1, 2E-2 and 2E-3 are cross-sectional views of the semiconductor structure 100 taken along line X1-X1, line X2-X2 and line Y2-Y2 of FIG. 2E, respectively.

Fin cutting structures 140 are formed in the cutting trenches 136, as shown in FIGS. 2E through 2E-2, in accordance with some embodiments. In some embodiments, the fin cutting structures 140 are configured to prevent leakage between functional circuits in neighboring cells. The fin cutting structures 140 may be also referred to as cut metal on an oxide definition edge (CMODE) pattern. The fin cutting structures 140 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), or a combination thereof.

The formation of the fin cutting structures 140 includes depositing a dielectric material for the fin cutting structures 140 to overfill the cutting trenches 136, in accordance with some embodiments. In some embodiments, the deposition process is ALD, CVD (such as LPCVD, PECVD, HDP-CVD, or HARP), another suitable technique, or a combination thereof. A planarization process is then performed on the semiconductor structure 100 to remove the dielectric material formed above the metal gate electrode layer 128, in accordance with some embodiments. The planarization may be CMP, an etching back process, or a combination thereof. In some embodiments, the patterned mask layer 132 is also removed. After the planarization process, the top surfaces of the fin cutting structures 140, the gate cutting structures 130, the metal gate electrode layer 128, the gate spacer layers 114, the contact etching stop layer 118 and the interlayer dielectric layer 120 are substantially coplanar, in accordance with some embodiments.

In some embodiments, the fin cutting structures 140 extend in the Y direction. That is, the fin cutting structures 140 has longitudinal axes parallel to the Y direction, in accordance with some embodiments. That is, the dimensions (lengths) of the fin cutting structures 140 in the Y direction are greater than the dimensions (widths) of the fin cutting structures 140 in the X direction. The fin cutting structures 140 includes wider portions 140A extending into the isolation structure 106 and narrower portions 140B extending into the active regions 104, as shown in FIGS. 2E through 2E-2, in accordance with some embodiments. The sidewalls of the gate spacer layers 114 are in direct contact with the wider portions 140A of the fin cutting structures 140, in accordance with some embodiments. The sidewalls of the gate spacer layers 114 are separated from the narrower portions 140B of the fin cutting structures 140 by the protection features 138, in accordance with some embodiments. In some embodiments, the wider portions 140A and the narrower portions 140B are arranged alternately in the Y direction.

In some embodiments, the wider portions 140A have a maximum dimension D4 in the X direction. In some embodiments, the dimension D4 is in a range from about 10 nm to about 50 nm. In some embodiments, the narrower portions 140B is narrower than the wider portions 140A and have a dimension D5 in the X direction. In some embodiments, the dimension D5 is in a range from about 8 nm to about 48 nm. In some embodiments, the ratio (D5/D4) of the dimension D5 to the dimension D4 is in a range from 0.6 to about 0.9. In some embodiments, if the ratio (D5/D4) is too great, the source/drain features 116 may be not sufficiently protect.

The wider portions 140A includes transition parts which are located between the tailing portions 138T of the opposite protection features 138, connected to the narrower portions 140B, and are tapered (e.g., progressively narrowed) toward the narrower portions 140B, in accordance with some embodiments. It should be noted that the tapering may be continuous, based on such mathematical functions as linear, sinuous, parabolic, or elliptical functions.

Figure 2F:
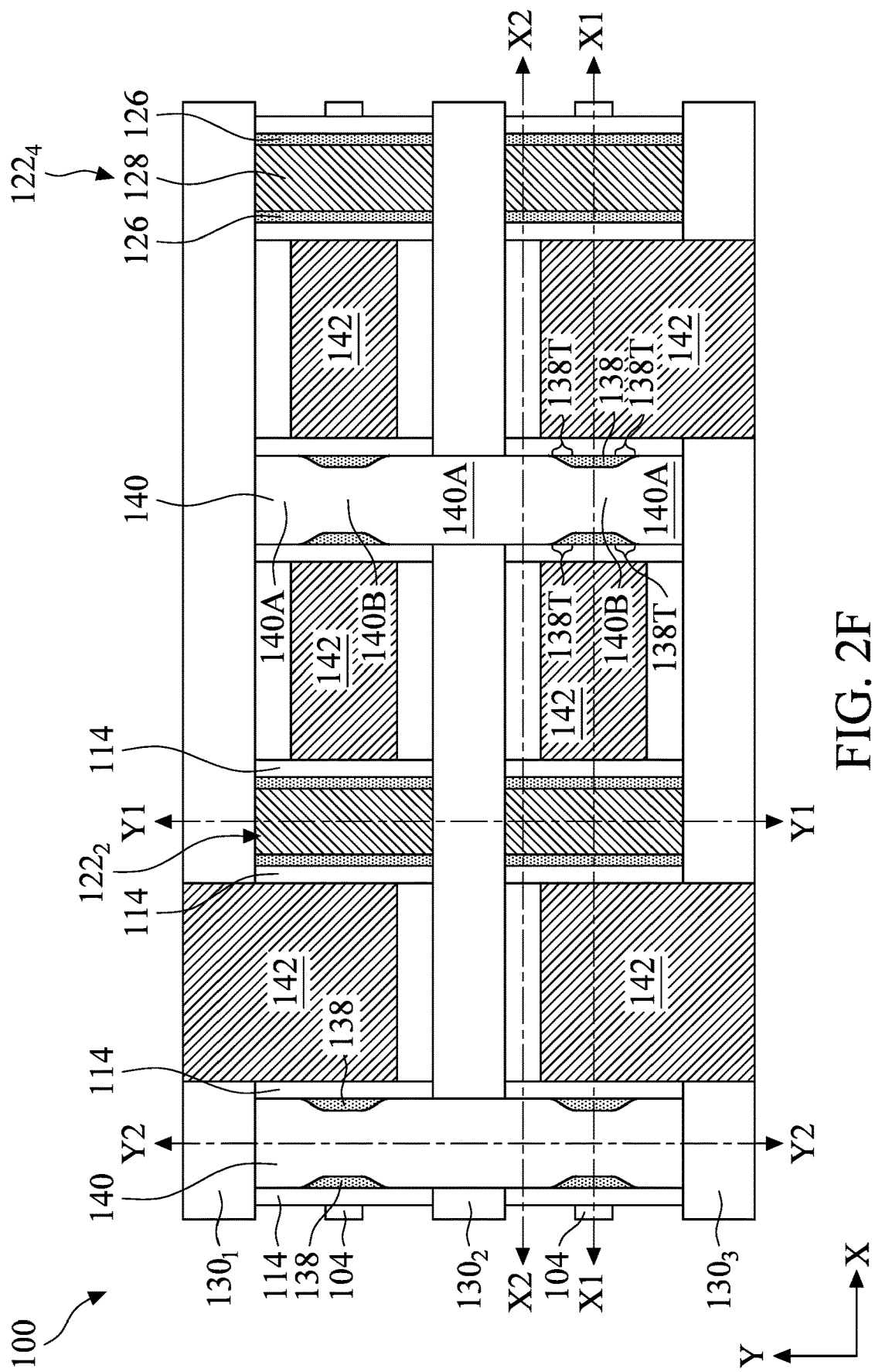
Figures 1, 2F:
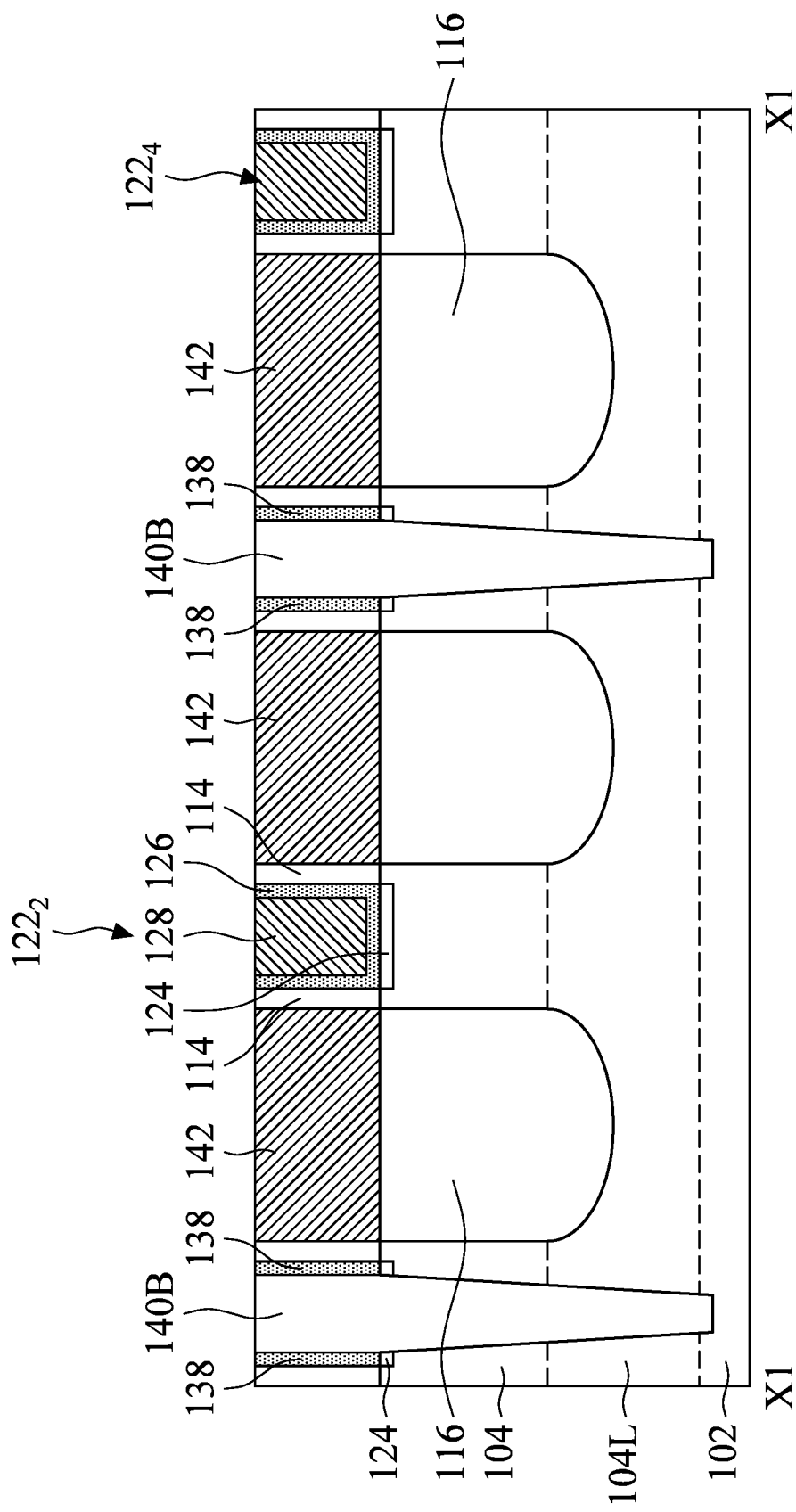
Figures 2, 2F:
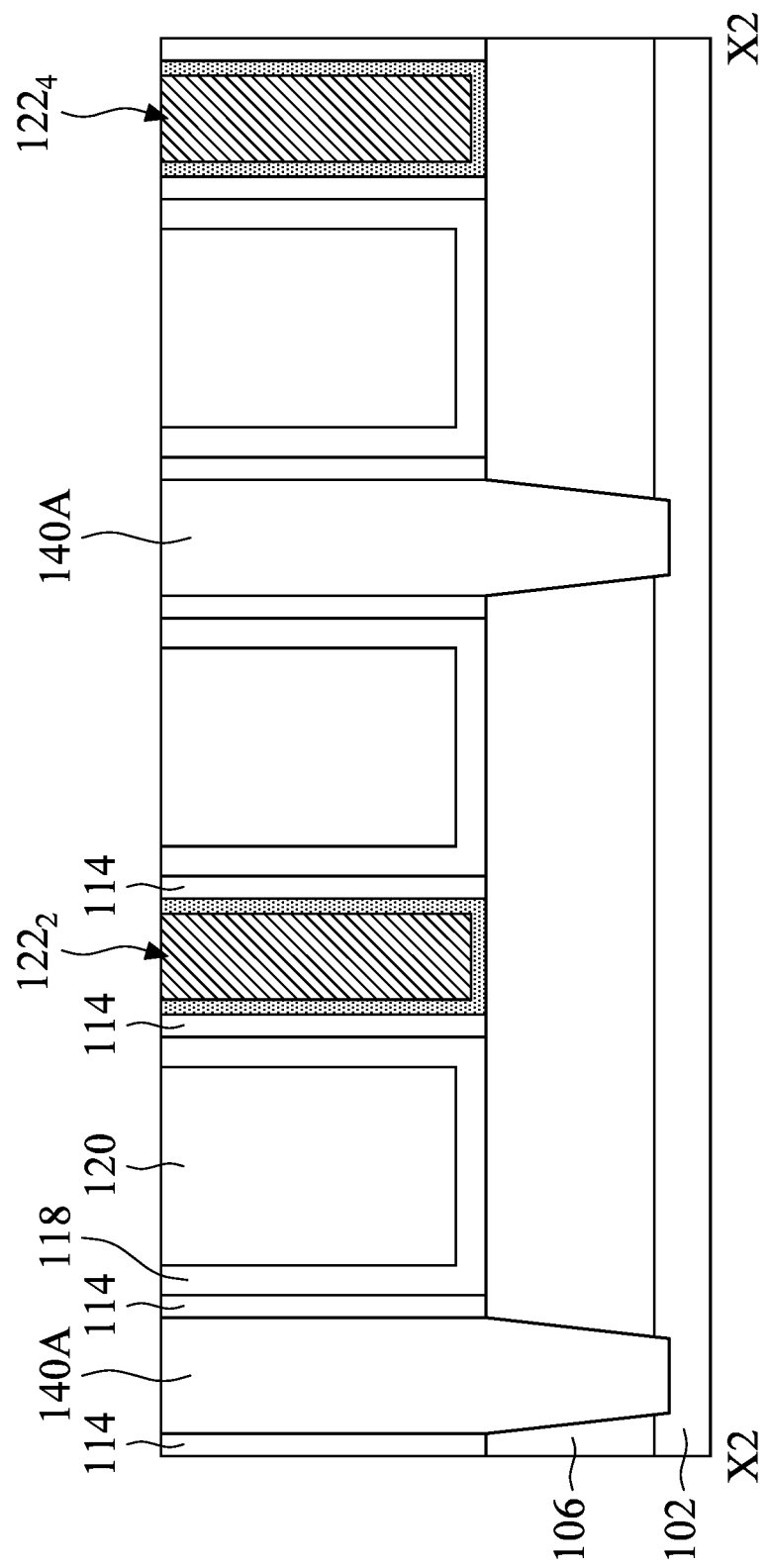
Figures 2, 2F, 3:
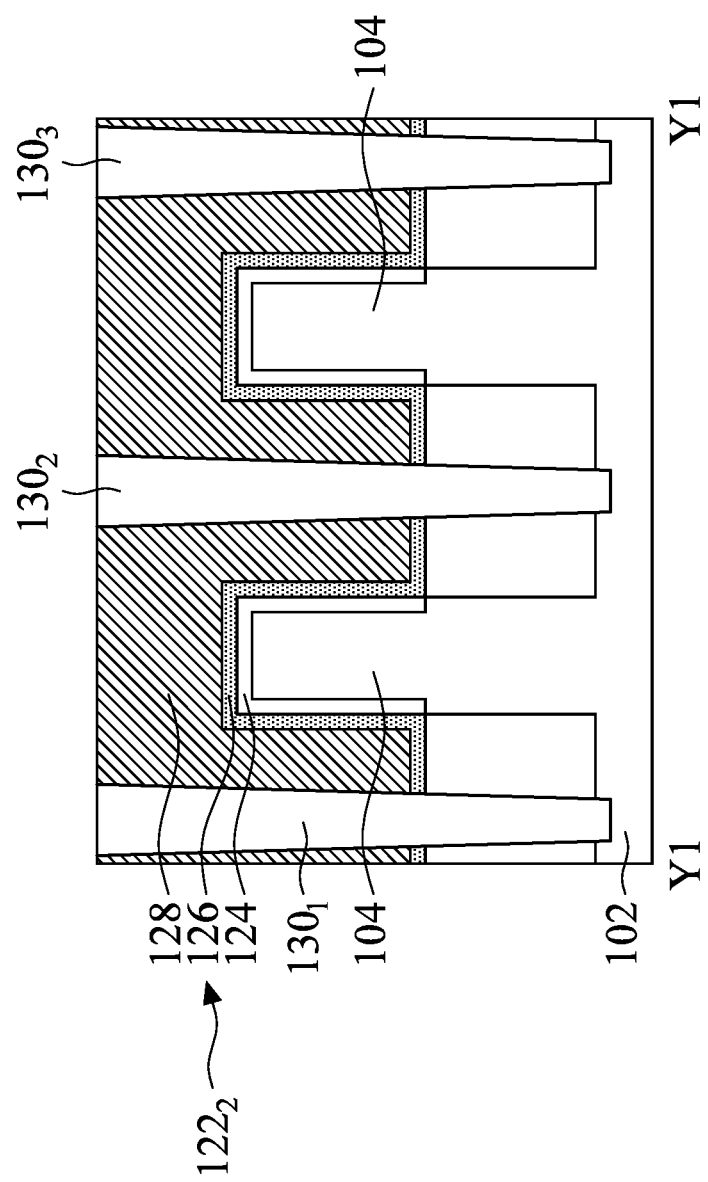
Figures 2, 2F, 3, 4:
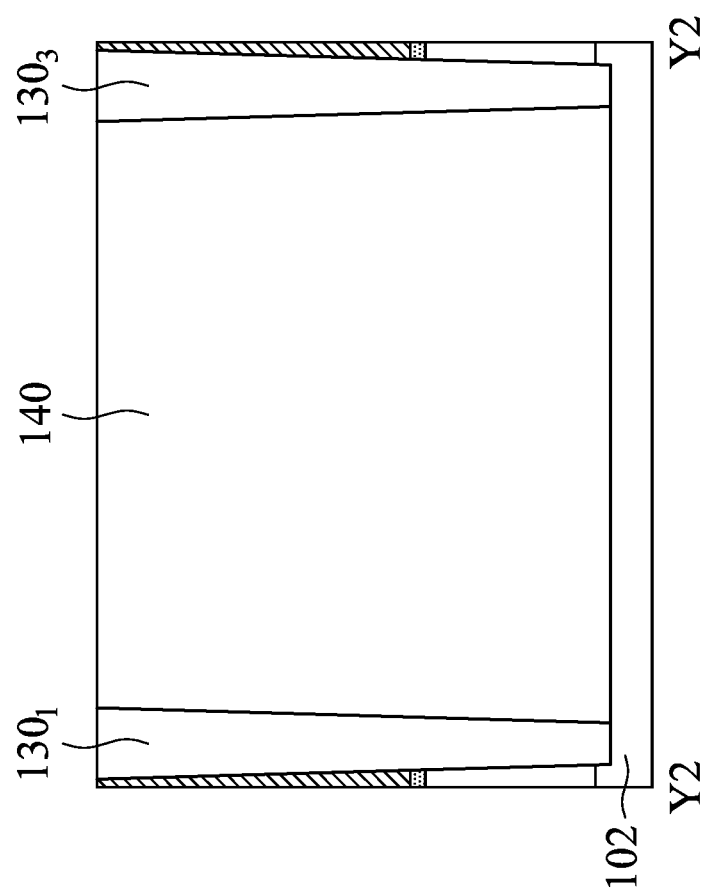

FIGS. 2F through 2F-3 illustrate a semiconductor structure 100 after the formation of contact plugs 142, in accordance with some embodiments. FIGS. 2F-1, 2F-2, 2F-3 and 2F-4 are cross-sectional views of the semiconductor structure 100 taken along line X1-X1, line X2-X2, line Y1-Y1 and line Y2-Y2 of FIG. 2F, respectively.

Contact plugs 142 are formed in and/or through the interlayer dielectric layer 120 and the contact etching stop layer 118 and land on the source/drain features 116, as shown in FIGS. 2F and 2F-1, in accordance with some embodiments. The contact plugs 142 are electrically connected to the source/drain features 116, in accordance with some embodiments. In some embodiments, the formation of the contact plugs 142 includes patterning the interlayer dielectric layer 120 and the contact etching stop layer 118 to form contact openings (where the contact plugs 142 are to be formed) using photolithography and etching processes until the source/drain features 116 are exposed. The portions of the contact etching stop layer 118 formed along the gate spacer layers 120 are entirely removed, thereby exposing the sidewalls of the gate spacer layers 120.

In some embodiments, the formation of the contact plugs 142 further includes forming a silicide layer (such as WSi, NiSi, TiSi and/or CoSi) on the exposed source/drain features 116, depositing one or more conductive materials over the silicide layer to fill the contact openings, and planarizing the one or more conductive materials until the top surfaces of the interlayer dielectric layer 120 and the metal gate electrode layer 128 are exposed using, for example, CMP. In some embodiments, the conductive material is deposited using CVD, PVD, e-beam evaporation, ALD, electroplating (ECP), electroless deposition (ELD), another suitable method, or a combination thereof. After the planarization process, the top surfaces of the contact plugs 142, the fin cutting structures 140, the gate cutting structures 130, the metal gate electrode layer 128, the gate spacer layers 114, the contact etching stop layer 118 and the interlayer dielectric layer 120 are substantially coplanar, in accordance with some embodiments.

The contact plugs 142 may have a multilayer structure including, for example, liner layers, glue layers, barrier layers, seed layers, metal bulk layers, another suitable layer, or a combination thereof. For example, a barrier layer (not shown) may optionally be deposited along the sidewalls and the bottom surfaces of the contact openings. The barrier layer is used to prevent the metal from the subsequently formed metal material from diffusing into the dielectric material (e.g., the interlayer dielectric layer 120, and the contact etching stop layer 118). The barrier layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A glue layer (not shown) may optionally be deposited along the sidewalls and the bottom surfaces of the contact openings, and on the barrier layer (if formed). The glue layer is used to improve adhesion between the subsequently formed metal material and the dielectric material (e.g., the interlayer dielectric layer 120 and the contact etching stop layer 118). The glue layer may be made of tantalum nitride (TaN), titanium (Ti), titanium nitride (TiN), another suitable material, or a combination thereof. A metal bulk layer is then deposited on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

FIG. 2F-5 is an enlarged view of FIG. 2F-1 to illustrate more detail of the fin cutting structure 140 and neighboring components, in accordance with some embodiments of the disclosure. The wider portion 140A of the fin cutting structure 140 has a sidewall 140S1 interfaced with the gate spacer layers 114, and the narrower portion 140B of the fin cutting structure 140 has a sidewall 140S2 interfaced with the protection features 138, in accordance with some embodiments. The sidewalls 140S1 and 140S2 extend substantially in the Y direction, in accordance with some embodiments. In some embodiments, the sidewall 140S1 and 140S2 are linear. The sidewalls 140S2 are indented, by a distance (e.g., substantially equal to the thickness of the protection feature 138) in the X direction, from the sidewalls 140S1, in accordance with some embodiments. The fin cutting structure 140 has connecting sidewalls 140S3 that are interfaced with the tailing portions 138Y and connect the sidewalls 140S1 to the sidewalls 140S2, in accordance with some embodiments. In some embodiments, the connecting sidewalls 140S3 are curved. In alternative embodiments, the connecting sidewalls 140S3 are linear.

Although the embodiments described above are used in the semiconductor structure with FinFET design, the concept of the embodiments may be also used in a semiconductor device structure with another applicable design, e.g., planar FETs, dual-gate FETs, tri-gate FETGAA FETs (e.g., nanostructure FET (such as gate-all-around (GAA) FETs), forksheet FETs, ribbon FETs, multi-bridge channel (MBC) FETs, etc.).

FIG. 3 is a perspective view of a semiconductor structure 200 with GAA design, in accordance with some embodiments of the disclosure.

The GAA transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The semiconductor structure 200 includes a substrate 102 and a fin structure 204 over the substrate 102, as shown in FIG. 3, in accordance with some embodiments. The fin structure 204 is the active region of the semiconductor structure 200, in accordance with some embodiments. The fin structure 204 includes a lower fin element 204L formed from the substrate 102, in accordance with some embodiments. The lower fin elements 204L are surrounded by an isolation structure 106, in accordance with some embodiments. The fin structure 204 further includes an upper fin element formed from an epitaxial stack including alternating first semiconductor layers 206 and second semiconductor layer 208, in accordance with some embodiments. The second semiconductor layers 208 will form nanostructures (e.g., nanowires or nanosheets) and serve as the channel for the resulting semiconductor devices, in accordance with some embodiments.

The fin structure 204 extends in the X direction, in accordance with some embodiments. The fin structure 204 is defined as several channel regions and several source/drain regions, where the channel regions and the source/drain regions are alternately arranged, in accordance with some embodiments. Gate structures 112 are formed with longitudinal axes parallel to the Y direction and extending across and/or surrounding the channel regions of the fin structure 204, in accordance with some embodiments. The source/drain regions of the fin structure 204 are exposed from the gate structures 112, in accordance with some embodiments.

FIGS. 4A, 4B, 4C and 4D are plan views illustrating the formation of a semiconductor structure 200 at various intermediate stages, in accordance with some embodiments of the disclosure.

Figure 4A:
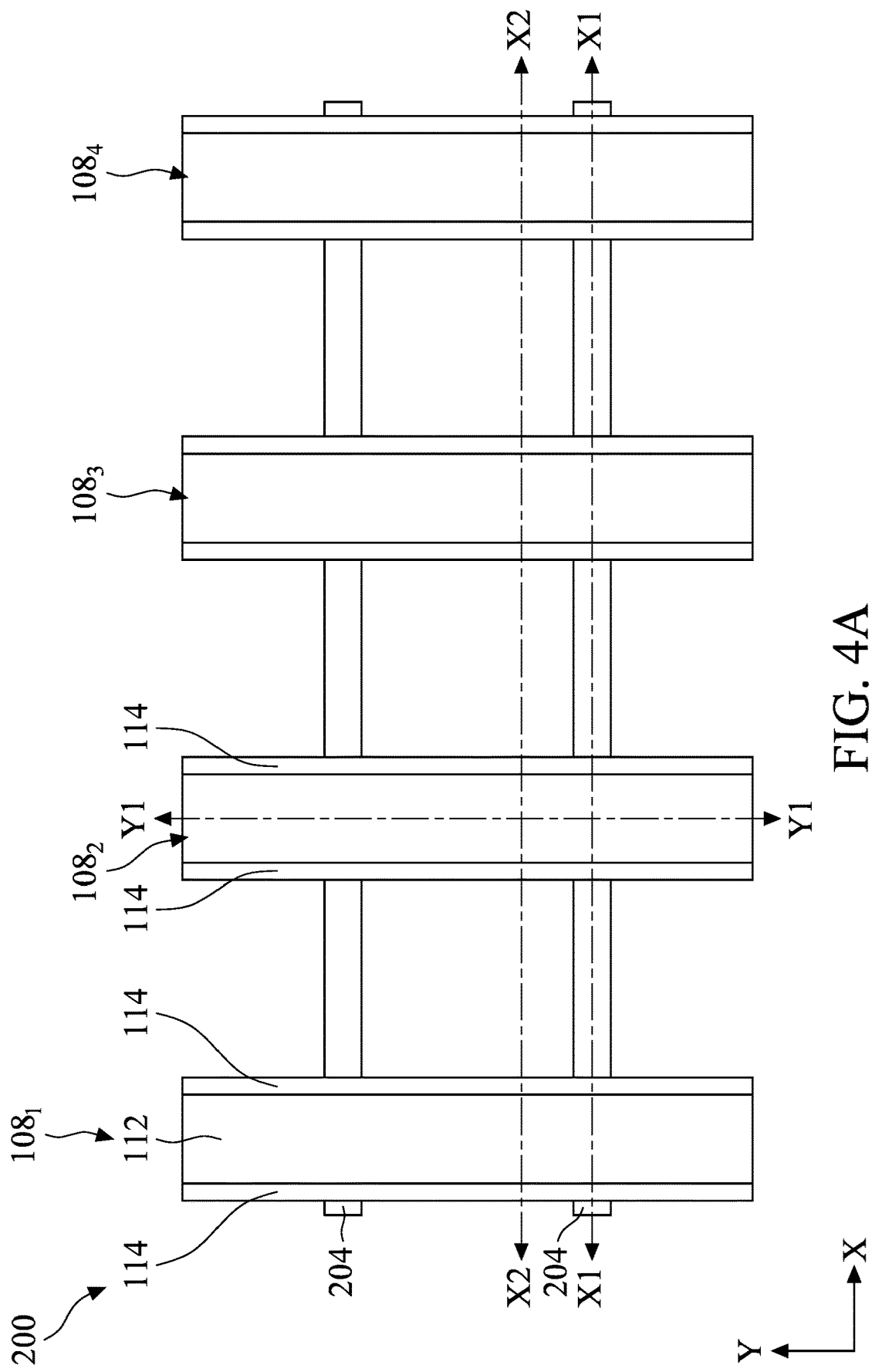
FIGS. 4A, 4B, 4C and 4D are plan views illustrating the formation of a semiconductor structure at various intermediate stages, in accordance with some embodiments of the disclosure.
Figures 1, 4A:
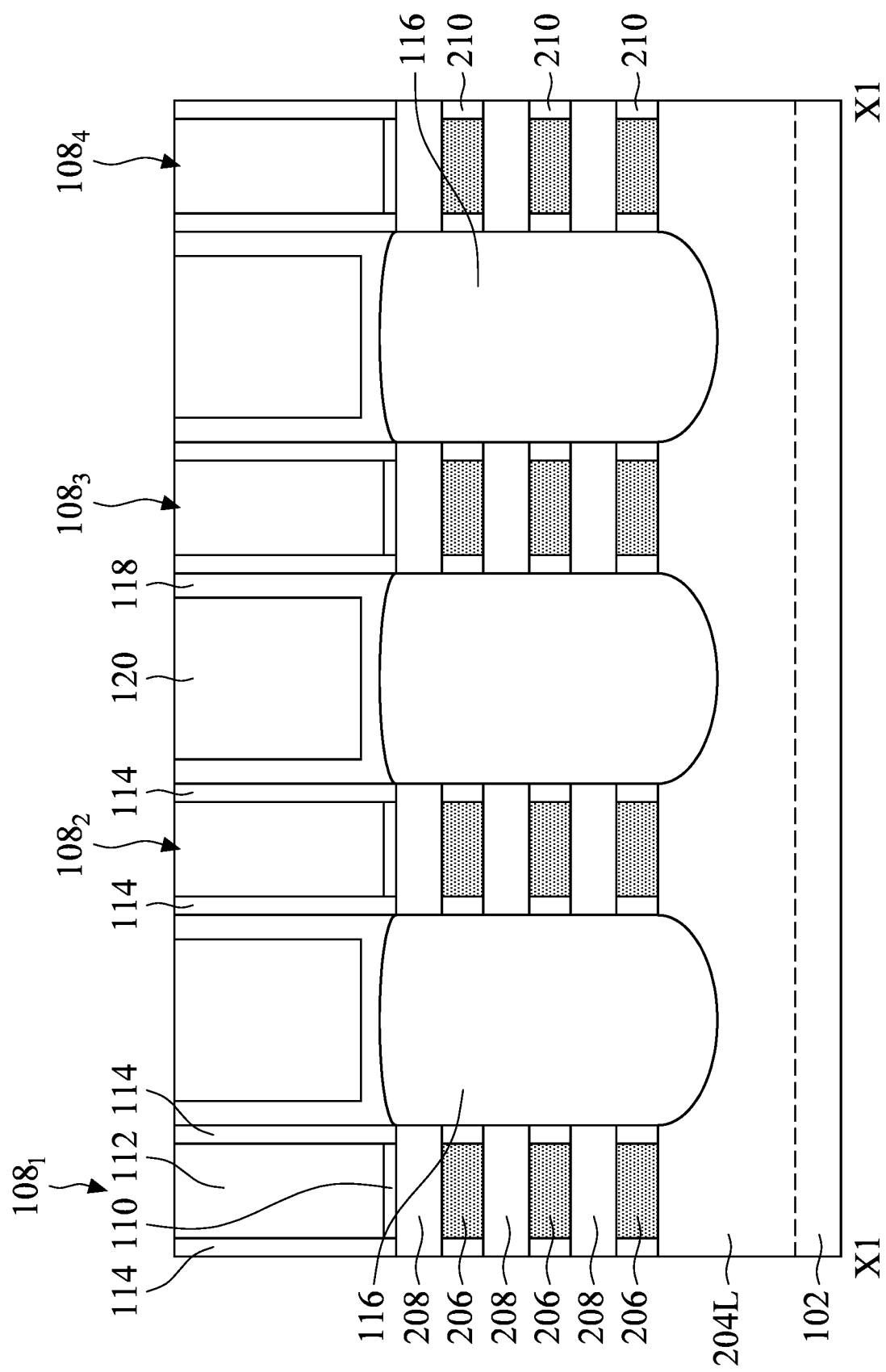
Figures 2, 4A:
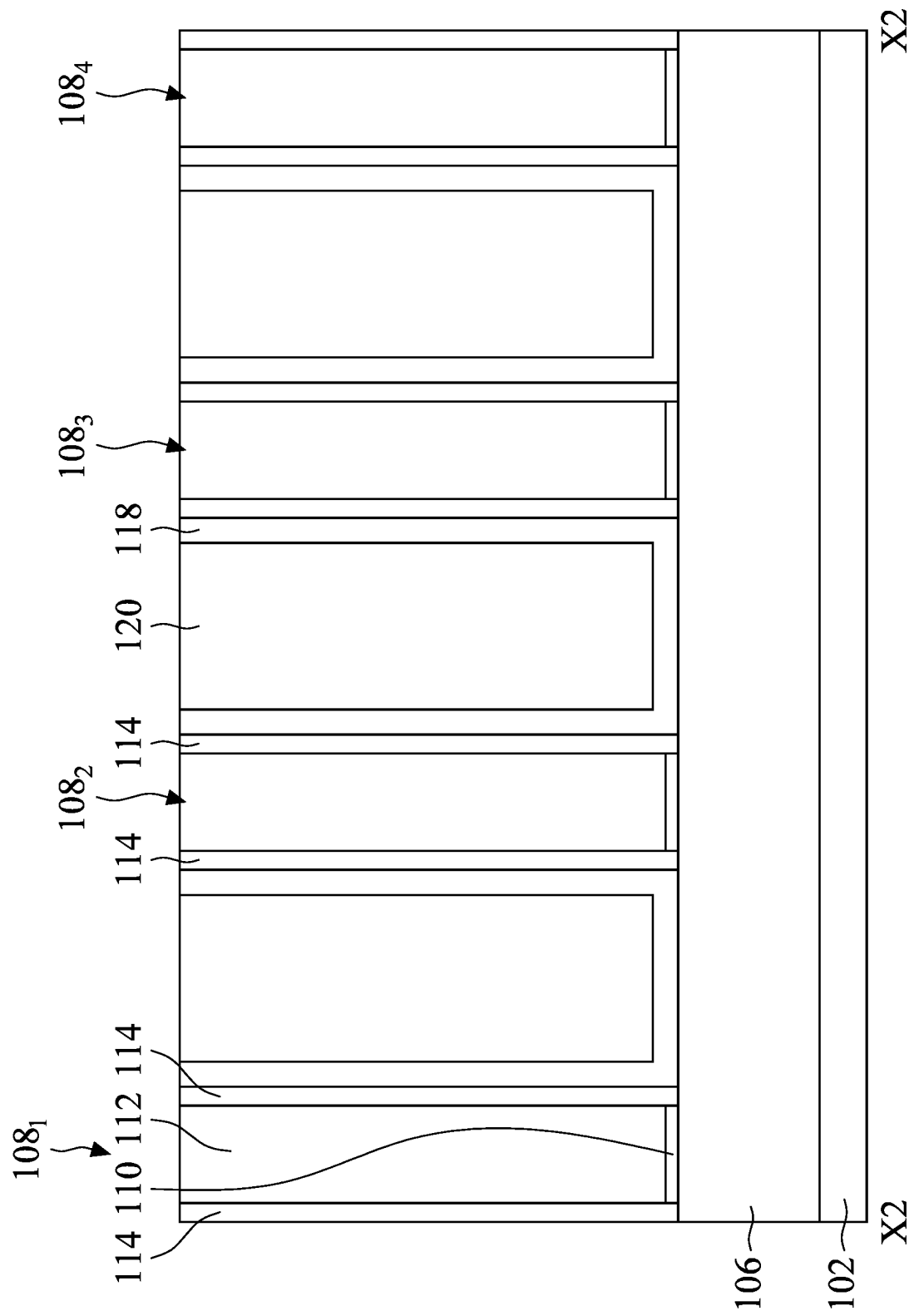
Figures 3, 4A:
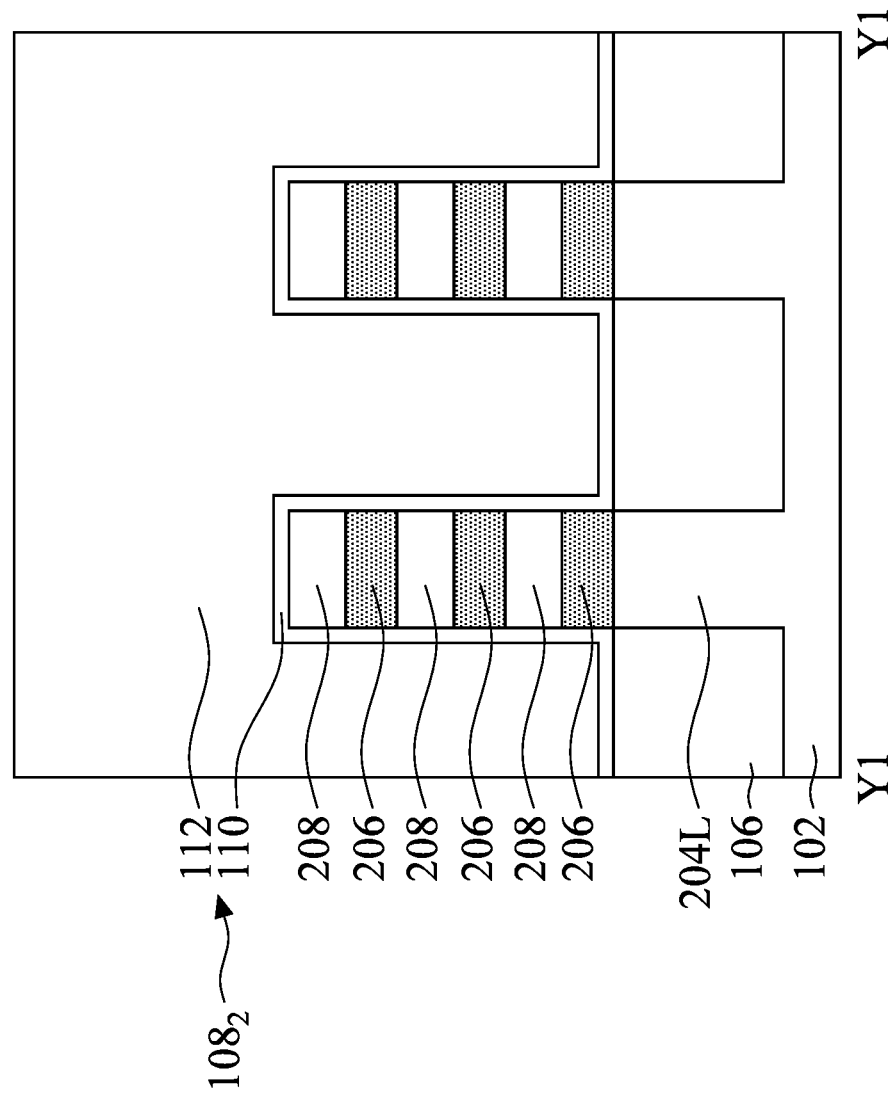

FIGS. 4A through 4A-3 illustrate a semiconductor structure 200 after the formation of active regions 204, an isolation structure 106, dummy gate structures 108, gate spacer layers 114, inner spacer layers 210, source/drain features 116, contact etching stop layer 118, and an interlayer dielectric layer 120, in accordance with some embodiments. FIGS. 4A-1, 4A-2 and 4A-3 are cross-sectional views of the semiconductor structure 200 taken along line X1-X1, line X2-X2 and line Y1-Y1 of FIG. 4A, respectively.

The semiconductor structure 200 includes a substrate 102, active regions 204 and an isolation structure 106 over the substrate 102, and dummy gate structures 108 (including $108_{1-4}$) over the active regions 204 and the isolation structure 106, as shown in FIGS. 4A through 4A-3, in accordance with some embodiments. The formation of the active regions 204 includes forming an epitaxial stack over the substrate 102 using an epitaxial growth process, in accordance with some embodiments. The epitaxial stack includes alternating first semiconductor layers 206 and second semiconductor layers 208, in accordance with some embodiments. The epitaxial growth process may be MBE, MOCVD, or VPE, or another suitable technique.

In some embodiments, the first semiconductor layers 206 are made of a first semiconductor material and the second semiconductor layers 208 are made of a second semiconductor material. The first semiconductor material for the first semiconductor layers 206 has a different lattice constant than the second semiconductor material for the second semiconductor layers 208, in accordance with some embodiments. In some embodiments, the first semiconductor material and the second semiconductor material have different oxidation rates and/or etching selectivity. In some embodiments, the first semiconductor layers 206 are made of SiGe, where the percentage of germanium (Ge) in the SiGe is in a range from about 20 atomic % to about 50 atomic %, and the second semiconductor layers 208 are made of pure or substantially pure silicon. In some embodiments, the first semiconductor layers 206 are $Si_{1-x}Ge_x$, where x is more than about 0.3, or Ge (x=1.0) and the second semiconductor layers 208 are Si or $Si_{1-y}Ge_y$, where y is less than about 0.4, and x>y.

The first semiconductor layers 206 are configured as sacrificial layers and will be removed to form gaps to accommodate gate materials, and the second semiconductor layers 208 will form nanostructures (e.g., nanowires or nanosheets) that laterally extend between source/drain features and serve as the channel layers for the resulting semiconductor devices (such as nanostructure transistors), in accordance with some embodiments.

The formation of the active regions 204 further includes patterning the epitaxial stack and underlying substrate 102 using photolithography and etching processes, thereby forming trenches and the active regions 204 protruding from between trenches, in accordance with some embodiments. The portion of substrate 102 protruding from between the trenches serves as the lower fin elements 204L of the active regions 204, in accordance with some embodiments. A remainder of the epitaxial stack (including the first semiconductor layers 206 and the second semiconductor layers 208) serves as the upper fin elements of the active regions 204, in accordance with some embodiments. In some embodiments, the active regions 204 are the fin structure 204 as shown in FIG. 3.

In some embodiments, the thickness of each of the first semiconductor layers 206 is in a range from about 6 nm to about 16 nm. In some embodiments, the thickness of each of the second semiconductor layers 208 is in a range from about 4 nm to about 8 nm. The thickness of the second semiconductor layers 208 may be greater than, equal to, or less than the first semiconductor layers 206, depending on the amount of gate materials to be filled in spaces where the first semiconductor layers 206 are removed. Although three first semiconductor layers 206 and three second semiconductor layers 208 are shown in FIGS. 4A-1 and 4A-3, the number is not limited to three, and can be two or four, and is less than 10.

An isolation structure 106 is formed to surround the lower fin elements 204L of the active regions 204, as shown in FIGS. 4A-2 and 4A-3, in accordance with some embodiments. Dummy gate structures 108 (including $108_1$-$108_4$) are formed across the active regions 204 and the isolation structure 106, as shown in FIGS. 4A through 4A-3, in accordance with some embodiments. Gate spacer layers 114 are formed along the opposite sidewalls of the dummy gate structures $108_{1-4}$, as shown in FIGS. 4A through 4A-2, in accordance with some embodiments. The formation of the isolation structure 106, the dummy gate structures 108 and the gate spacer layers 114 may be the same as or similar to the formation of the isolation structure 106, the dummy gate structures 108 and the gate spacer layers 114 described above in FIGS. 2A through 2A-3, in accordance with some embodiments.

Source/drain features 116 are formed in and/or over the source/drain regions of the active regions 204, as shown in FIGS. 4A-1 and 4A-2, in accordance with some embodiments. After the source/drain recesses are formed, an etching process is performed to laterally recess, from the source/drain recesses, the first semiconductor layers 206 of the active regions 204, thereby forming notches, and then inner spacer layers 210 are formed in the notches, as shown in FIG. 4A-1, in accordance with some embodiments. The inner spacer layers 210 are formed to abut the recessed side surfaces of the first semiconductor layers 206, in accordance with some embodiments. In some embodiments, the inner spacer layers 210 are located between adjacent second semiconductor layers 208 and between the lowermost second semiconductor layer 208 and the lower fin element 204L. In some embodiments, the inner spacer layers 210 extend directly below the gate spacer layers 114, in accordance with some embodiments.

The inner spacer layers 210 may avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 210 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 210 are made of low-k dielectric materials. For example, the dielectric constant (k) values of the inner spacer layers 210 may be lower than a k-value of silicon oxide (SiO), such as lower than 4.2, equal to or lower than about 3.9, such as in a range from about 3.5 to about 3.9.

In some embodiments, the inner spacer layers 210 are formed by depositing a dielectric material for the inner spacer layers 210 over the semiconductor structure 200 to fill the notches, and then etching back the dielectric material to remove the dielectric material outside the notches. Portions of the dielectric material left in the notches serve as the inner spacer layers 210, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Afterward, source/drain features 116 are grown in the source/drain recesses on the exposed surfaces of the lower fin elements 204L, as shown in FIG. 4A-1, in accordance with some embodiments. A contact etching stop layer 118 is formed over the semiconductor structure 200 to cover the source/drain features 116, as shown in FIGS. 4A-1 and 4A-2, in accordance with some embodiments. An interlayer dielectric layer 120 is formed over the contact etching stop layer 118, as shown in FIGS. 4A-1 and 4A-2, in accordance with some embodiments. The formation of the source/drain features 116, the contact etching stop layer 118 and the interlayer dielectric layer 120 may be the same as or similar to the formation of the source/drain features 116, the contact etching stop layer 118 and the interlayer dielectric layer 120 described above in FIGS. 2A through 2A-3, in accordance with some embodiments.

Figure 4B:
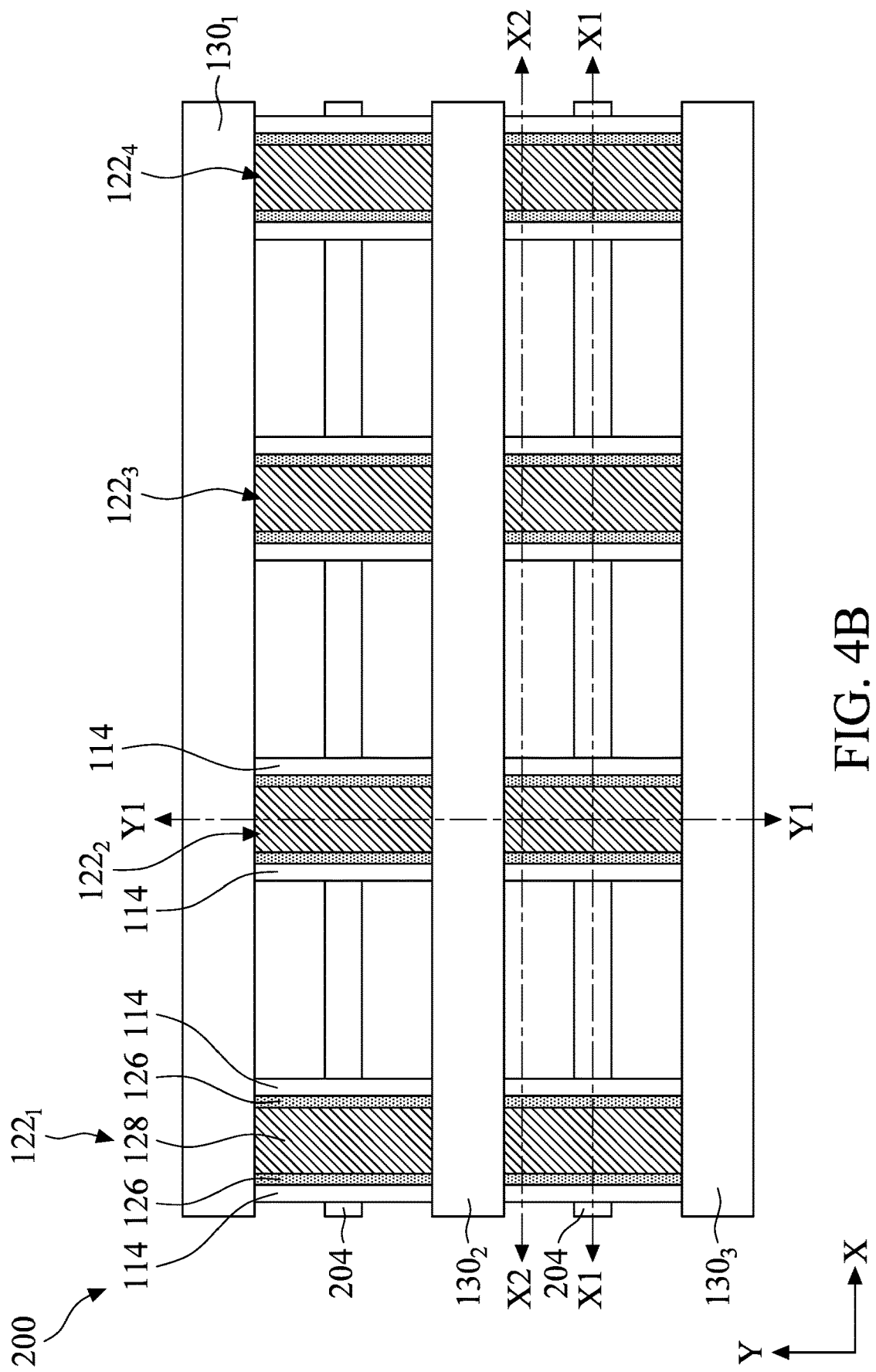
Figures 1, 4B:
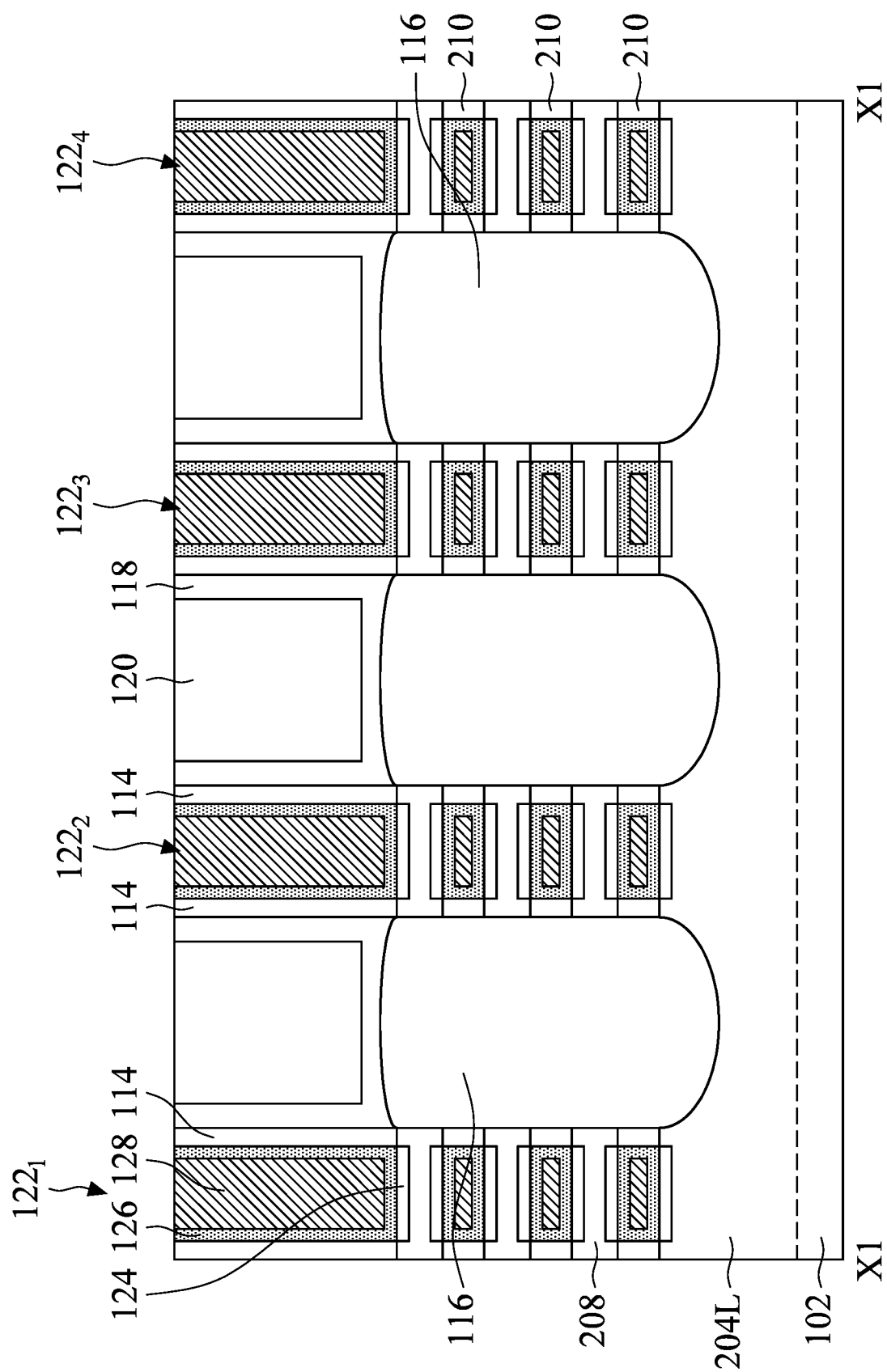
Figures 2, 4B:
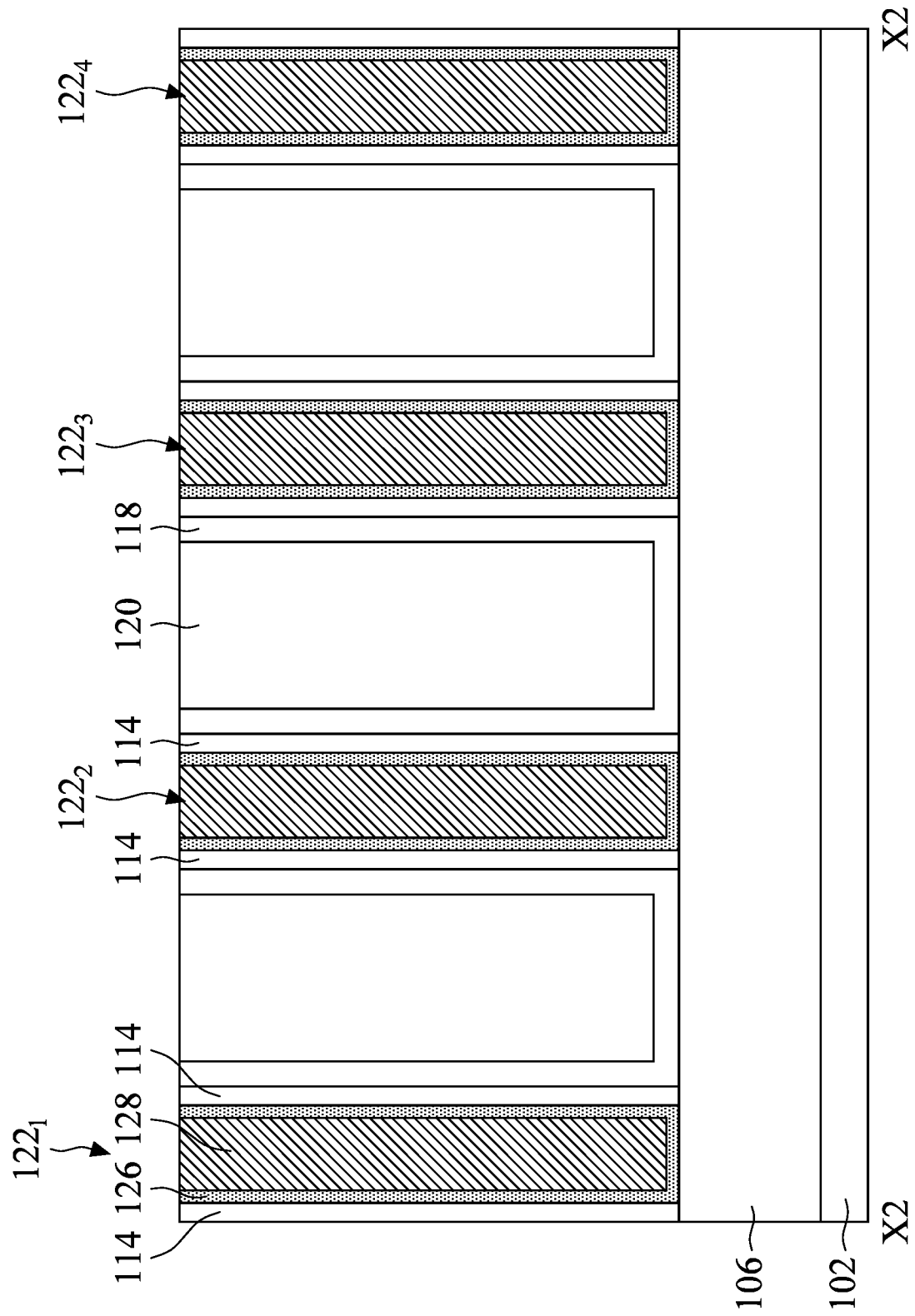
Figures 3, 4B:
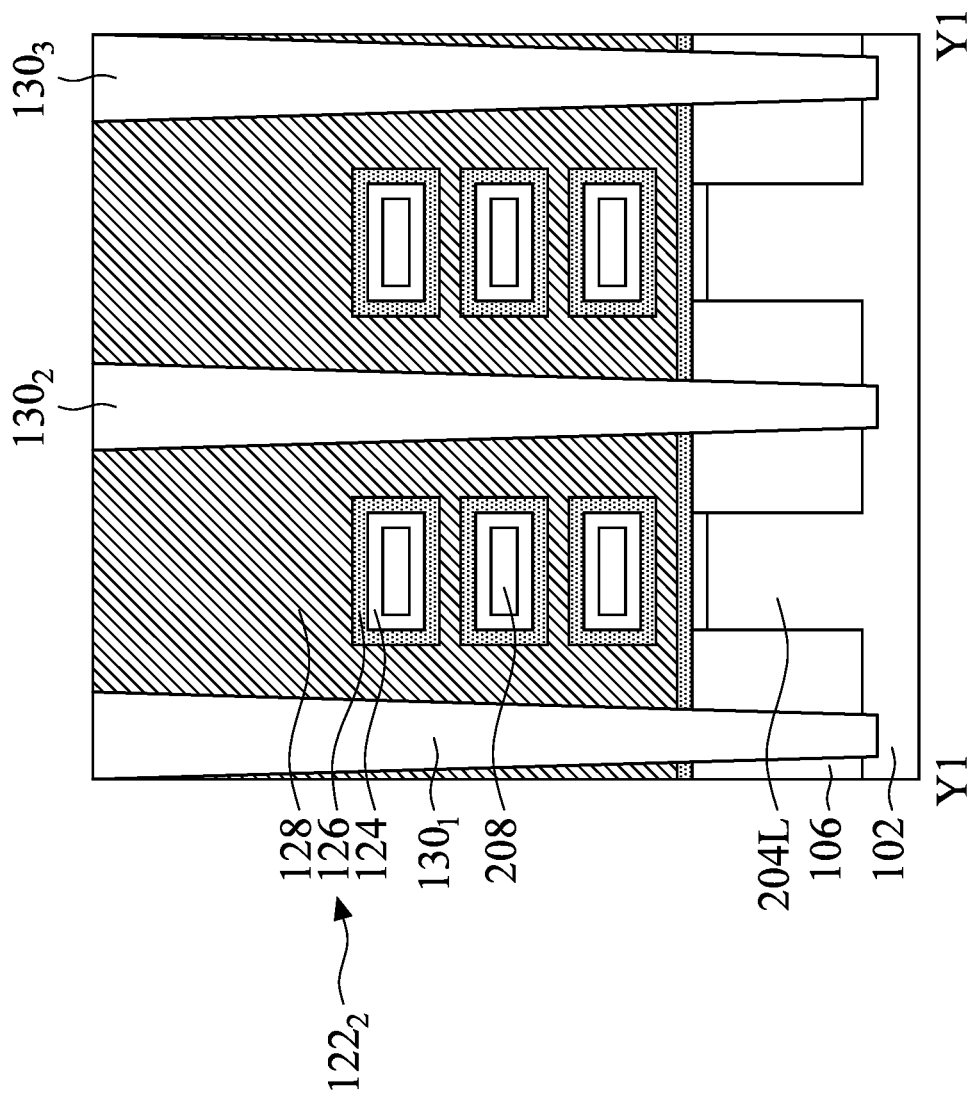

FIGS. 4B through 4B-3 illustrate a semiconductor structure 200 after the formation of final gate stacks 122 and gate cutting structures 130, in accordance with some embodiments. FIGS. 4B-1, 4B-2 and 4B-3 are cross-sectional views of the semiconductor structure 200 taken along line X1-X1, line X2-X2 and line Y1-Y1 of FIG. 4B, respectively.

One or more etching processes are performed to remove the dummy gate structures 108 to form gate trenches and remove the first semiconductor layers 206 of the active regions 204 to form gaps, in accordance with some embodiments. In some embodiments, the gate trenches expose the inner sidewalls of the gate spacer layers 114 facing the channel region, in accordance with some embodiments. In some embodiments, the gaps expose the inner sidewalls of the inner spacer layers 210 facing the channel region. The one or more etching processes may include an anisotropic etching process such as dry plasma etching, an isotropic etching process such as dry chemical etching, remote plasma etching or wet chemical etching, or a combination thereof.

After the one or more etching processes, the four main surfaces of the second semiconductor layers 208 are exposed, in accordance with some embodiments. The exposed second semiconductor layers 208 of each of the active regions 204 form four sets of nanostructures 208, in accordance with some embodiments. Each set includes three nanostructures 208 vertically stacked and spaced apart from one other, in accordance with some embodiments. As the term is used herein, "nanostructures" refers to the semiconductor layers with cylindrical shape, bar shaped and/or sheet shape. The nanostructures 208 function as channel layers of the resulting semiconductor devices (e.g., nanostructure transistors such as GAA transistors), in accordance with some embodiments.

The final gate stacks 122 (including 122$_{1-4}$) are formed in the gate trenches and gaps, thereby wrapping around the nanostructures 108, as shown in FIGS. 4B through 4B-3, in accordance with some embodiments. Each of the final gate stacks 122$_{1-4}$ includes an interfacial layer 124, a gate dielectric layer 126 and a metal gate electrode layer 128, as shown in FIGS. 4B through 4B-3, in accordance with some embodiments.

The interfacial layer 124 wraps around the nanostructures 108, in accordance with some embodiments. Semiconductor material from the nanostructures 208 and the lower fin elements 204L is oxidized to form the interfacial layer 124, in accordance with some embodiments. The gate dielectric layer 126 is formed conformally along the interfacial layer 124 to wrap around the nanostructures 208, in accordance with some embodiments. The gate dielectric layer 126 is further conformally formed along the sidewalls of the inner spacer layers 210 facing the channel region, in accordance with some embodiments. The metal gate electrode layer 128 is formed to fill remainders of the gate trenches and the gaps, in accordance with some embodiments. The formation of the final gate stacks 122 may be the same as or similar to the formation of the final gate stacks 122 described above in FIGS. 2B through 2B-3, in accordance with some embodiments.

Portions of the final gate stacks 122 wrapping around the nanostructures 208 combine with the neighboring source/drain features 116 to form functional transistors (e.g., p-channel GAAFETs or n-channel GAAFETs), in accordance with some embodiments. The final gate stacks 122 engage the channel so that current can flow between the source/drain features 116 during operation.

Gate cutting structures 130 (including 130$_{1-3}$) are formed in and/or through the final gate stacks 122$_{1-4}$, the gate spacer layers 114, the interlayer dielectric layer 120 and the contact etching stop layer 118, as shown in FIGS. 4B and 4B-3, in accordance with some embodiments. The formation of the gate cutting structures 130 may be the same as or similar to the formation of the gate cutting structures 130 described above in FIGS. 2B through 2B-3, in accordance with some embodiments.

Figure 4C:
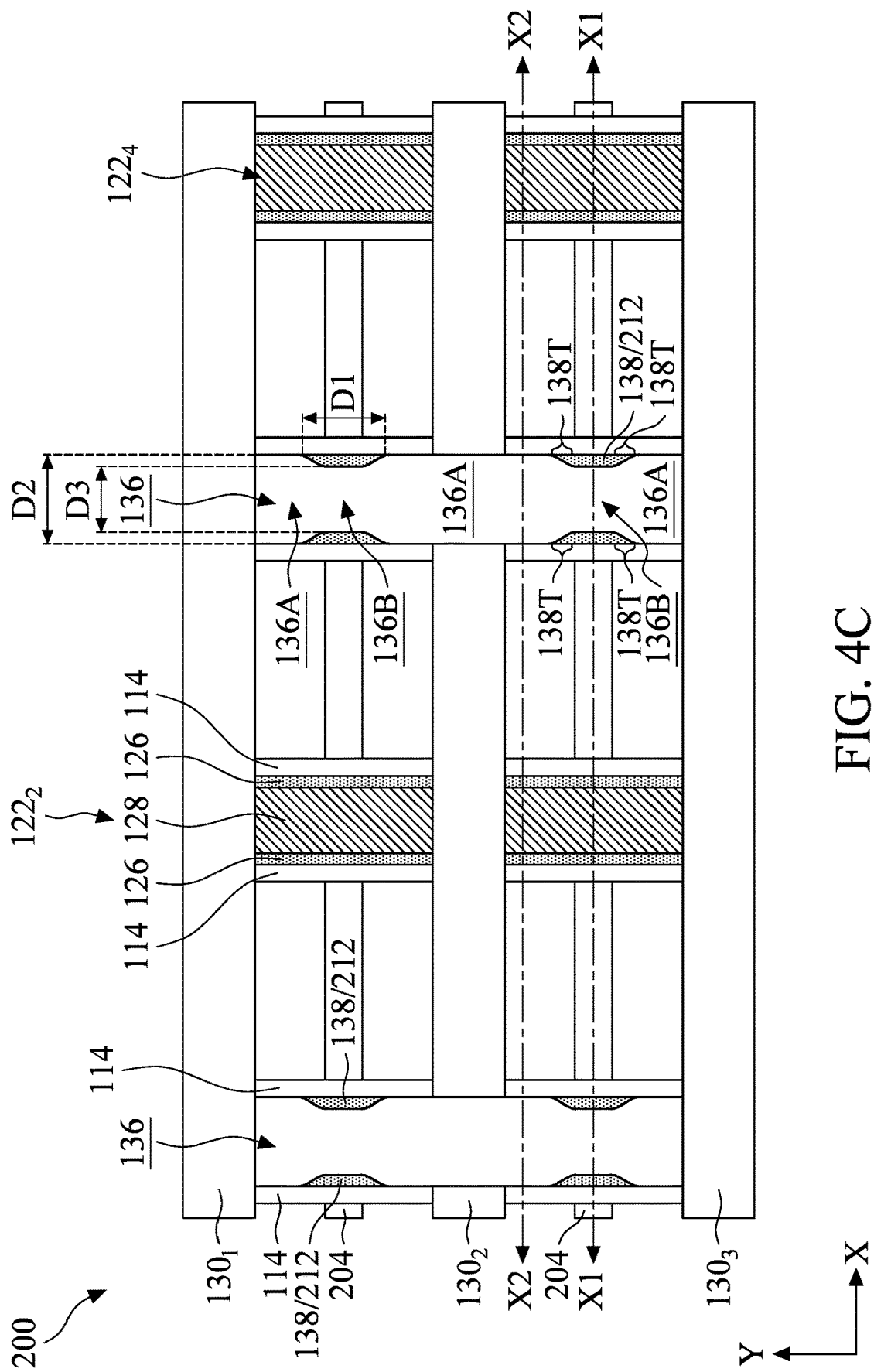
Figures 1, 4C:
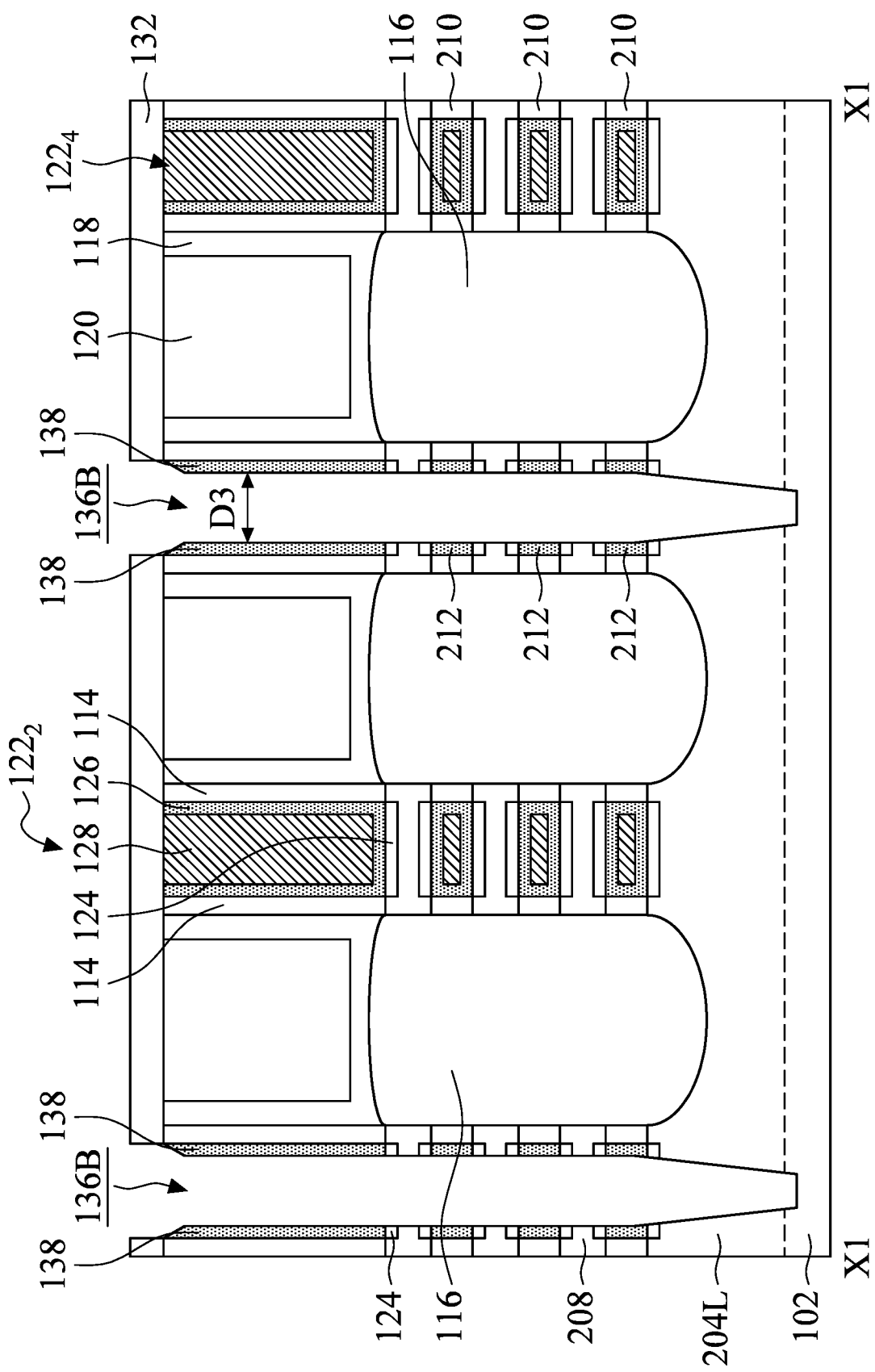
Figures 2, 4C:
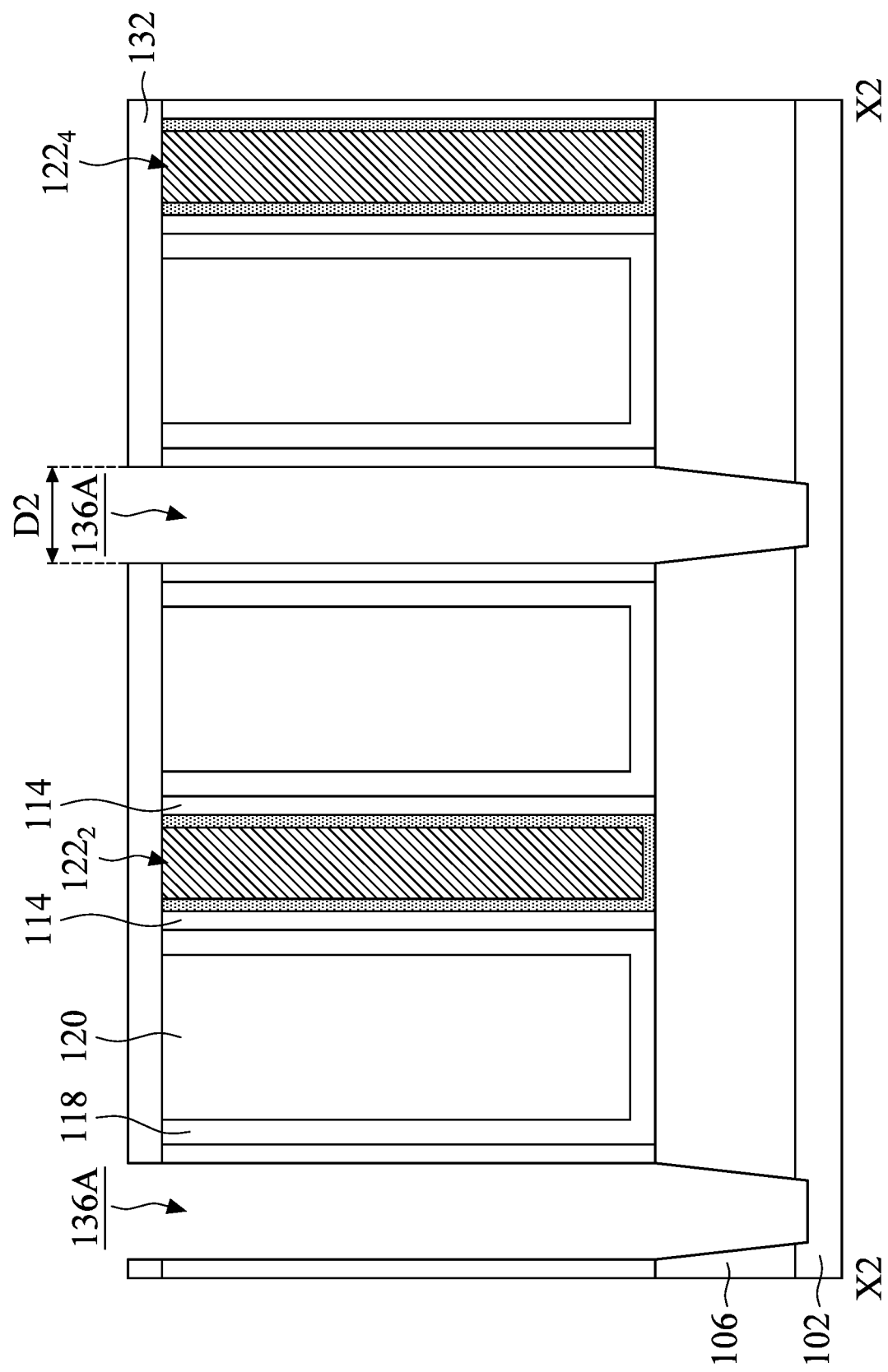

FIGS. 4C through 4C-2 illustrate a semiconductor structure 200 after an etching process, in accordance with some embodiments. FIGS. 4C-1 and 4D-2 are cross-sectional views of the semiconductor structure 200 taken along line X1-X1 and line X2-X2 of FIG. 4C, respectively.

A cutting process is performed on the final gate stack 122$_1$ and 122$_3$, the active regions 204 and the isolation structure 106, thereby forming cutting trenches 136, as shown in FIGS. 4C through 4C-2, in accordance with some embodiments. The cutting trenches 136 include wider portions 136A extending into the isolation structure 106 and narrower portions 136B extending into the active regions 204, as shown in FIGS. 4C through 4C-2, in accordance with some embodiments. The cutting process includes photolithography and etching processes that may be the same as or similar to those described above in FIGS. 2C through 2D-3, in accordance with some embodiments.

When the etching process is completed, the portion of the gate dielectric layer 126 directly above the isolation structure 106 is mostly removed while the portion of the gate dielectric layer 126 directly above the nanostructures 208 is left remained and referred to as protection features 138, as shown in FIGS. 4C and 4C-1, in accordance with some embodiments. In addition, the portion of the gate dielectric layer 126, between the adjacent nanostructures 208 and between the nanostructure 208 and the lower fin element 204L, directly above the lower fin elements 204L, is left remained and referred to as protection features 212, as shown in FIGS. 4C and 4C-1, in accordance with some embodiments. The protection features 138 remain on, and partially cover, the sidewalls of the gate spacer layers 114, in accordance with some embodiments. The protection features 212 remain on, and cover, the sidewalls of the inner spacer layers 210, in accordance with some embodiments.

In the plan view (e.g., FIG. 4C), the protection features 212 may have substantially the same profiles as the protection features 138, in accordance with some embodiments. For example, the protection features 212 also have tailing portions (directly below 138T) that extend over the isolation structure 106 by a distance, in accordance with some embodiments. In the Y direction, the protection features 138 and 212 are greater than nanostructures 208 and the lower fin element 204L, and smaller than the gate spacer layers 114, in accordance with some embodiments.

In some embodiments, the protection features 138 and 212 are configured to protect the source/drain features 116 from being damaged in the etching process for forming the cutting trenches 136, in accordance with some embodiments. The cutting trenches 136 can be formed with great depths (e.g., extending into the substrate 102) without damaging the source/drain features 116. Therefore, the performance of the resulting semiconductor devices may be improved, e.g., lower sheet resistance (Rs). In addition, the critical dimension (CD) and/or overlay window of the photolithography process for forming the cutting trenches 136 may be relaxed, thereby reducing the difficulty of manufacturing the semiconductor devices.

Figure 4D:
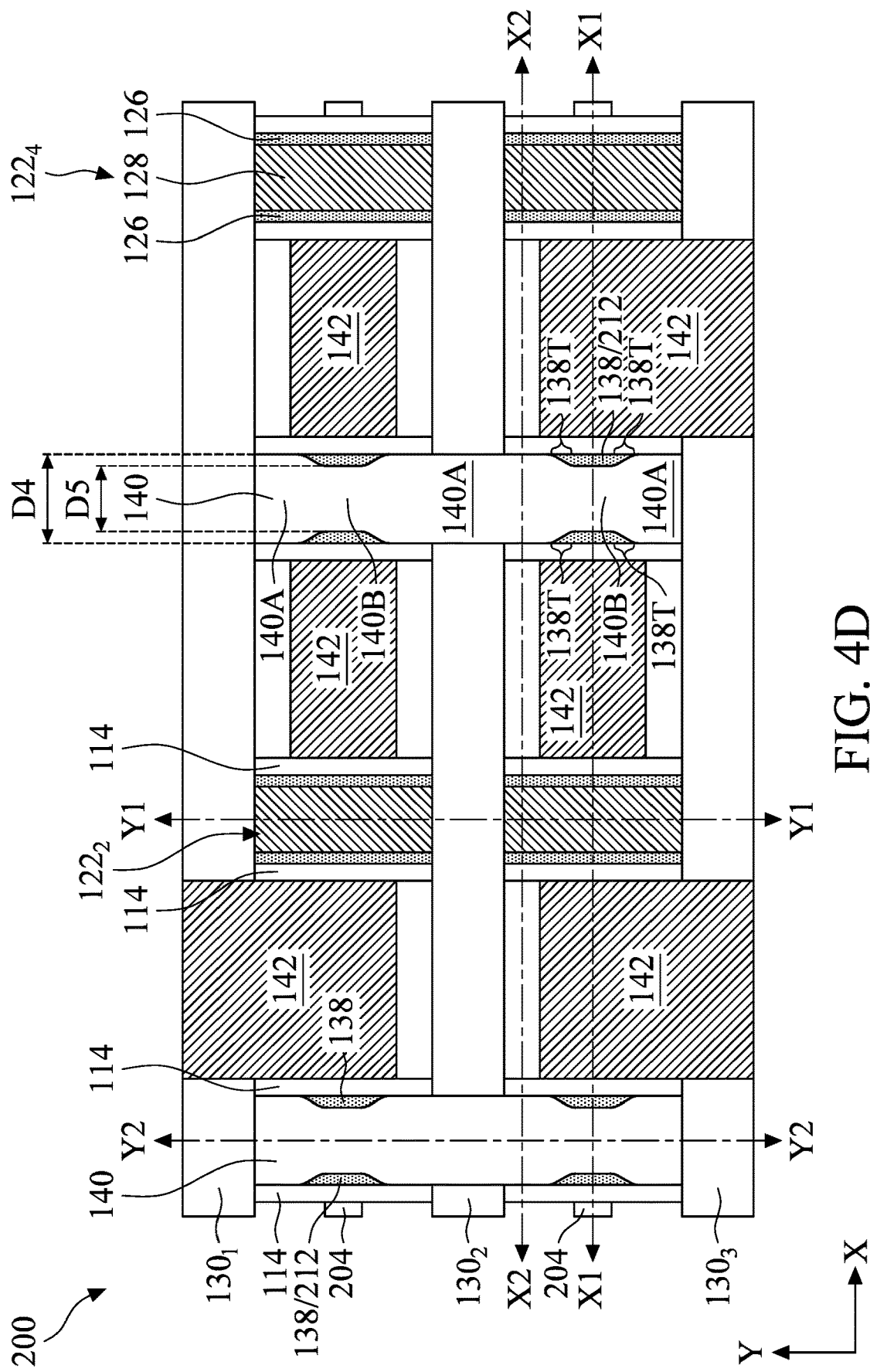
Figures 1, 4D:
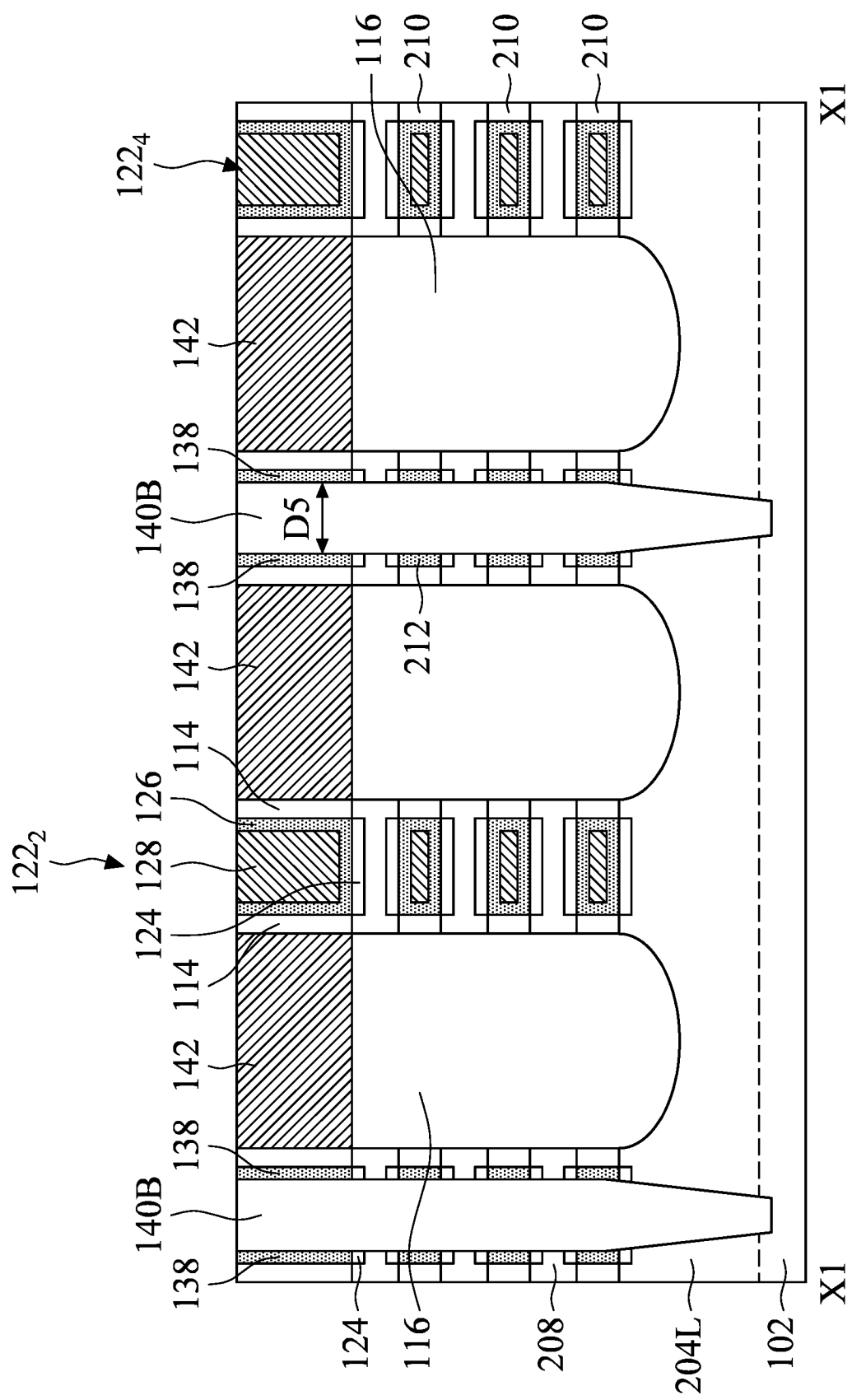
Figures 2, 4D:
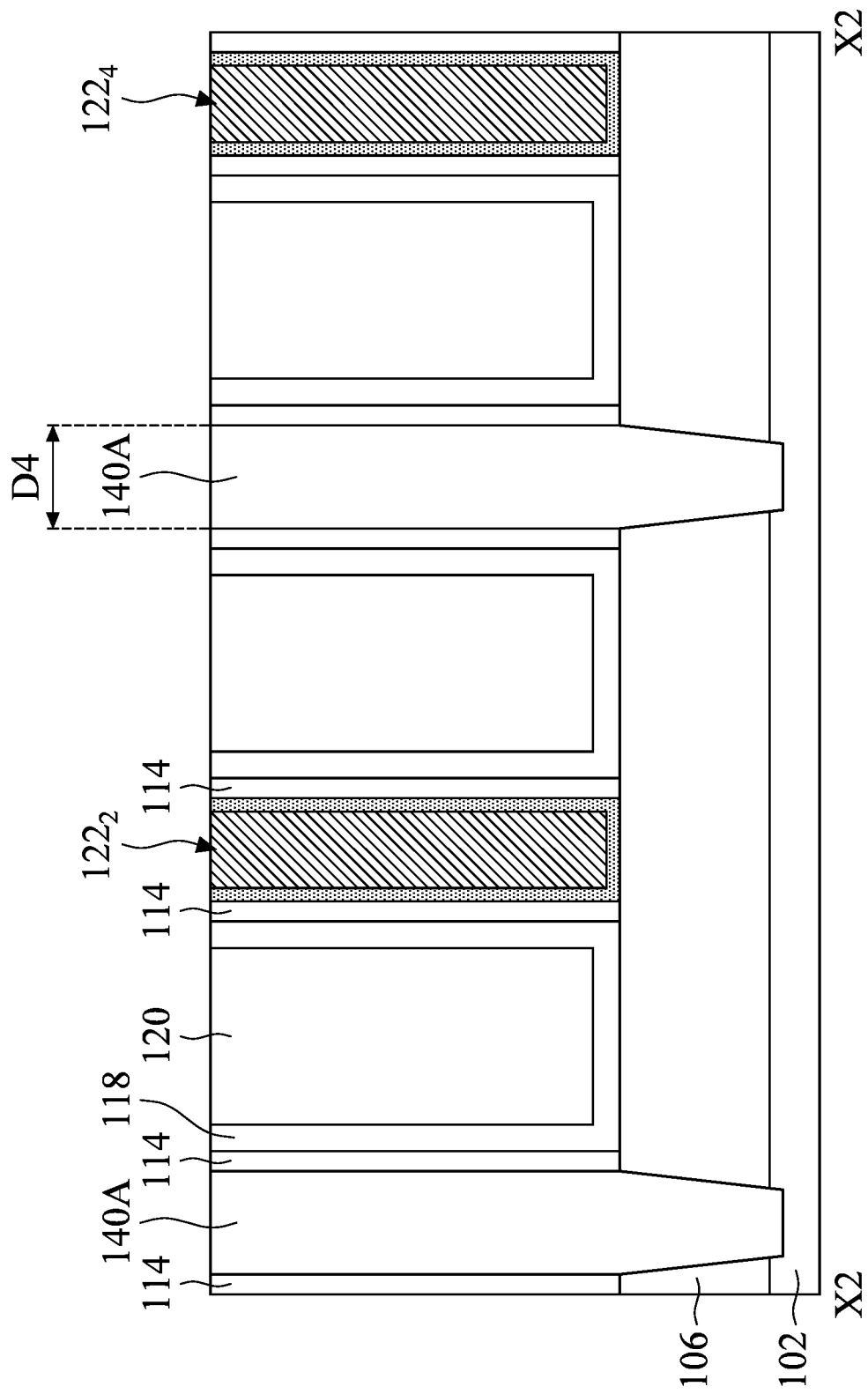
Figures 3, 4D:
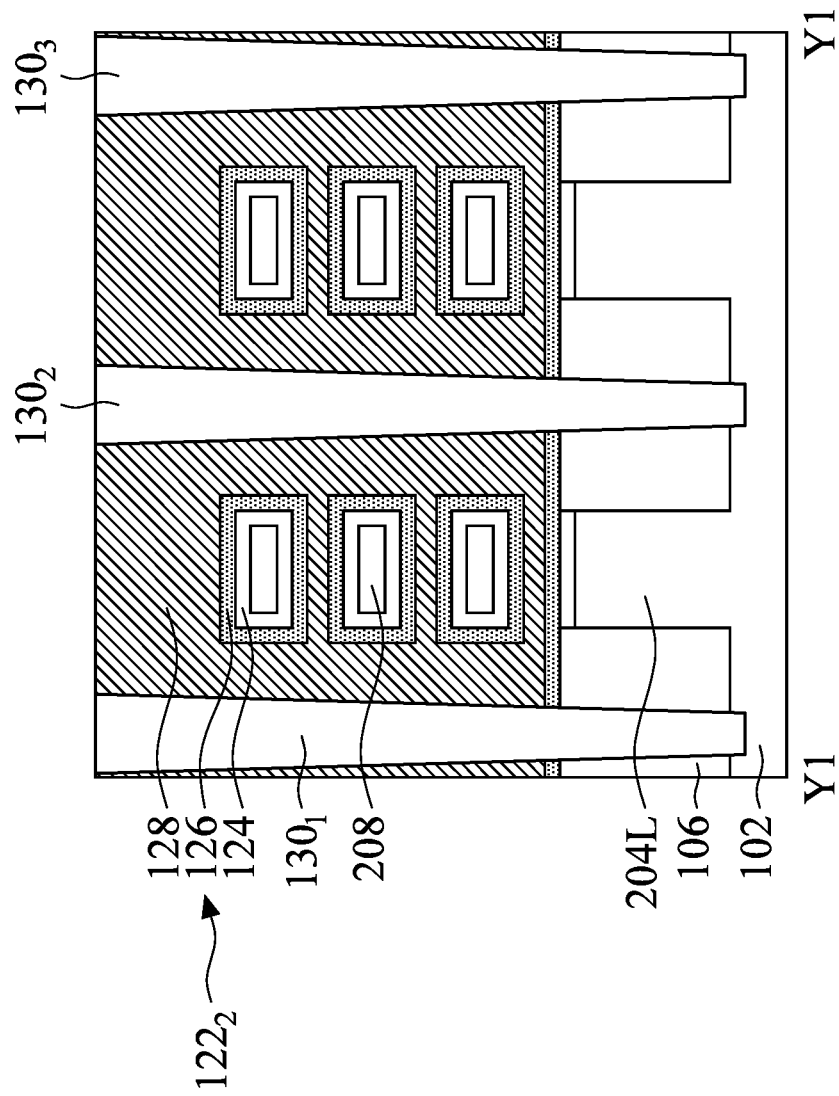
Figure 5:
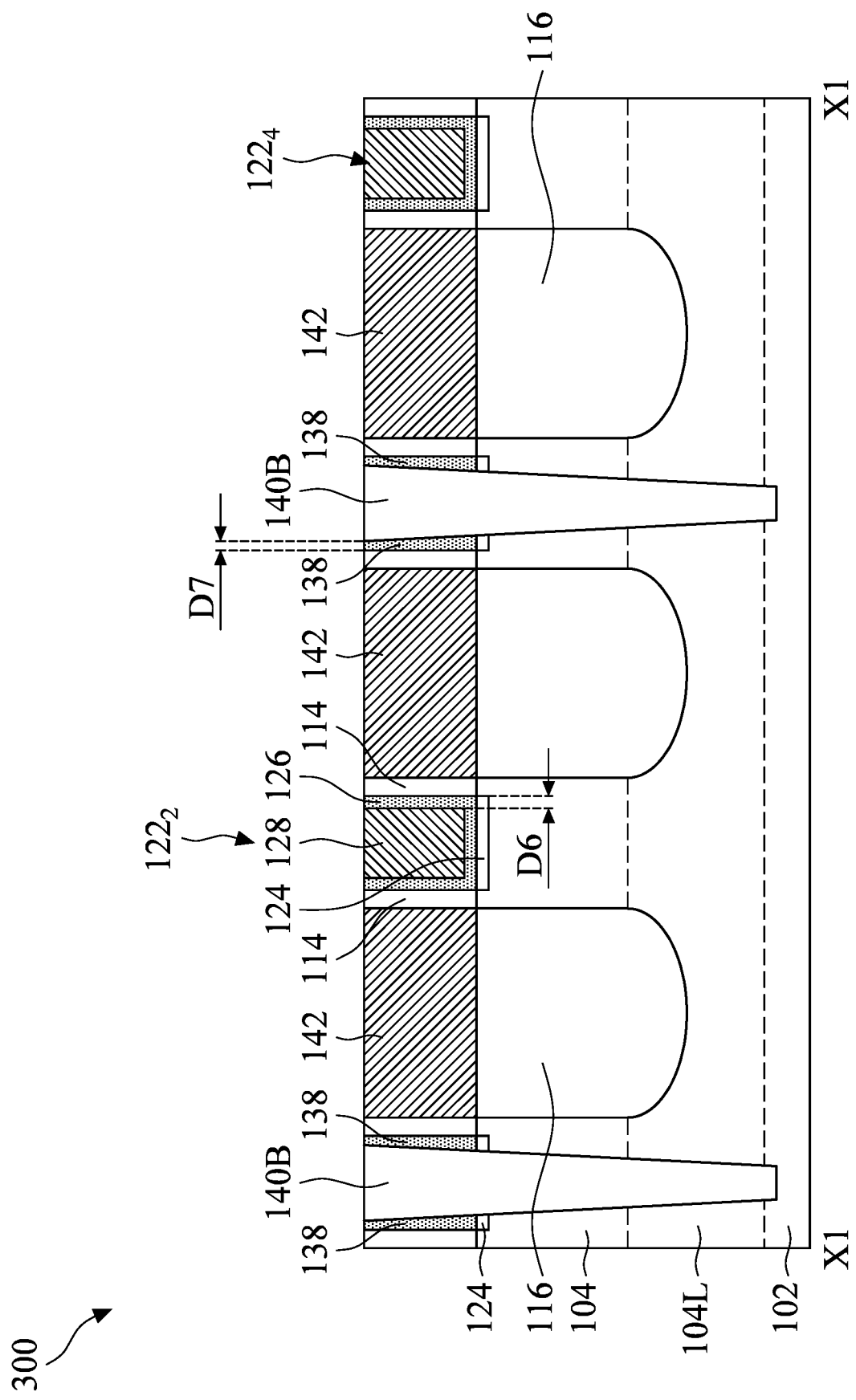

FIGS. 4D through 4D-3 illustrate a semiconductor structure 200 after the formation of fin cutting structures 140 and contact plugs 142, in accordance with some embodiments. FIGS. 4D-1, 4D-2 and 4D-3 are cross-sectional views of the semiconductor structure 200 taken along line X1-X1, line X2-X2 and line Y1-Y1 of FIG. 4D, respectively.

Fin cutting structures 140 are formed in the cutting trenches 136$_{1-4}$, as shown in FIGS. 4D and 4D-1, in accordance with some embodiments. Contact plugs 142 are formed in and/or through the interlayer dielectric layer 120 and the contact etching stop layer 118 and land on the source/drain features 116, as shown in FIGS. 4D and 4D-1, in accordance with some embodiments. The formation of the fin cutting structures 140 and the contact plugs 142 may be the same as or similar to the fin cutting structures 140 and the contact plugs 142 described above in FIGS. 2E through 2F-4, in accordance with some embodiments.

Figures 2, 2F, 3, 4, 5:
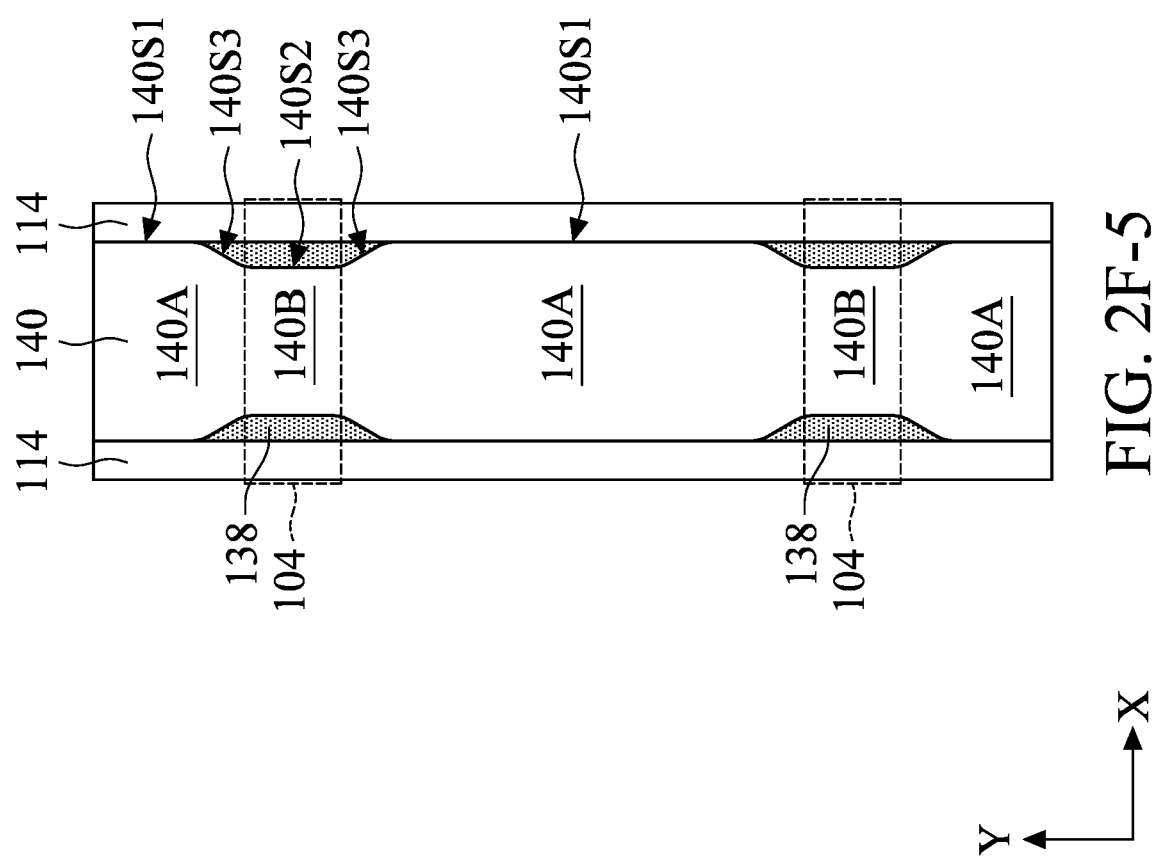
Figure 3:
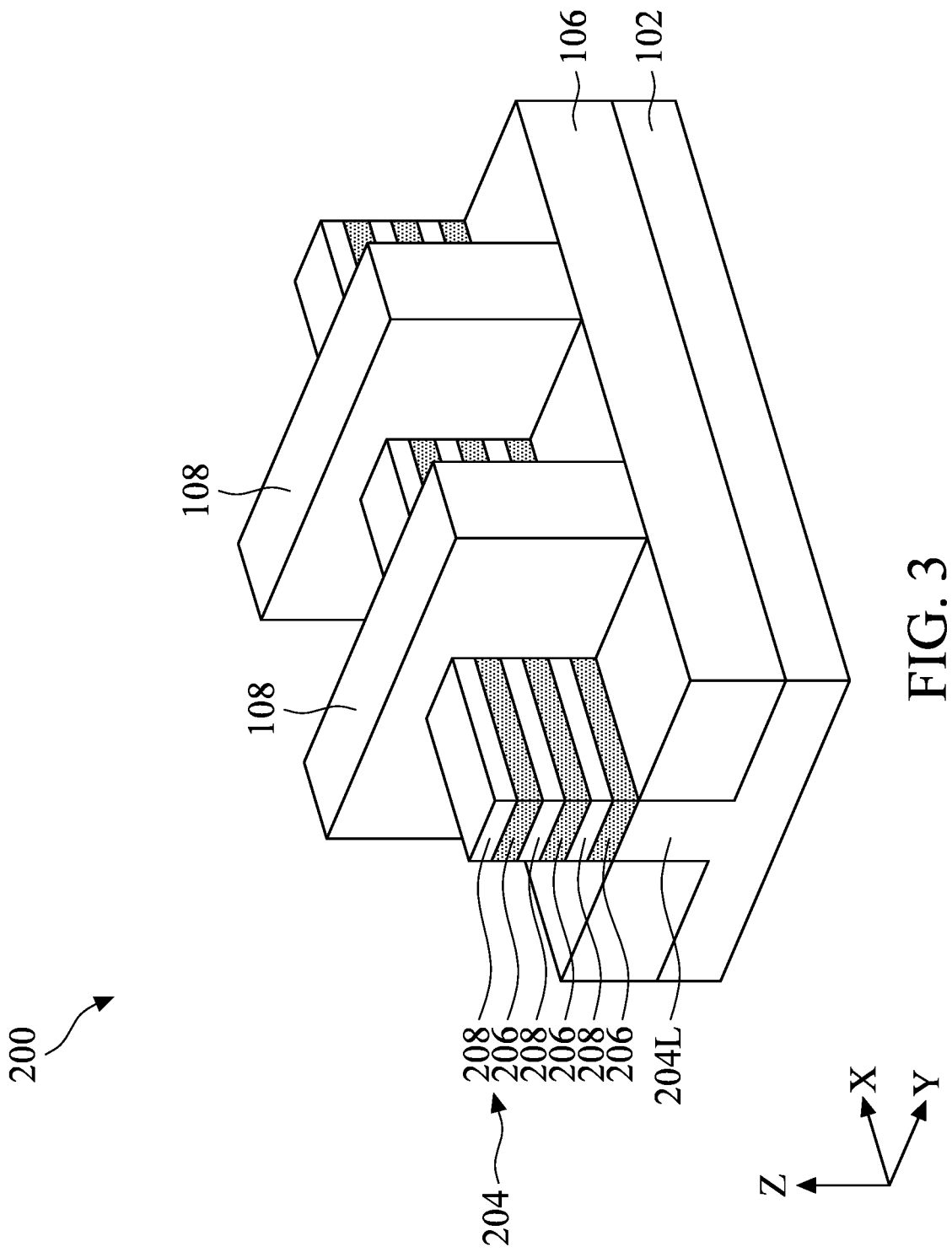

FIG. 5 is a modification of the semiconductor structure 100 of FIG. 2F-1, in accordance with some embodiments of the disclosure. The semiconductor structure 300 of FIG. 5 is similar to the semiconductor structure 100 of FIG. 2F-1 except that the thickness of the protection features 138 varies.

Due to the characteristic of the etching process, the protection features 138 are formed with a thickness that varies with their height, as shown in FIG. 5, in accordance with some embodiments. In some embodiments, the thickness D7 (the dimension in the X direction) of the protection features 138 is tapered (e.g., progressively reduces) upwardly. In some embodiments, the thickness D6 (the dimension in the X direction) of the gate dielectric layer 126 is greater than the thickness D7 of the protection features 138.

Figure 6:
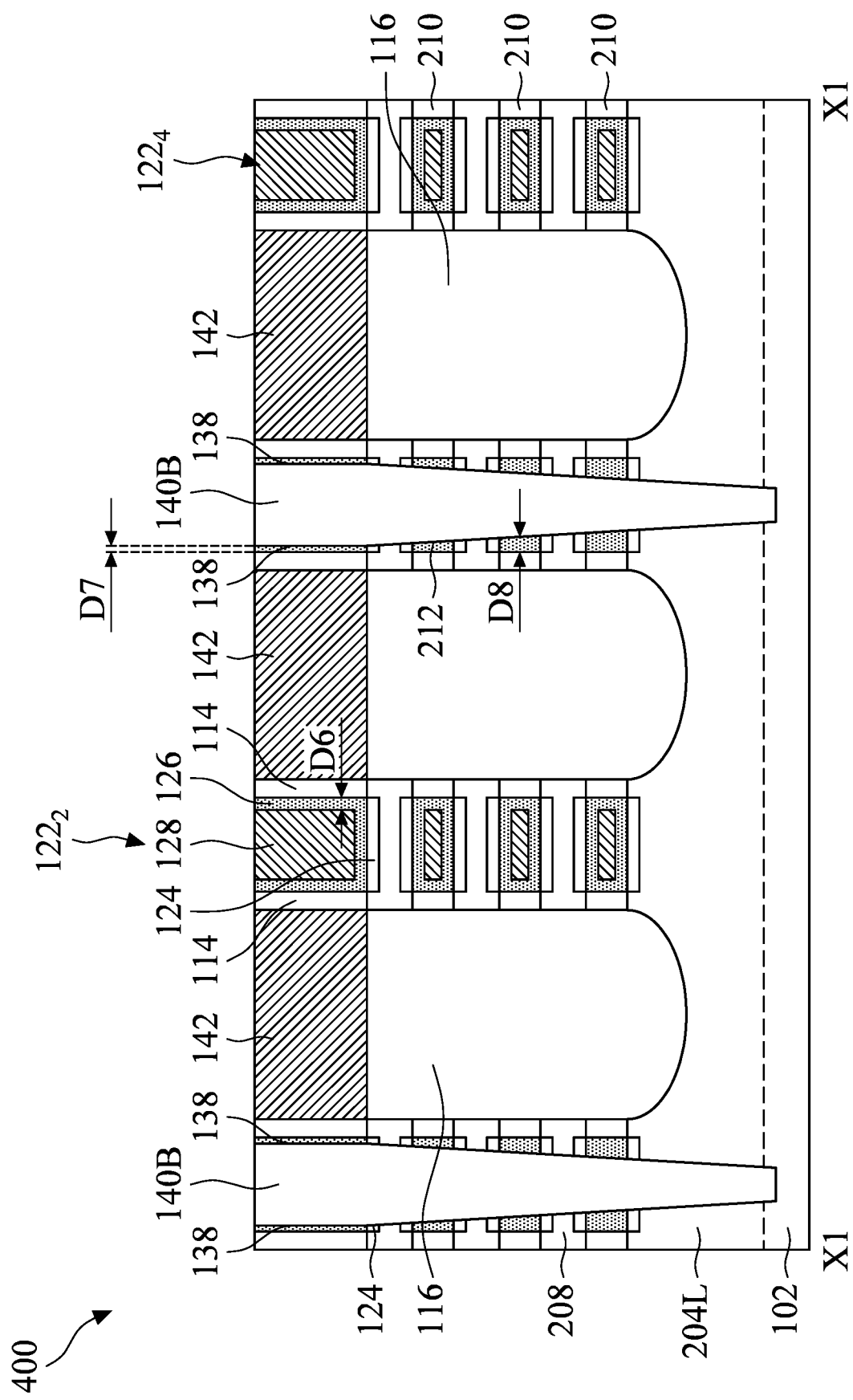
FIG. 6 is a modification of the semiconductor structure of FIG. 4D-1, in accordance with some embodiments of the disclosure.

FIG. 6 is a modification of the semiconductor structure 200 of FIG. 4D-1, in accordance with some embodiments of the disclosure. The semiconductor structure 400 of FIG. 6 is similar to the semiconductor structure 200 of FIG. 4D-1 except that the thickness of the protection features 212 varies.

Due to the characteristic of the etching process, the protection features 212 are formed with respective thicknesses that vary with their level (e.g., the positions in the vertical direction), as shown in FIG. 6, in accordance with some embodiments. In some embodiments, the thicknesses D8 (the dimension in the X direction) of the protection features 212 gradually increase as the level of the protection feature 212 vertically decreases. In some embodiments, the thickness D6 of the gate dielectric layer 126 is greater than the thickness D7 of the protection features 138 and the thickness D8 of the protection features 212.

As described above, the aspect of the present disclosure is directed to a semiconductor structure including fin cutting structures. The semiconductor structure includes an active region 104 (or 204) surrounded by an isolation structure 106, and a fin cutting structure 140 cutting through the active regions 104 (or 204) and the isolation structure 106. The portion 140B of the fin cutting structure 140 extending into the active region 104 (or 204) is narrower than the portion 140A of the fin cutting structure 140 extending into the isolation structure 106, which may reduce the risk of the damaging the source/drain features 116 in the etching process for forming the fin cutting structure 140. Therefore, the performance of the resulting semiconductor devices may be improved, e.g., lower sheet resistance (Rs). In addition, the critical dimension (CD) and/or overlay window of the photolithography process for forming the fin cutting structure may be relaxed, thereby reducing the difficulty of manufacturing the semiconductor devices.

Embodiments of a semiconductor structure and the method for forming the same may be provided. The method for forming a semiconductor structure may include forming an isolation structure surrounding an active region, forming a gate stack across the isolation structure and the active region, and etching the gate stack to form a trench. A portion of a gate dielectric layer of the gate stack over active region is left to form protection features, which may protect the source/drain features from being damaged in the etching process for forming the trench. Therefore, the performance of the resulting semiconductor devices may be improved.

In some embodiments, a method for forming a semiconductor structure is provided. The method for forming the semiconductor structure includes forming an active region extending in a first horizontal direction, forming an isolation structure surrounding the active region, forming a gate dielectric layer over the active region and the isolation structure, forming a gate electrode layer nested within the gate dielectric layer, removing the gate electrode layer and a first portion of the gate dielectric layer over the isolation structure to form a trench. A second portion of the gate dielectric layer over the active region is left to form first protection features. The method further includes depositing a dielectric layer in the trench.

In some embodiments, a method for forming a semiconductor structure is provided. The method for forming the semiconductor structure includes forming a first active region over a substrate, forming an isolation structure over the substrate to surround a lower portion of the active region, forming a dummy gate structure across the first active region and the isolation structure, forming gate spacer layers alongside the dummy gate structure, replacing the dummy gate structure with a gate stack, etching the gate stack, first active region and the isolation structure to form a trench, and forming a first cutting structure in the trench. A first portion of the first cutting structure extending into the isolation structure is wider than a second portion of the first cutting structure extending into the first active region.

In some embodiments, a semiconductor structure is provided. The semiconductor structure includes an active region extending in a first horizontal direction, an isolation structure surrounding the active region, a cutting structure extending in a second horizontal direction and including a first portion penetrating through the isolation structure and a second portion penetrating through the active region. The first portion of the cutting structure has a first dimension in the first horizontal direction, the second portion of the cutting structure has a second dimension in the first horizontal direction, and the first dimension is greater than the second dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an active region extending in a first horizontal direction;
   forming an isolation structure surrounding the active region;
   forming a gate dielectric layer over the active region and the isolation structure;
   forming a gate electrode layer nested within the gate dielectric layer;
   removing the gate electrode layer and a first portion of the gate dielectric layer over the isolation structure to form a trench, wherein a second portion of the gate dielectric layer over the active region is left to form first protection features; and
   depositing a dielectric layer in the trench.

2. The method for forming the semiconductor structure as claimed in claim 1, wherein the trench extends into the active region and the isolation structure.

3. The method for forming the semiconductor structure as claimed in claim 2, wherein in the first horizontal direction, a first portion of the trench extending into the active region is narrower than a second portion of the trench extending into the isolation structure.

4. The method for forming the semiconductor structure as claimed in claim 1, further comprising:
   forming gate spacer layers across the active region and the isolation structure, wherein sidewalls of the gate spacer layers include first portions exposed from the trench and second portions covered by the first protection features.

5. The method for forming the semiconductor structure as claimed in claim 4, wherein the dielectric layer is in direct contact with the gate spacer layers and the first protection features.

6. The method for forming the semiconductor structure as claimed in claim 5, wherein in a second horizontal direction perpendicular to the first horizontal direction, the first protection features are smaller than the gate spacer layers.

7. The method for forming the semiconductor structure as claimed in claim 1, wherein in a second horizontal direction perpendicular to the first horizontal direction, the first protection features are greater than the active region.

8. The method for forming the semiconductor structure as claimed in claim 1, wherein the active region includes a lower fin element extending in the first horizontal direction and a set of nanostructures stacked above the lower fin element and surrounded by the gate dielectric layer, wherein after removing the gate electrode layer and the first portion of the gate dielectric layer, a third portion of the gate dielectric layer between the nanostructures is left to form second protection features.

9. The method for forming the semiconductor structure as claimed in claim 8, wherein respective dimensions of the second protection features in the first horizontal direction gradually increase as the level of the second protection feature vertically decreases.

10. A method for forming a semiconductor structure, comprising:
forming a first active region over a substrate;
forming an isolation structure over the substrate to surround a lower portion of the active region;
forming a dummy gate structure across the first active region and the isolation structure;
forming gate spacer layers alongside the dummy gate structure;
replacing the dummy gate structure with a gate stack;
etching the gate stack, first active region and the isolation structure to form a trench; and
forming a first cutting structure in the trench, wherein a first portion of the first cutting structure extending into the isolation structure is wider than a second portion of the first cutting structure extending into the first active region.

11. The method for forming the semiconductor structure as claimed in claim 10, wherein:
the gate stack includes a gate dielectric layer extending over a top surface of the first active region and a top surface of the isolation structure, and
during the etching of the gate stack, a first portion of the gate dielectric layer over the top surface of the first active region is etched at a first etching rate and a second portion of the gate dielectric layer over the top surface of the isolation structure is etched at a second etching rate that is higher than the first etching rate.

12. The method for forming the semiconductor structure as claimed in claim 11, wherein after etching the gate stack, the first portion of the gate dielectric layer over the top surface of the first active region remains as protection features.

13. The method for forming the semiconductor structure as claimed in claim 12, wherein the protection features are sandwiched between the gate spacer layers and the second portion of the first cutting structure.

14. The method for forming the semiconductor structure as claimed in claim 10, further comprising:
forming a second active region over the substrate; and
forming a second cutting structure between the first active region and the second active region to cut through the gate stack, wherein the trench penetrates through the second cutting structure and the second active region.

15. A method for forming a semiconductor structure, comprising:
forming a fin structure over a substrate;
forming a dummy gate structure over the fin structure, wherein the active region extends lengthwise along a first direction, and the dummy gate structure extends lengthwise along a second direction that is different than the first direction;
forming a gate spacer layer on a sidewall of the dummy gate structure;
replacing the dummy gate structure with a gate stack, wherein the gate stack includes a gate dielectric layer and a gate electrode layer over the gate dielectric layer;
etching the gate electrode layer, a first portion of the gate dielectric layer between the fin structure and the gate electrode layer, and the fin structure to form a trench, wherein a second portion of the gate dielectric layer remains on a sidewall of the gate spacer layer; and
depositing a dielectric material in the trench.

16. The method for forming the semiconductor structure as claimed in claim 15, further comprising:
forming an isolation structure to surround a lower portion of the fin structure; and
etching the isolation structure while etching the gate electrode layer, the first portion of the gate dielectric layer between the fin structure and the gate electrode layer, and the fin structure.

17. The method for forming the semiconductor structure as claimed in claim 16, wherein the isolation structure is etched until the substrate is exposed from the trench.

18. The method for forming the semiconductor structure as claimed in claim 16, wherein in a top view, a first portion of the trench extending into the isolation structure is wider than a second portion of the trench extending into the fin structure.

19. The method for forming the semiconductor structure as claimed in claim 15, further comprising, before etching the gate electrode layer, the first portion of the gate dielectric layer between the fin structure and the gate electrode layer, and the fin structure:
forming a gate cutting structure through the gate stack, wherein the gate cutting structure is spaced apart from the fin structure and extends lengthwise along the first direction.

20. The method for forming the semiconductor structure as claimed in claim 19, further comprising:
etching the gate cutting structure while etching the gate electrode layer, the first portion of the gate dielectric layer between the fin structure and the gate electrode layer, and the fin structure.

* * * * *